United States Patent
Lee et al.

(10) Patent No.: US 9,111,619 B2
(45) Date of Patent: Aug. 18, 2015

(54) SEMICONDUCTOR MEMORY DEVICES AND METHODS OF MANUFACTURING THE SAME

(71) Applicant: Samsung Electronics Co., Ltd., Suwon-si (KR)

(72) Inventors: Chang-Hyun Lee, Hwaseong-Si (KR); Jung-Dal Choi, Hwaseong-Si (KR); Do-Hyun Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 261 days.

(21) Appl. No.: 13/652,849

(22) Filed: Oct. 16, 2012

(65) Prior Publication Data

US 2013/0094287 A1 Apr. 18, 2013

(30) Foreign Application Priority Data

Oct. 17, 2011 (KR) .................. 10-2011-0105834
Nov. 1, 2011 (KR) .................. 10-2011-0112652

(51) Int. Cl.
| | | |
|---|---|---|
| G11C 11/34 | (2006.01) | |
| G11C 16/06 | (2006.01) | |
| H01L 29/788 | (2006.01) | |
| H01L 29/792 | (2006.01) | |
| H01L 27/115 | (2006.01) | |
| G11C 16/34 | (2006.01) | |

(52) U.S. Cl.
CPC ............ *G11C 16/06* (2013.01); *G11C 16/3418* (2013.01); *H01L 27/1157* (2013.01); *H01L 27/11519* (2013.01); *H01L 27/11524* (2013.01); *H01L 27/11565* (2013.01); *H01L 29/7881* (2013.01); *H01L 29/792* (2013.01)

(58) Field of Classification Search
CPC . G11C 16/3418; G11C 16/0483; G11C 16/10
USPC ............................. 365/185.2, 185.05, 185.24
See application file for complete search history.

(56) References Cited

U.S. PATENT DOCUMENTS 5,590,072 A * 12/1996 Choi .................. 365/185.01
6,650,567 B1 * 11/2003 Cho et al. .............. 365/185.17

(Continued)

FOREIGN PATENT DOCUMENTS

| KR | 1020080089819 | 10/2008 |
|---|---|---|
| KR | 1020090080588 | 7/2009 |

(Continued)

*Primary Examiner* — Son Dinh
(74) *Attorney, Agent, or Firm* — F. Chau & Associates, LLC

(57) ABSTRACT

A semiconductor device includes a bit line, a first cell string and a second cell string. The first cell string includes a first selecting transistor connected to the bit line in series and having a threshold voltage greater than a first reference voltage, a second selecting transistor having a threshold voltage smaller than a second reference voltage, cell transistors and a ground selecting transistor. The second cell string includes a third selecting transistor connected to the bit line in series and having a threshold voltage smaller than the first reference voltage, a fourth selecting transistor having a threshold voltage greater than the second reference voltage, cell transistors and a ground selecting transistor. A channel region of the first selecting transistor has an enhancement mode and a first conductive type. A channel region of the third selecting transistor has a depletion mode and a second conductive type.

18 Claims, 41 Drawing Sheets

(56) References Cited

U.S. PATENT DOCUMENTS

| | | | |
|---|---|---|---|
| 6,678,191 B2 * | 1/2004 | Lee et al. | 365/185.33 |
| 7,227,781 B2 * | 6/2007 | Iizuka | 365/185.17 |
| 7,425,742 B2 * | 9/2008 | Nazarian | 257/316 |
| 7,457,156 B2 * | 11/2008 | Nazarian | 365/185.03 |
| 7,898,854 B2 | 3/2011 | Kutsukake | |
| 2008/0239781 A1 | 10/2008 | Kwak | |
| 2009/0135656 A1 | 5/2009 | Park | |
| 2009/0287879 A1 | 11/2009 | Oh et al. | |
| 2010/0046290 A1 | 2/2010 | Park et al. | |
| 2010/0046294 A1 | 2/2010 | Jeong et al. | |
| 2010/0097862 A1 | 4/2010 | Kang et al. | |

FOREIGN PATENT DOCUMENTS

| | | |
|---|---|---|
| KR | 1020100024256 | 3/2010 |
| KR | 1020100043484 | 4/2010 |

* cited by examiner

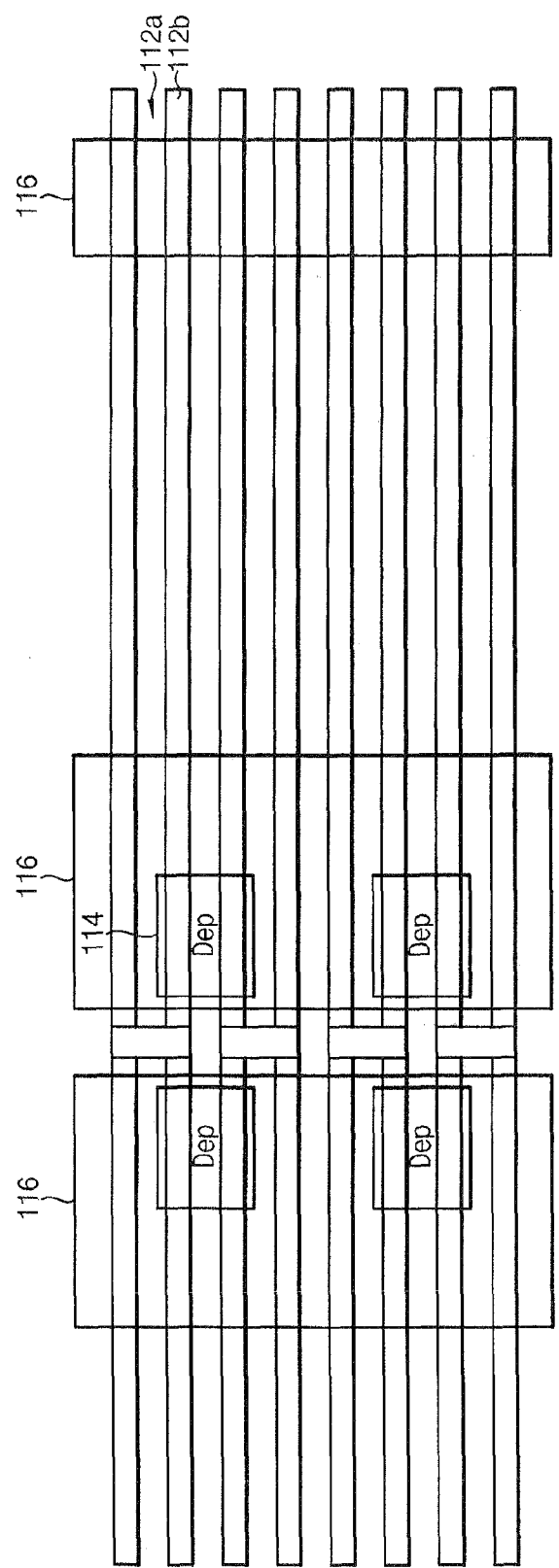

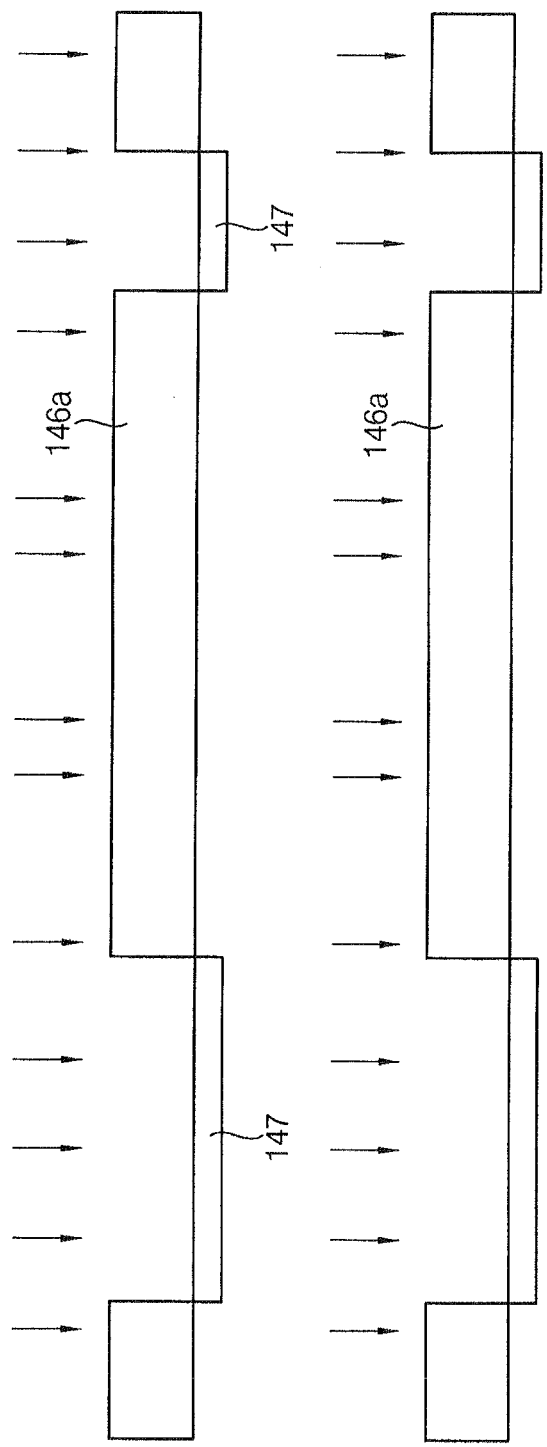

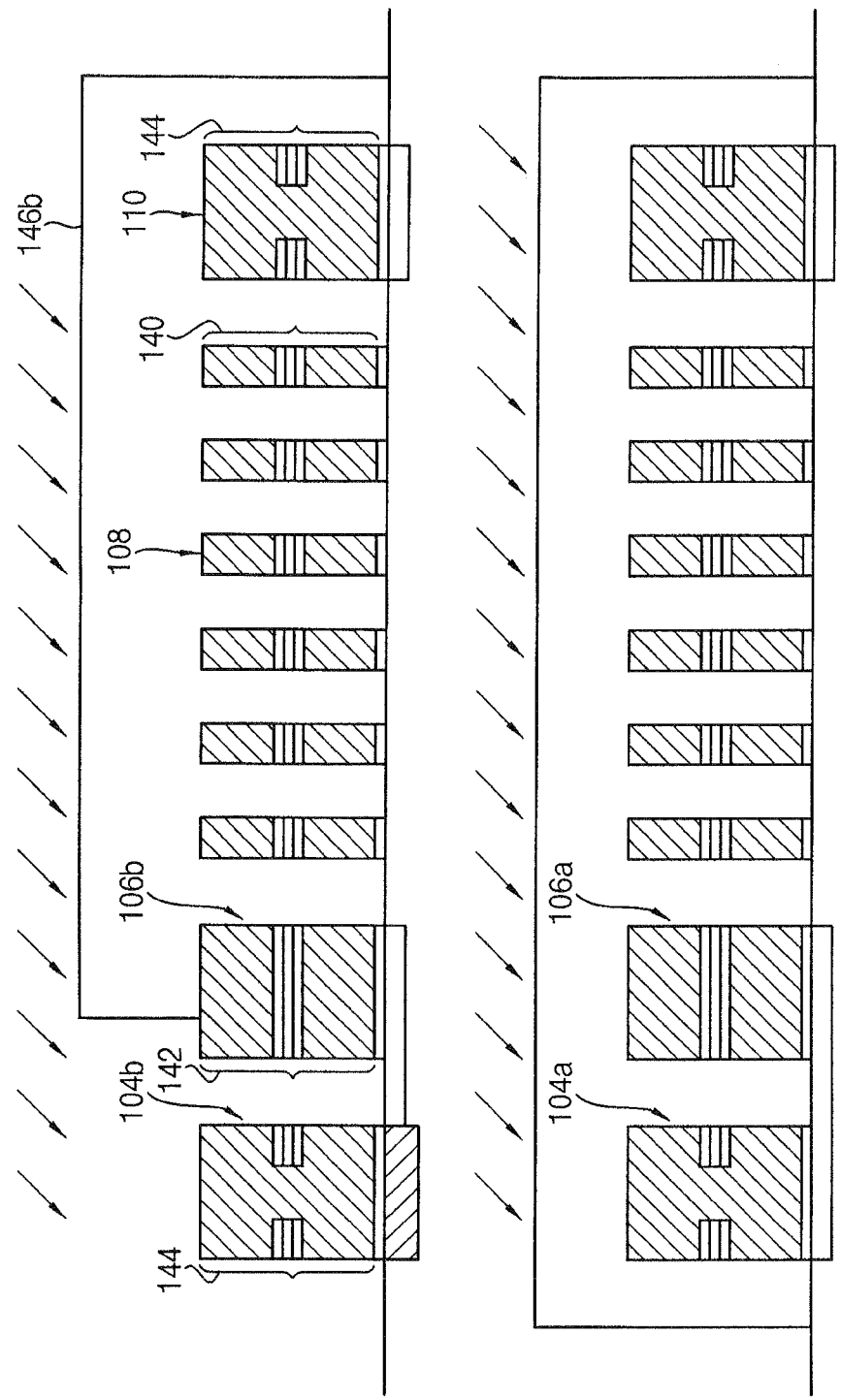

SEMICONDUCTOR MEMORY DEVICES AND METHODS OF MANUFACTURING THE SAME

CROSS-REFERENCE TO RELATED APPLICATIONS

This application claims priority under 35 U.S.C. §119 to Korean Patent Application Nos. 10-2011-0105834, filed on Oct. 17, 2011 and 10-2011-0112652, filed on Nov. 1, 2011 in the Korean Intellectual Property Office, the disclosures of which are incorporated by reference herein in their entireties.

BACKGROUND

1. Technical Field

The inventive concept relates to semiconductor memory devices and methods of manufacturing the same. More particularly, the inventive concept relates to highly integrated NAND flash memory devices and methods of manufacturing the same.

2. Discussion of the Related Art

Among semiconductor devices, NAND flash memory devices may store a large amount of data and may be used as a main memory in various electronic devices. Efforts of research and development have been underway to produce NAND flash memory devices with an increased data storage capacity and an increased integration degree.

SUMMARY

Exemplary embodiments of the inventive concept provide highly integrated semiconductor memory devices having a good operation property.

Exemplary embodiments of the inventive concept provide methods of manufacturing the semiconductor memory devices.

According to an exemplary embodiment of the inventive concept, a semiconductor memory device includes a bit line, a first cell string, a second cell string and a source line. The first cell string includes a first selecting transistor connected to the bit line in series and having a threshold voltage greater than a first reference voltage, a second selecting transistor having a threshold voltage smaller than a second reference voltage, cell transistors and a ground selecting transistor. A channel region of the first selecting transistor has an enhancement mode and a first conductive type.

The second cell string includes a third selecting transistor connected to the bit line in series and having a threshold voltage smaller than the first reference voltage, a fourth selecting transistor having a threshold voltage greater than the second reference voltage, cell transistors and a ground selecting transistor. A channel region of the third selecting transistor has a depletion mode and a second conductive type. The source line is connected to the ground selecting transistors included in the first and second cell strings.

In an exemplary embodiment of the inventive concept, channel regions of the second and fourth selecting transistors may have a same conductive type and may have the enhancement mode and the first conductive type or the depletion mode and the second conductive type.

In an exemplary embodiment of the inventive concept, the second and fourth selecting transistors may have a same integrated structure as the cell transistors of the first and second cell strings.

In an exemplary embodiment of the inventive concept, the second selecting transistor may be in an erased state and the fourth selecting transistor may be in a programmed state.

In an exemplary embodiment of the inventive concept, each of the second and fourth selecting transistors may include a plurality of transistors connected in series.

In an exemplary embodiment of the inventive concept, a dummy selecting transistor may be further included in a region between the first and third selecting transistors and the second and fourth selecting transistors, a region between the bit line and the first and third selecting transistors or a region between the cell transistors and the second and fourth selecting transistors.

The threshold voltage of the second selecting transistor is controlled to be smaller than the second reference voltage by an electric operation and the threshold voltage of the fourth selecting transistor is controlled to be greater than the second reference voltage by the electric operation.

According to an exemplary embodiment of the inventive concept, a semiconductor memory device includes a bit line, a first cell string, a second cell string and a source line. The first cell string includes a first dummy transistor connected to the bit line in series, a first selecting transistor having a threshold voltage greater than a first reference voltage, a second selecting transistor having a threshold voltage smaller than a second reference voltage, cell transistors and a ground selecting transistor. A channel region of the first dummy transistor has a depletion mode and a first conductive type.

The second cell string includes a second dummy transistor connected to the bit line in series, a third selecting transistor having a threshold voltage smaller than the first reference voltage, a fourth selecting transistor having a threshold voltage greater than the second reference voltage, cell transistors and a ground selecting transistor. A channel region of the second dummy transistor has an enhancement mode and a second conductive type. The source line is connected to the ground selecting transistors included in the first and second cell strings.

In an exemplary embodiment of the inventive concept, channel regions of the first to fourth selecting transistors may have a same conductive type and may have the enhancement mode and the first conductive type or the depletion mode and the second conductive type.

In an exemplary embodiment of the inventive concept, the first to fourth selecting transistors may have a same integrated structure as the cell transistors of the first and second cell strings.

In an exemplary embodiment of the inventive concept, the first and fourth selecting transistors may be in a programmed state and the second and third selecting transistors may be in an erased state.

In an exemplary embodiment of the inventive concept, each of the first to fourth selecting transistors may include a plurality of transistors connected in series.

In an exemplary embodiment of the inventive concept, a line width of each gate structure of the first to fourth selecting transistors may be the same as a line width of a gate structure of at least one of the cell transistors.

In an exemplary embodiment of the inventive concept, each of the first and second dummy transistors may include a plurality of transistors connected in series.

In an exemplary embodiment of the inventive concept, gate electrodes of each of the transistors in the first cell string are connected to gate electrodes of each of the transistors in the second cell string that correspond to each of the transistors in the first cell string via a gate line.

The threshold voltage of the first selecting transistor is controlled to be greater than the first reference voltage by an electric operation, the threshold voltage of the second selecting transistor is controlled to be smaller than the second reference voltage by the electric operation, the threshold voltage of the third selecting transistor is controlled to be smaller than the first reference voltage by the electric operation and the threshold voltage of the fourth selecting transistor is controlled to be greater than the second reference voltage by the electric operation.

According to an exemplary embodiment of the inventive concept, a method of manufacturing a semiconductor device is provided. A first cell string is formed. The first cell string includes a first selecting transistor including a channel region having an enhancement mode of a first conductive type and having a threshold voltage greater than a first reference voltage, a second selecting transistor having a threshold voltage smaller than a second reference voltage, cell transistors and a ground selecting transistor. Then, a second cell string is formed. The second cell string includes a third selecting transistor including a channel region having a depletion mode of a second conductive type and having a threshold voltage smaller than the first reference voltage, a fourth selecting transistor having a threshold voltage greater than the second reference voltage, cell transistors and a ground selecting transistor. A source line connected to the ground selecting transistors included in the first and second cell strings is formed. A bit line connected to the first and third cell selecting transistors included in the first and second cell strings is formed. Then, the threshold voltage of the second selecting transistor is controlled through an electric operation so that it is smaller than the second reference voltage and the threshold voltage of the fourth selecting transistor is controlled through the electric operation so that it is greater than the second reference voltage.

In an exemplary embodiment of the inventive concept, an erasing process with respect to the second and fourth selecting transistors and a programming process with respect to the fourth selecting transistor may be conducted to control the threshold voltage of the second and fourth selecting transistors.

In an exemplary embodiment of the inventive concept, when the threshold voltage of the fourth selecting transistor reaches to a target threshold voltage while conducting the programming process with respect to the fourth selecting transistor, a programming inhibit voltage may be applied to the bit line so that the threshold voltage of the fourth selecting transistor may not increased any further.

BRIEF DESCRIPTION OF THE DRAWINGS

The above and other features of the inventive concept will become more apparent by describing in detail exemplary embodiments thereof with reference to the accompanying drawings.

FIGS. 6A and 6B are plan views for explaining a method of manufacturing the cell array of the NAND flash memory device illustrated in FIGS. 4 and 5, according to an exemplary embodiment of the inventive concept.

FIGS. 7A to 7C are cross-sectional views for explaining a method of manufacturing the cell array of the NAND flash memory device illustrated in FIGS. 4 and 5, according to an exemplary embodiment of the inventive concept.

DETAILED DESCRIPTION OF THE EMBODIMENTS

Figure 1:
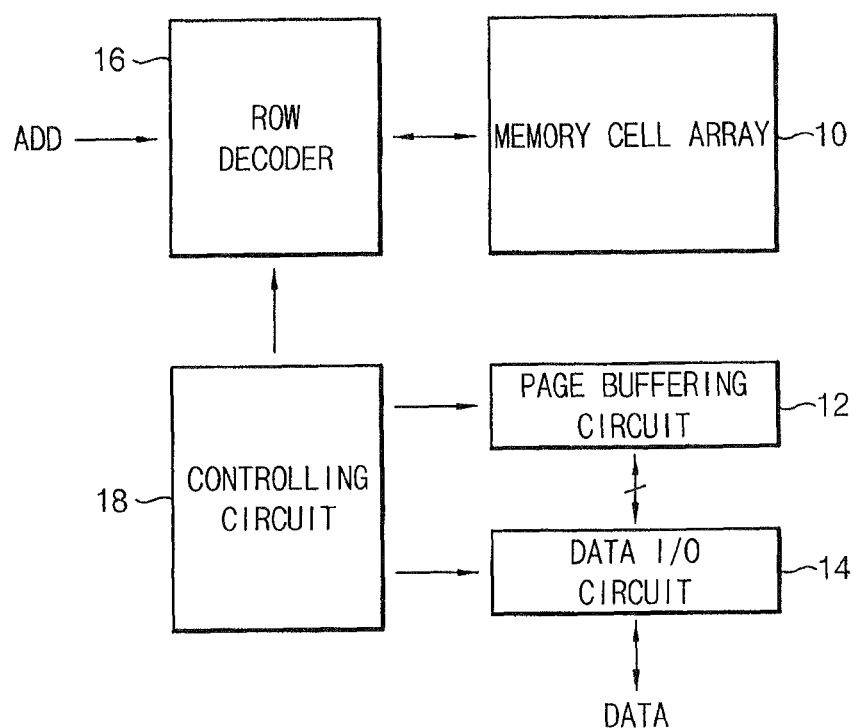
FIG. 1 is a block diagram illustrating a NAND flash memory device in accordance with an exemplary embodiment of the inventive concept.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. Like numerals may refer to like elements throughout the specification and drawings.

As used herein, the singular forms "a," "an," and "the" are intended to include the plural forms as well, unless the context clearly indicates otherwise.

Figure 2A:
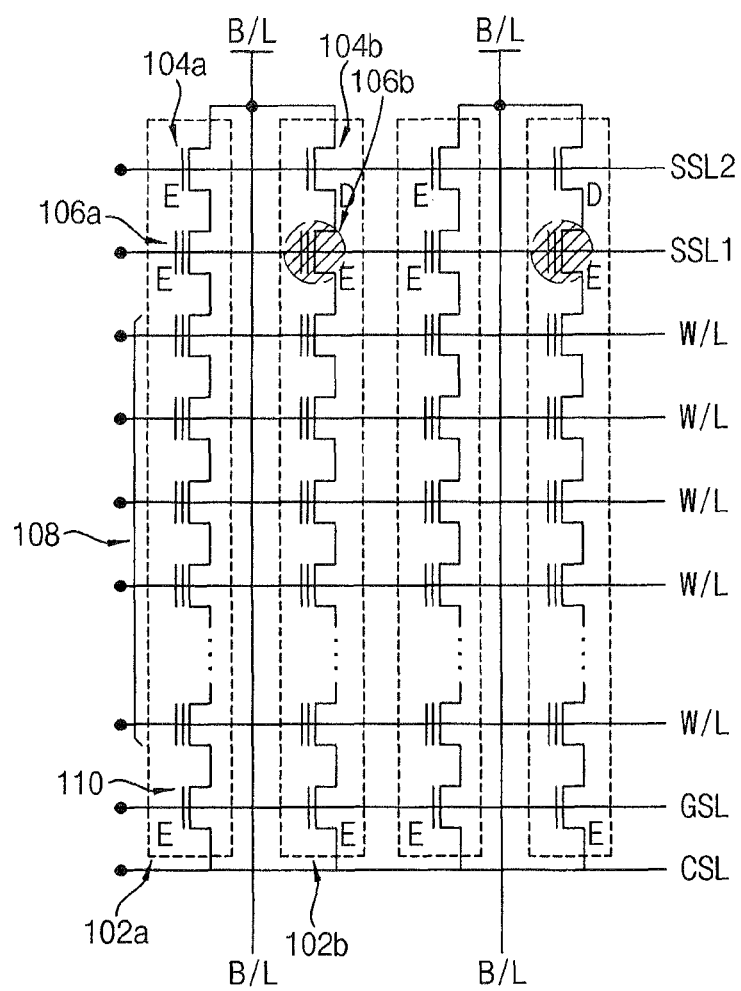
FIG. 2A is a circuit diagram of a cell array of a NAND flash memory device in accordance with an exemplary embodiment of the inventive concept.

FIG. 1 is a block diagram illustrating a NAND flash memory device in accordance with an exemplary embodiment of the inventive concept. FIG. 2A is a circuit diagram of a cell array of a NAND flash memory device in accordance with an exemplary embodiment of the inventive concept.

Referring to FIG. 1, a NAND flash memory device may include a memory cell array 10, a page buffering circuit 12, a data input/output circuit 14, a row decoder 16 and a controlling circuit 18.

Referring to FIG. 2A, the memory cell array 10 may include a first cell string 102a, a second cell string 102b neighboring the first cell string 102a, a common bit line B/L commonly connected to one end portion of each of the first and second cell strings 102a and 102b and a common source line CSL commonly connected to the other end portion of each of the first and second cell strings 102a and 102b. The common bit line B/L may extend in a first direction. The memory cell array 10 may include repeatedly disposed unit cell strings including one common bit line B/L and two cell strings 102a and 102b connected to the one common bit line B/L.

Particularly, the first cell string 102a may include a first selecting transistor 104a, a second selecting transistor 106a, cell transistors 108 and a ground selecting transistor 110 subsequently connected in series.

The second cell string 102b may include a third selecting transistor 104b, a fourth selecting transistor 106b, the cell transistors 108 and the ground selecting transistor 110 subsequently connected in series.

Impurity regions of the ground selecting transistors 110 included in the first and second cell strings 102a and 102b may be connected to the common source line CSL.

The gates of the transistors included in the first and second cell strings 102a and 102b and the gates of the ground selecting transistors 110 may be connected to each other in a second direction perpendicular to the first direction. In other words, the gates of the first and third selecting transistors 104a and 104b may be connected to each other via a second gate line SSL2, the gates of the second and fourth selecting transistors 106a and 106b may be connected to each other via a first gate line SSL1 and the gates of the cell transistors 108 arranged in individual rows, may be connected to each other via a word line W/L.

The second and fourth selecting transistors 106a and 106b adjacent to the cell transistors 108 may be classified as first group selecting transistors and the first and third selecting transistors 104a and 104b adjacent to the common bit line B/L may be classified as second group selecting transistors. The first group selecting transistors may be provided with the first gate line SSL1 extending in the second direction to share the gates of the first group selecting transistors. The second group selecting transistors may be provided with the second gate line SSL2 extending in the second direction to share the gates of the second group selecting transistors.

One common bit line B/L may commonly connect neighboring first and third selecting transistors 104a and 104b.

With respect to the first and second cell strings 102a and 102b commonly connected to the one common bit line B/L, cell selection may be conducted separately. In other words, when one cell string among the two cell strings 102a and 102b commonly connected to the common bit line B/L is selected, the other cell string may be designed not to be selected. To accomplish this, each of the selecting transistors included in the first and second cell strings 102a and 102b may have different constitutions.

In an exemplary embodiment of the inventive concept, the first group selecting transistors 106a and 106b connected to the same common bit line B/L may be provided as transistors having different threshold voltages for by an electric operation including a programming or an erasing operation, for example. In addition, the second group selecting transistors 104a and 104b connected to the same common bit line B/L may be provided as transistors having different threshold voltages in accordance with a channel doping mode. In other words, one of the second group selecting transistors 104a and 104b may be provided as a depletion mode MOS transistor while the other of the second group selecting transistors 104a and 104b may be provided as an enhancement mode MOS transistor.

Hereinafter, the first selecting transistor 104a included in the second group selecting transistors 104a and 104b may be the enhancement mode MOS transistor E and the third selecting transistor 104b included in the second group selecting transistors 104a and 104b may be the depletion mode MOS transistor D. The threshold voltages of the MOS transistors may not change by an electric operation. The MOS transistors may have a fixed threshold voltage value.

The threshold voltage of the enhancement mode MOS transistor E may be greater than a first reference voltage and the threshold voltage of the depletion mode MOS transistor D may be smaller than the first reference voltage. Particularly, the threshold voltage of the enhancement mode MOS transistor E may be greater than 0V and the threshold voltage of the depletion mode MOS transistor D may be smaller than 0V. The depletion mode MOS transistor D may not have an Id-Vd curve characteristic of a general transistor. The depletion mode MOS transistor D may have a characteristic of turning on by a voltage smaller than 0V. In addition, the depletion mode MOS transistor D may have a resistive characteristic.

The enhancement mode MOS transistor E may be a transistor including a channel region having a different conductive type from its source/drain regions. Particularly, the channel region of the enhancement mode MOS transistor E may be doped with p-type impurities. The depletion mode MOS transistor D may be a transistor including a channel region having the same conductive type as its source/drain regions. Particularly, the channel region of the depletion mode MOS transistor D may be doped with n-type impurities.

Since the first and third selecting transistors 104a and 104b may be respectively provided as the enhancement mode MOS transistor E and the depletion mode MOS transistor D, both of the first and third selecting transistors 104a and 104b may be turned on when a voltage greater than the first reference voltage is applied to the second gate line SSL2. However, when a voltage smaller than the first reference voltage is applied to the second gate line SSL2, only the third selecting transistor 104b, which may be an electrically depletion mode MOS transistor D, may be turned on. The first selecting transistor 104a may be turned off.

The channel regions of the second and fourth selecting transistors 106a and 106b of the first group selecting transistors may be doped with the same conductive type. Particularly, both of the second and fourth selecting transistors 106a and 106b may be provided as the enhancement mode cell type transistors. The enhancement mode cell type transistor may include a channel region having a different conductive type from its source/drain regions. Particularly, the enhancement mode cell type transistor may include the channel region doped with p-type impurities. The enhancement mode cell type transistor may have the same integrated structure as the cell transistors including a gate insulating layer, a charge storing layer pattern and a gate electrode. Accordingly, the threshold voltage may be adjustable in accordance with charges stored in the charge storing layer pattern.

To select one of the two cell strings 102a and 102b connected to the common bit line B/L, two selecting transistors having different threshold voltages may be connected to each other in series in the one selected string. In addition, each of the selecting transistors (e.g., 104a and 104b) sharing the common gate line (e.g., SSL2) in the two strings 102a and 102b commonly sharing the bit line B/L may have different threshold voltages.

Particularly, since the first selecting transistor 104a is the enhancement mode MOS transistor E, the second selecting transistor 106a connected to the first selecting transistor 104a in series may be provided as an electrically depletion mode transistor. Accordingly, the second selecting transistor 106a may keep an erased state and may have a threshold voltage smaller than a second reference voltage. Particularly, the second selecting transistor 106a may have a threshold voltage smaller than 0V. Accordingly, the second selecting transistor 106a may function as the depletion mode transistor having a threshold voltage smaller than 0V even though the second selecting transistor 106a may physically be the enhancement mode transistor.

In contrast, since the third selecting transistor 104b is the depletion mode MOS transistor D, the fourth selecting transistor 106b connected to the third selecting transistor 104b in series may be provided as an electrically enhancement mode transistor. Accordingly, the fourth selecting transistor 106b may keep a programmed state and may have a threshold voltage greater than the second reference voltage. The second reference voltage may be 0V or more. Accordingly, the fourth selecting transistor 106b may operate as the electrically enhancement mode transistor.

When a voltage greater than the second reference voltage is applied to the first gate line SSL1, both of the second and fourth selecting transistors 106a and 106b may be turned on. However, when a voltage smaller than the second reference voltage is applied to the first gate line SSL1, only the fourth selecting transistor 106b, which may be the electrically depletion mode transistor, may be turned on.

The ground selecting transistors 110 may include enhancement mode MOS transistors.

The first to fourth selecting transistors 104a, 106a, 104b, 106b included in the first and second cell strings 102a and 102b connected to the common bit line B/L may include the above described constituting elements. In this case, one cell string among the first and second cell strings 102a and 102b may be in a turned on state.

In the first and second cell strings 102a and 102b including the common bit line B/L, the channel regions of three of the first to fourth selecting transistors 104a, 106a, 104b and 106b may have the same conductive type.

Accordingly, an impurity doping process for forming the first to fourth selecting transistors 104a, 106a, 104b and 106b may be simplified. In addition, a mis-alignment that occurs while performing the impurity (e.g., ion) doping process may be restrained and a mixing of different conductive type ions may be prevented. Accordingly, an operation defect of a NAND flash memory device due to defects in the ion doping process may be restrained. Further, since the first group selecting transistors may control the threshold voltage of the selecting transistors by an electric method, the control of the threshold voltage of the selecting transistors to have a desired target threshold voltage may be easily conducted.

Figure 2B:
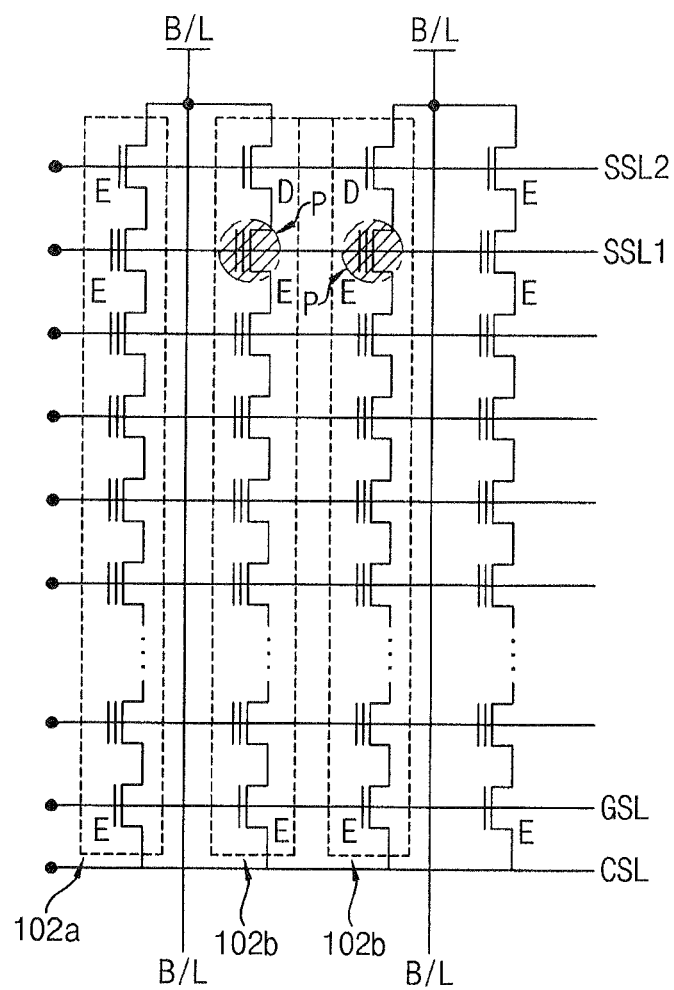
FIG. 2B is a circuit diagram of a cell array of a NAND flash memory device in accordance with an exemplary embodiment of the inventive concept.

FIG. 2B is a circuit diagram of a cell array of a NAND flash memory device according to an exemplary embodiment of the inventive concept.

Referring to FIG. 2B, the memory cell array may include a first cell string 102a, a second cell string 102b, and a common bit line B/L connecting a pair of the neighboring first and second cell strings 102a and 102b together and extending in a first direction. At an end portion of the common bit line B/L, the first and second cell strings 102a and 102b may be connected to a common source line CSL.

Two of the first cell strings 102a and two of the second cell strings 102b may be alternately disposed as illustrated in FIG. 2B. Accordingly, the first group selecting transistors including an erased, a programmed P, a programmed P, an erased, an erased, and a programmed selecting transistor may be repeatedly disposed along an extending direction of the first gate line SSL1. The second group selecting transistors including an enhancement mode, a depletion mode, a depletion mode, an enhancement mode, an enhancement mode, and a depletion mode MOS transistor may be repeatedly disposed along an extending direction of the second gate line SSL2.

When each of the cell strings 102a and 102b is disposed as described above, two neighboring depletion mode MOS transistors D in the second group selecting transistors may be arranged. Accordingly, the impurity doping region may be increased while conducting an ion doping process for forming the depletion mode MOS transistors D and the ion doping process may be easily conducted.

The memory cell array may include different arrangements of the cell strings. The operation of each of the cell strings may be the same as that described with reference to FIG. 2A.

Hereinafter, a method of controlling threshold voltages of the second and fourth selecting transistors 106a and 106b in the cell array illustrated in FIG. 2A will be explained.

Figure 3A:
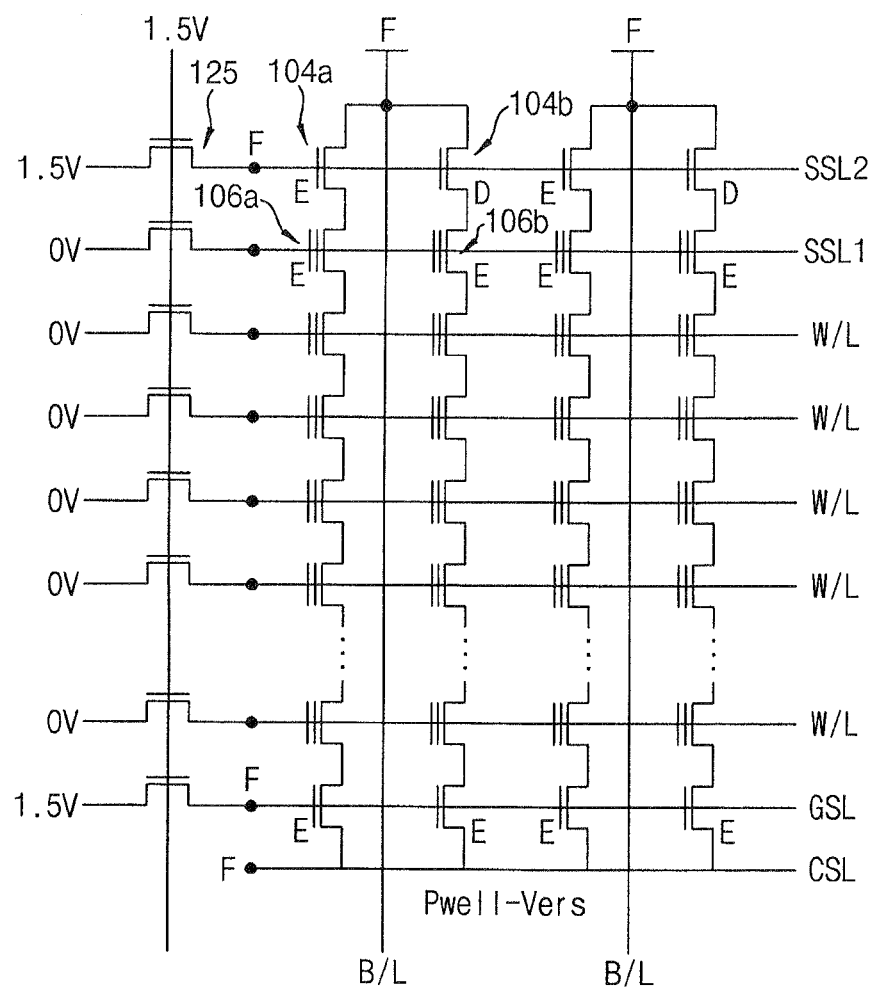
FIGS. 3A to 3C are circuit diagrams for explaining a method of controlling a threshold voltage of selecting transistors, according to an exemplary embodiment of the inventive concept.
Figure 3B:
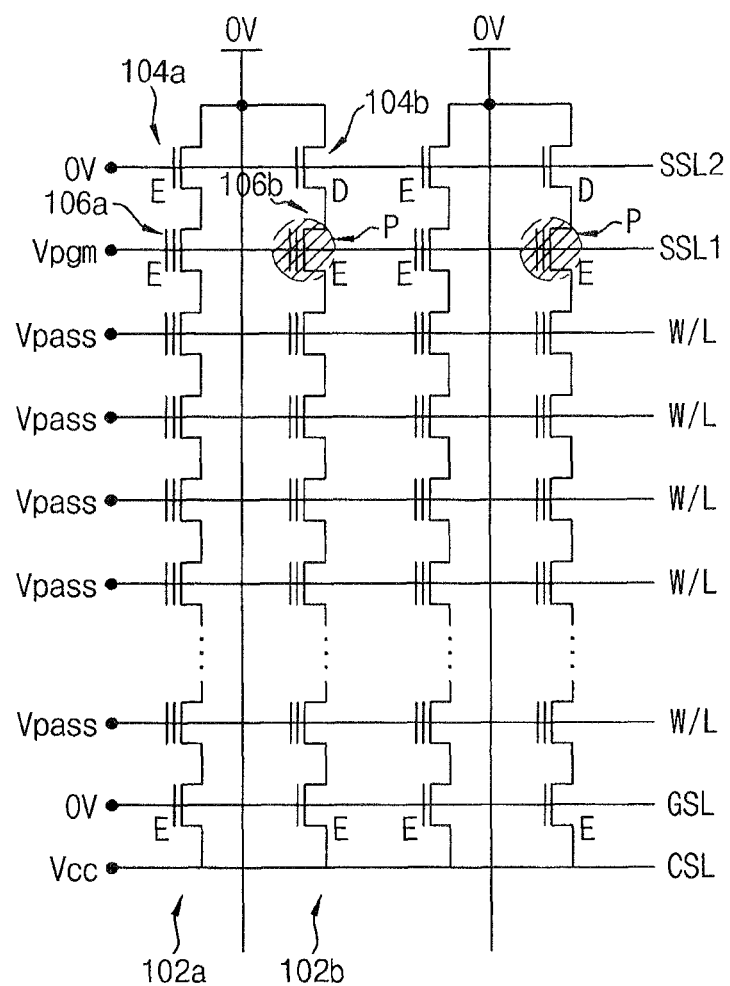
Figure 3C:
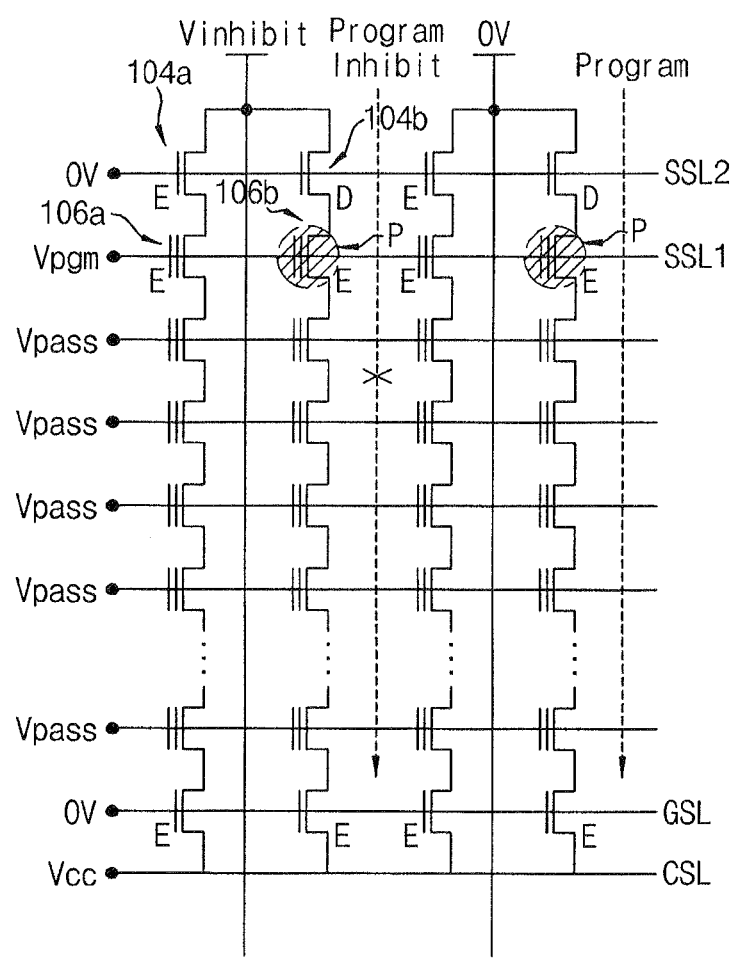

FIGS. 3A to 3C are circuit diagrams for explaining a method of controlling threshold voltages of selecting transistors, according to an exemplary embodiment of the inventive concept.

With respect to the cell array of the NAND flash memory device illustrated in FIG. 2A, the second selecting transistor 106a may be in an erased state and the fourth selecting transistor 106b may be in a programmed state. First, an erasing operation may be conducted with respect to both of the second and fourth selecting transistors 106a and 106b. Then, a programming operation may be selectively conducted with respect to only the fourth selecting transistors 106b.

To conduct the programming or the erasing operations with respect to the second and fourth selecting transistors 106a and 106b, separate circuits 125 for independently applying voltages to the second and fourth transistors 106a and 106b may be further provided as illustrated in FIG. 3A.

An erasing operation with respect to the second and fourth selecting transistors 106a and 106b is illustrated in FIG. 3A. To conduct the erasing operation, electric signals illustrated in Table 1 may be applied.

TABLE 1

| Bit line | First gate line | Second gate line | Cell tr word line | Ground selecting tr | p-well | Common source line |
|---|---|---|---|---|---|---|
| Floating | GND | Floating | GND | Floating | Vers | Floating |

Through application of the conditions illustrated in Table 1, the erasing operation may be conducted with respect to the second and fourth selecting transistors 106a and 106b and the cell transistor 108. The erasing operation may be conducted with respect to the cell transistors 108 in the present exemplary embodiment. However, the erasing operation may not be conducted with respect to the cell transistors 108.

FIG. 3B illustrates a programming operation with respect to the fourth selecting 106b transistors. To conduct the programming operation, electric signals illustrated in Table 2 may be applied.

TABLE 2

| Bit line | First gate line | Second gate line | Cell tr word line | Ground selecting tr | p-well | Common source line |
|---|---|---|---|---|---|---|
| GND | Vpgm | GND | Vpass | GND | GND | Vcc |

When the ground voltage is applied to the second gate line SSL2, the first selecting transistor 104a having a threshold voltage greater than the first reference voltage may be turned off. Accordingly, the programming operation with respect to the second selecting transistor 106a connected to the first cell string 102a may not be conducted.

When the ground voltage is applied to the second gate line SSL2, the third selecting transistor 104b having a threshold voltage smaller than the first reference voltage may be turned on. Accordingly, the programming operation may be selectively conducted with respect to the fourth selecting transistor 106b in the second cell string 102b. The threshold voltage of the fourth selecting transistor 106b may be greater than the second reference voltage.

All of the plurality of the fourth selecting transistors 106b sharing the first gate line SSL1 may have a target threshold voltage (Target Vth) greater than the second reference voltage. When the programming operation is continuously conducted with respect to the fourth selecting transistor 106b that has already reached to the target threshold voltage, the fourth selecting transistor 106b may be over-programmed with a voltage greater than the target threshold voltage. In addition, an electric property dispersion of the plurality of the fourth selecting transistors 106b may be deteriorated. Accordingly, the programming operation with respect to the fourth selecting transistor 106b that has already reached to the target threshold voltage may not be conducted any further so that the plurality of the fourth selecting transistors 106b may have the same target threshold voltage.

Accordingly, a verifying operation of the threshold voltage with respect to each of the fourth selecting transistors 106b may be conducted during the programming operation. After applying voltage pulses for the programming operation, voltage pulses for verifying the threshold voltage may be applied.

To verify the threshold voltage, electric signals illustrated in Table 3 may be applied.

TABLE 3

| Bit line | First gate line | Second gate line | Cell tr word line | Ground selecting tr | p-well | Common source line |
|---|---|---|---|---|---|---|
| Vverify | Vverify | Vread | Vread | Vread | GND | Vcc |

By verifying the threshold voltage, the programming operation may not be conducted any further with respect to the fourth selecting transistor 106b that has reached to the target threshold voltage.

FIG. 3C illustrates an operation of the fourth selecting transistor 106b that has reached to the target threshold voltage during the programming operation.

Referring to FIG. 3C, when the fourth selecting transistor 106b in the left-most cell string reaches the target threshold voltage, the ground voltage may not be applied to the bit line B/L connected to this string, but rather an inhibit voltage (Vinhibit) may be applied. The inhibit voltage may be the same as or greater than a voltage obtained by deducting the threshold voltage of the fourth selecting transistor 106b from a voltage applied to the second gate line SSL2.

Accordingly, the programming operation with respect to the fourth selecting transistor 106b that has reached the target threshold voltage may not be conducted any further. Through the above operation, the fourth selecting transistor 106b may have the target threshold voltage.

However, the programming operation with respect to the fourth selecting transistor 106b that has not reached to the target threshold voltage in the right-most cell string may still be conducted.

The threshold voltage of the second and fourth selecting transistors 106a and 106b may be controlled in accordance with the above-described method.

The cell array circuits of the NAND flash memory device illustrated in FIGS. 2A and 2B may be embodied by various constitutions on a substrate in accordance with a process design. Hereinafter, exemplary embodiments for embodying the cell array of the NAND flash memory device illustrated in FIG. 2B on a substrate will be explained.

Figure 4:
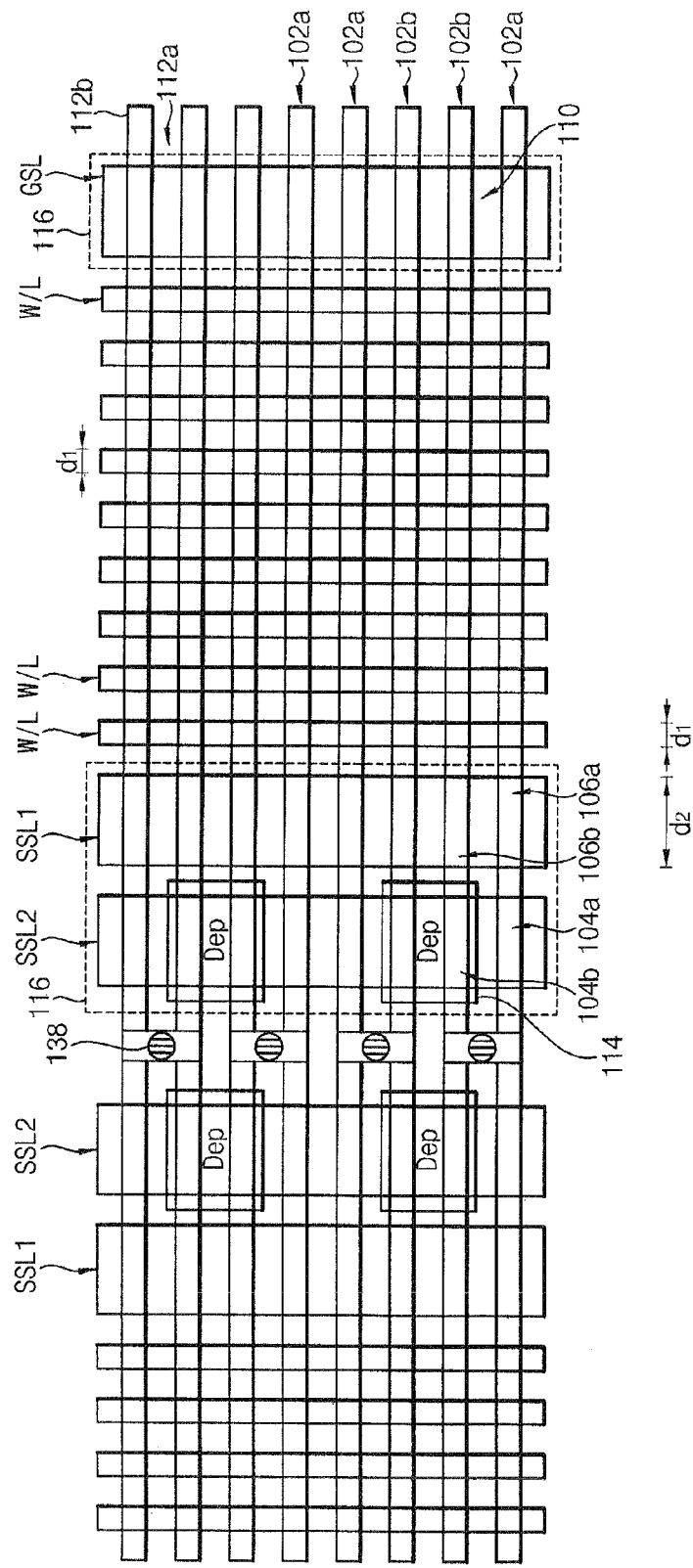
FIG. 4 is a plan view illustrating the cell array of the NAND flash memory device illustrated in FIG. 2B, according to an exemplary embodiment of the inventive concept.
Figure 5:
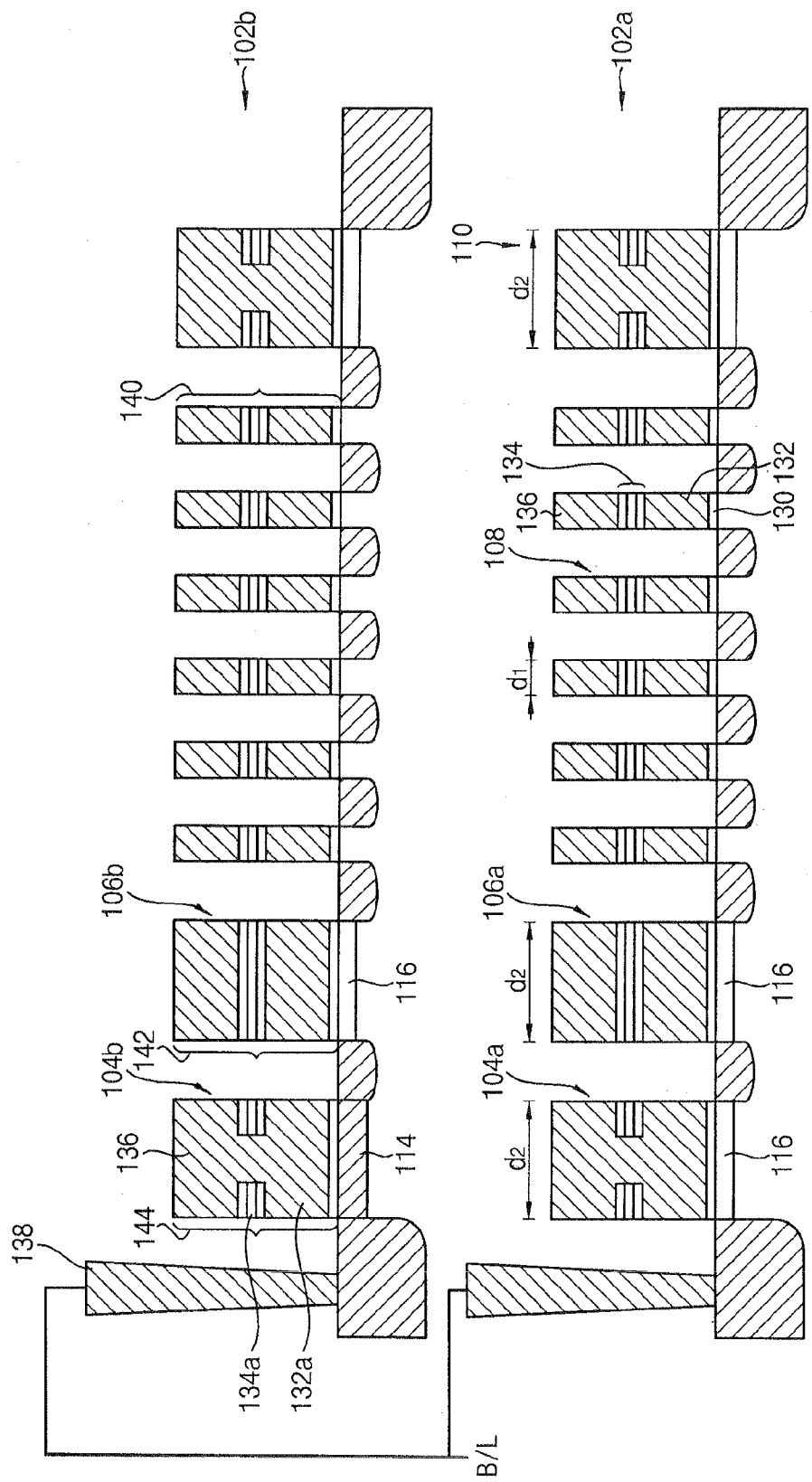
FIG. 5 is a cross-sectional view illustrating the cell array of the NAND flash memory device illustrated in FIG. 2B, according to an exemplary embodiment of the inventive concept.

FIG. 4 is a plan view illustrating the cell array of the NAND flash memory device illustrated in FIG. 2B, according to an exemplary embodiment of the inventive concept. FIG. 5 is a cross-sectional view illustrating the cell array of the NAND flash memory device illustrated in FIG. 2B, according to an exemplary embodiment of the inventive concept.

In the following exemplary embodiments of the inventive concept, a charge storing layer of cell transistors may be a floating gate.

Referring to FIGS. 4 and 5, a device isolation layer pattern 112a may be formed in a substrate, e.g., in a p-type silicon substrate. The device isolation layer pattern 112a may have a line shape extending in a first direction. Remaining regions between the device isolation layer patterns 112a may be an active region 112b.

A first channel region 114, which may be a channel region of the third selecting transistor 104b in the active region 112b, may be lightly doped with n-type impurities.

In addition, a second channel region 116, which may be a channel region of the first, second and fourth selecting transistors 104a, 106a and 106b and the ground selecting transistor 110 in the active region 112b may be doped with p-type impurities. The second channel region 116 may be highly doped with the p-type impurities when compared to the channel region of the cell transistors 108.

When the channel region of the third selecting transistor 104b is provided in another position, the cell array of the NAND flash memory device illustrated in FIG. 2A may be obtained even though not illustrated. To obtain the cell array of the NAND flash memory device illustrated in FIG. 2A, the channel region of the third selecting transistor 104b may be formed to alternately dispose the first and second cell strings 102a and 102b.

On the substrate, a first gate structure 140 for the cell transistor 108, a second gate structure 142 for the second and fourth selecting transistors 106a and 106b and a third gate structure 144 for the first and third selecting transistors 104a and 104b and for the ground selecting transistor 110 may be provided.

In FIG. 5, the lower part of the cross-sectional view corresponds to the first cell string 102a and the upper part of the cross-sectional view corresponds to the second cell string 102b.

The first gate structure 140 may include a tunnel insulating layer 130, a floating gate electrode 132, a blocking dielectric layer pattern 134 and a control gate electrode 136 integrated one by one as illustrated in FIG. 5. The control gate electrode 136 may be provided as a word line W/L and may extend in a second direction perpendicular to the active region 112b. The first gate structure 140 may have a first line width d1. The floating gate electrode 132 may include polysilicon. The blocking dielectric layer pattern 134 may have an integrated structure of an oxide material, a nitride material and an oxide material. Alternately, the blocking dielectric layer pattern 134 may include a metal oxide having a high dielectricity.

The second gate structure 142 may include the tunnel insulating layer 130, the floating gate electrode 132, the blocking dielectric layer pattern 134 and the control gate electrode 136 integrated one by one. Since the second gate structure 142 may be used as the second and fourth selecting transistors 106a and 106b, the second gate structure 142 may have a second line width d2 greater than the first line width d1. Since the second selecting transistors 106a are in an erased state in the second gate structure 142, the floating gate electrode 132 of the second selecting transistor 106a may have a positive charge injected state. Since the fourth selecting transistors 106b are in a programmed state, the floating gate electrode 132 included in the fourth selecting transistor 106b may have a negative charge injected state.

The third gate structures 144 may have an integrated structure of the tunnel insulating layer 130, a floating gate electrode 132a, a blocking dielectric layer pattern 134a and a control gate electrode 136a. However, the floating gate electrode 132a and the control gate electrode 136a may be in a connected state. Accordingly, the floating gate electrode 132a may not function as a charge storing layer. In addition, since the third gate structure 144 may be used as the first and third selecting transistors 104a and 104b, the second line width d2 of the third gate structure 144 may be greater than the first line width d1.

In active regions 112b at both sides of the second and third gate structures 142 and 144, n-type impurity regions may be formed. In addition, in active regions 112b at both sides of the first gate structure 140, n-type impurity regions may be formed.

An insulating interlayer (not illustrated) covering the first to third gate structures 140, 142 and 144 may be formed.

A bit line contact 138 penetrating the insulating interlayer and making an electric connection with the impurity region of the first selecting transistor 104a and the impurity region of the third selecting transistor 104b may be formed.

A bit line B/L (not illustrated) making a connection with the bit line contact 138 and extending in an extending direction of the active region 112b may be provided. A common source line (not illustrated) making a connection with one side of the impurity region of the ground selecting transistor 110 may be provided.

Hereinafter, a method of manufacturing the NAND flash memory device including the cell array illustrated in FIGS. 4 and 5 will be explained.

Figure 6A:
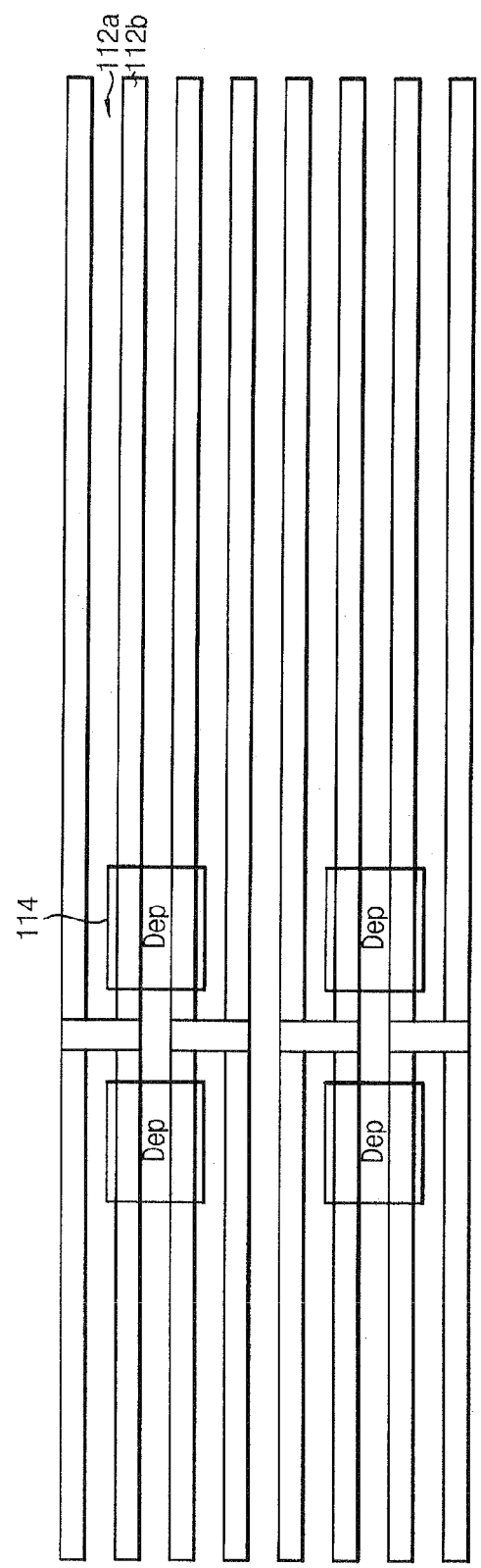

FIGS. 6A and 6B are plan views for explaining a method of manufacturing the cell array of the NAND flash memory device illustrated in FIGS. 4 and 5, according to an exemplary embodiment of the inventive concept.

Referring to FIG. 6A, a shallow trench device isolating process may be performed with respect to a substrate to form the device isolation layer pattern 112a. The substrate may be lightly doped with p-type impurities.

An ion injecting mask (not illustrated) may be formed for selectively exposing the channel region of the third selecting transistor 104b in the active region 112b between the device isolation layer patterns 112a. Then, n-type impurities may be lightly doped into the exposed region to form the first channel region 114.

Referring to FIG. 6B, an ion injecting mask may be formed for selectively exposing regions for forming the first, second, third and fourth selecting transistors 104a, 106a, 104b and 106b in the active region 112b and the ground selecting transistor 110. Then, p-type impurities may be doped into the exposed region to form the second channel region 116.

Through performing the above described processes, each of the channel regions of the first to fourth selecting transistors 104a, 106a, 104b and 106b may be formed. The processes explained referring to FIGS. 6A and 6B may be exchanged.

Referring to FIGS. 4 and 5 again, a tunnel oxide layer, a floating gate electrode layer, a blocking dielectric layer and a control gate electrode layer may be formed on the substrate. While performing the process of integrating these thin layers, a process of removing the blocking dielectric layer around the floating gate electrode and the control gate electrode may be additionally conducted to make a connection between the floating gate electrode and the control gate electrode when forming the first and third selecting transistors 104a and 104b. Then, the thin layers may be patterned. The first gate structure 140 for the cell transistor 108, the second gate structure 142 for the second and fourth selecting transistors 106a and 106b and the third gate structure 144 for the first and third selecting transistors 104a and 104b and for the ground selecting transistor 110 may be formed, respectively.

Into the active region 112b at both sides of the first to third gate structures 140, 142 and 144, n-type impurities may be doped.

The insulating interlayer (not illustrated) covering the first to third gate structures 140, 142 and 144 may be formed. The bit line contact 138 penetrating the insulating interlayer may be formed for making an electric connection with the impurity region of the first selecting transistor 104a and the impurity region of the third selecting transistor 104b.

The bit line B/L (not illustrated) making a connection with the bit line contact 138 and extending in the extending direction of the active region 112b may be formed.

The common source line (not illustrated) making a connection with one side of the impurity region of the ground selecting transistor 110 may be formed.

Through conducting the above described processes, a NAND flash memory device may be formed.

Then, a process of controlling the threshold voltage with respect to the first group selecting transistors of the NAND flash memory device may be performed. The second selecting transistors 106a may be erased and the fourth selecting transistors 106b may be programmed. The method of controlling the threshold voltages may be substantially the same as that described above referring to FIGS. 3A to 3C.

Figure 7B:
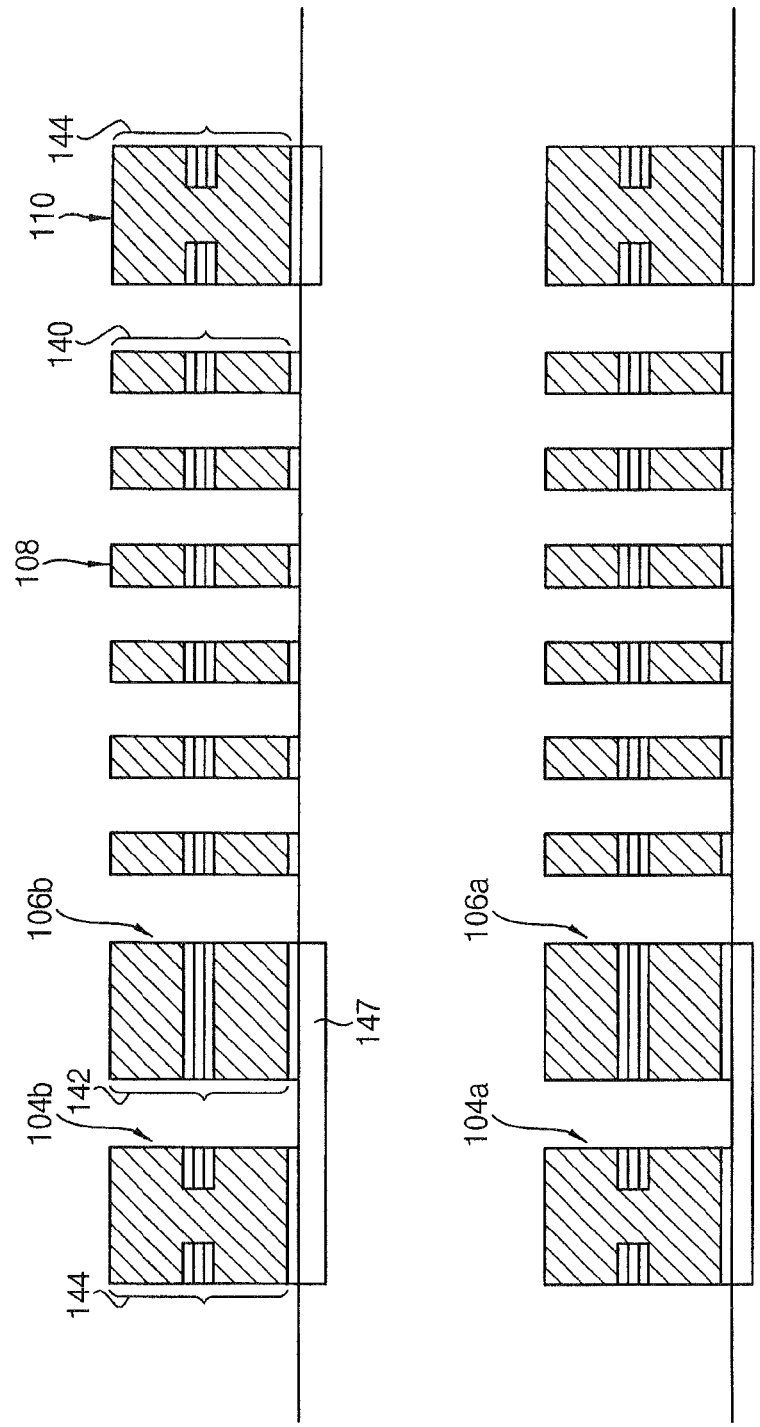

FIGS. 7A to 7C are cross-sectional views for explaining a method of manufacturing the cell array of the NAND flash memory device illustrated in FIGS. 4 and 5, according to an exemplary embodiment of the inventive concept.

Referring to FIG. 7A, a first ion doping mask 146a for selectively exposing regions for forming the first to fourth selecting transistors 104a, 106a, 104b and 106b and the ground selecting transistor 110 may be formed. Then, p-type impurities 147 may be doped into the exposed regions.

Referring to FIG. 7B, a first gate structure 140 for the cell transistor 108, a second gate structure 142 for the second and fourth selecting transistors 106a and 106b and a third gate structure 144 for the first and third selecting transistors 104a and 104b and the ground selecting transistor 110 may be formed, respectively.

Referring to FIG. 7C, a second ion doping mask 146b for exposing the channel region of the third selecting transistor 104b may be formed. Through a halo ion doping process, n-type impurities may be selectively doped only into the channel region 114 of the third selecting transistor 104b. By performing this process, the second selecting transistor 106a may become a depletion mode transistor.

Then, the n-type impurity doping process and forming processes of the insulating interlayer, the bit line contact, the bit line, the common source line, etc., may be conducted by substantially the same process described above with reference to FIGS. 4 and 5 to manufacture the NAND flash memory device.

Figure 8:
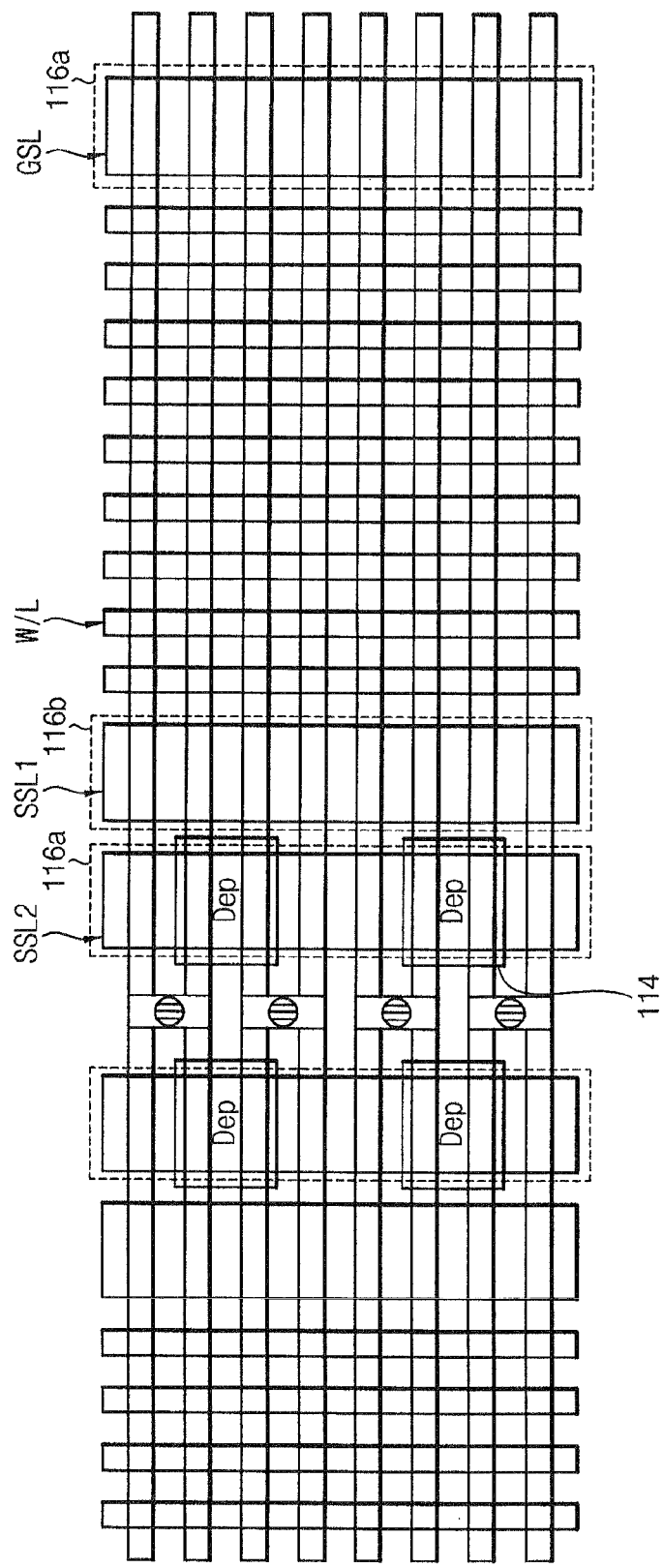
FIG. 8 is a plan view for illustrating a cell array of the NAND flash memory device illustrated in FIG. 2B, according to an exemplary embodiment of the inventive concept.
Figure 9:
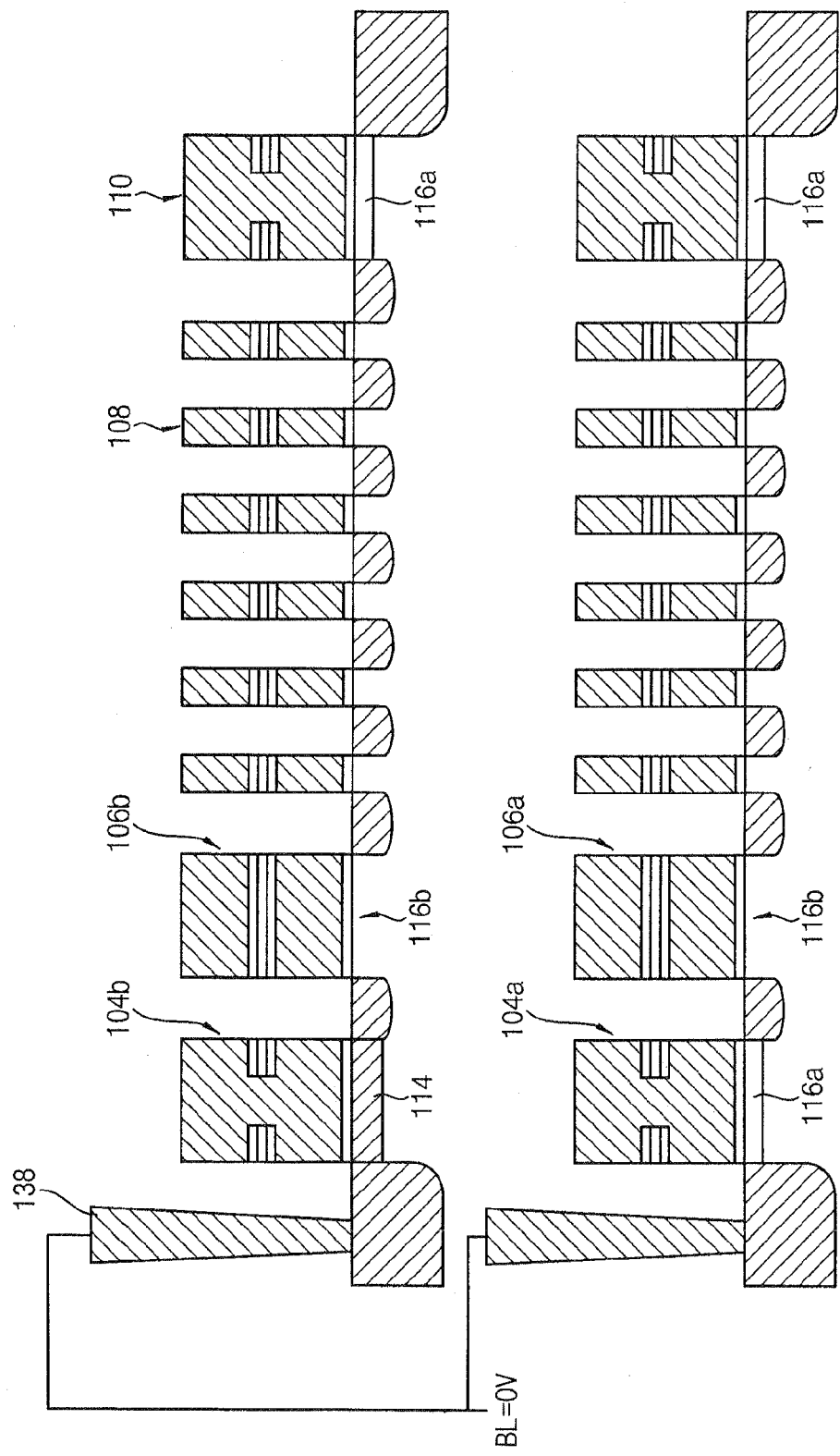
FIG. 9 is a cross-sectional view of the cell array of the NAND flash memory device illustrated in FIG. 8, according to an exemplary embodiment of the inventive concept.

FIG. 8 is a plan view illustrating the cell array of the NAND flash memory device illustrated in FIG. 2B, according to an exemplary embodiment of the inventive concept. FIG. 9 is a cross-sectional view illustrating the cell array of the NAND flash memory device illustrated in FIG. 8, according to an exemplary embodiment of the inventive concept.

The cell array illustrated in FIGS. 8 and 9 may be substantially the same as the cell array illustrated in FIGS. 4 and 5 except that the doping concentration of a channel region 116a of the enhancement mode transistor in the second group selecting transistors and a channel region 116b of the first group selecting transistors are different.

Referring to FIGS. 8 and 9, since the third selecting transistor 104b in the active region of the substrate may be a depletion mode transistor, the channel region 114 may be lightly doped with n-type impurities. Since the first, second and fourth selecting transistors 104a, 106a and 106b and the ground selecting transistor 110 may be enhancement mode transistors, the channel regions 116a and 116b may be doped with p-type impurities.

The channel region 116a of the first selecting transistor 104a and the ground selecting transistor 110, which may be provided as the enhancement transistors among the second group selecting transistors, may be relatively highly doped with p-type impurities. In addition, the channel region 116b of the second and fourth selecting transistors 106a and 106b, which may be provided as the first group selecting transistors, may be relatively lightly doped with p-type impurities.

The threshold voltage of the second and fourth selecting transistors 106a and 106b in the first group selecting transistors may be determined not by the channel doping but electrically. Accordingly, the channel region 116b may not be highly doped. The channel doping concentration of the second and fourth transistors 106a and 106b adjacent to the cell transistor 108 may be decreased and a junction characteristic between the second and fourth selecting transistors 106a and 106b may be improved.

Figure 10:
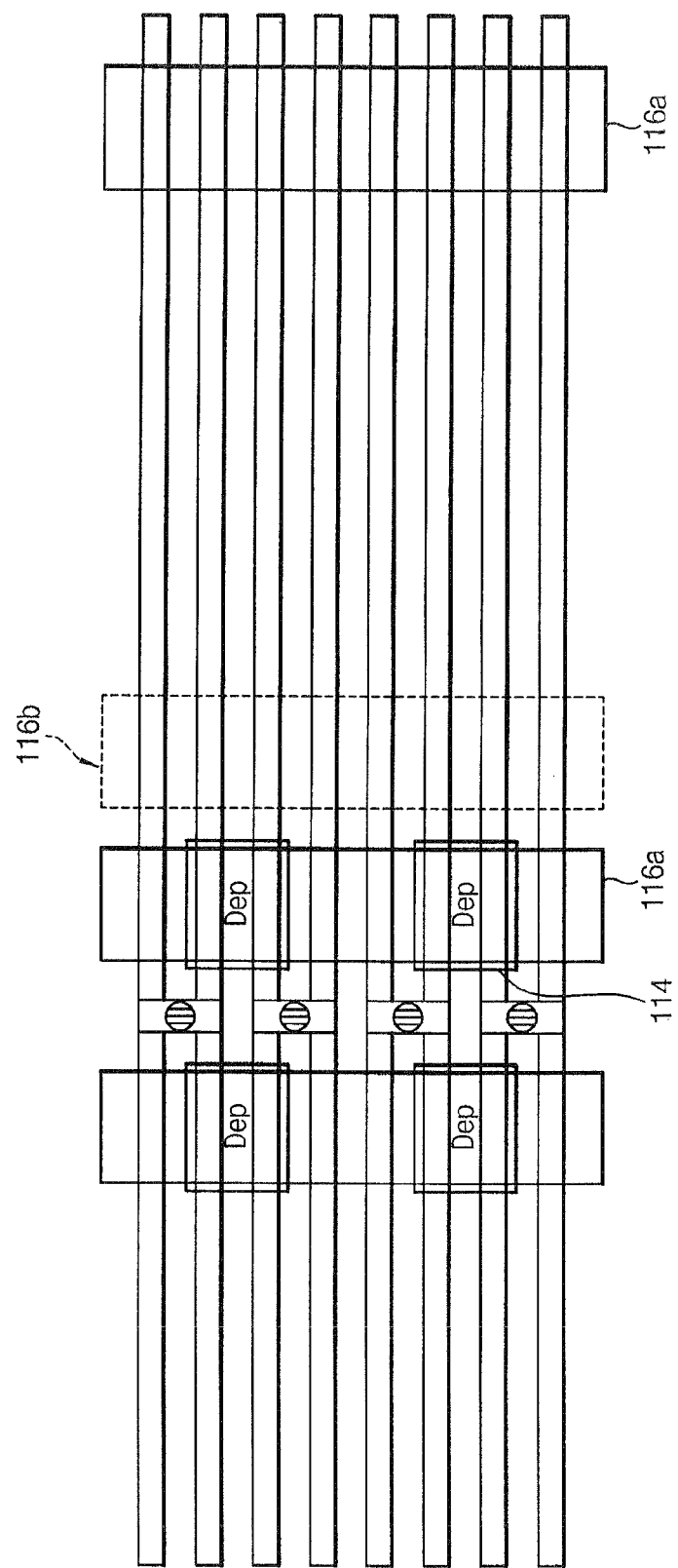
FIG. 10 is a plan view for explaining a method of manufacturing the cell array of the NAND flash memory device illustrated in FIGS. 8 and 9, according to an exemplary embodiment of the inventive concept.

FIG. 10 is a plan view for explaining a method of manufacturing the cell array of the NAND flash memory device illustrated in FIGS. 8 and 9, according to an exemplary embodiment of the inventive concept.

By performing the process explained referring to FIG. 6A, n-type impurities may be selectively and lightly doped into the channel region 114 of the third selecting transistor 104b.

Referring to FIG. 10, an ion doping mask (not illustrated) for selectively exposing the forming regions of the first selecting transistor 104a and the ground selecting transistor 110 in the active region may be formed. Then, p-type impurities may be doped into the exposed region, in other words, the channel region 116a, by the ion doping mask.

By doping the p-type impurities only into the channel region 116a of the first and third selecting transistors 104a and 104b, the channel regions 116b of the second to fourth transistors 106a and 106b may be relatively lightly doped with p-type impurities when compared to the first selecting transistor 104a.

By performing the above described processes, the channel doping process of each of the selecting transistors may be completed.

Then, the forming process of the gate structures, the doping process of n-type impurities and the forming processes of the insulating interlayer, the bit line contact, the bit line, the common source line, etc., may be conducted by substantially the same process described above with reference to FIGS. 4 and 5 to manufacture the NAND flash memory device.

Figure 11:
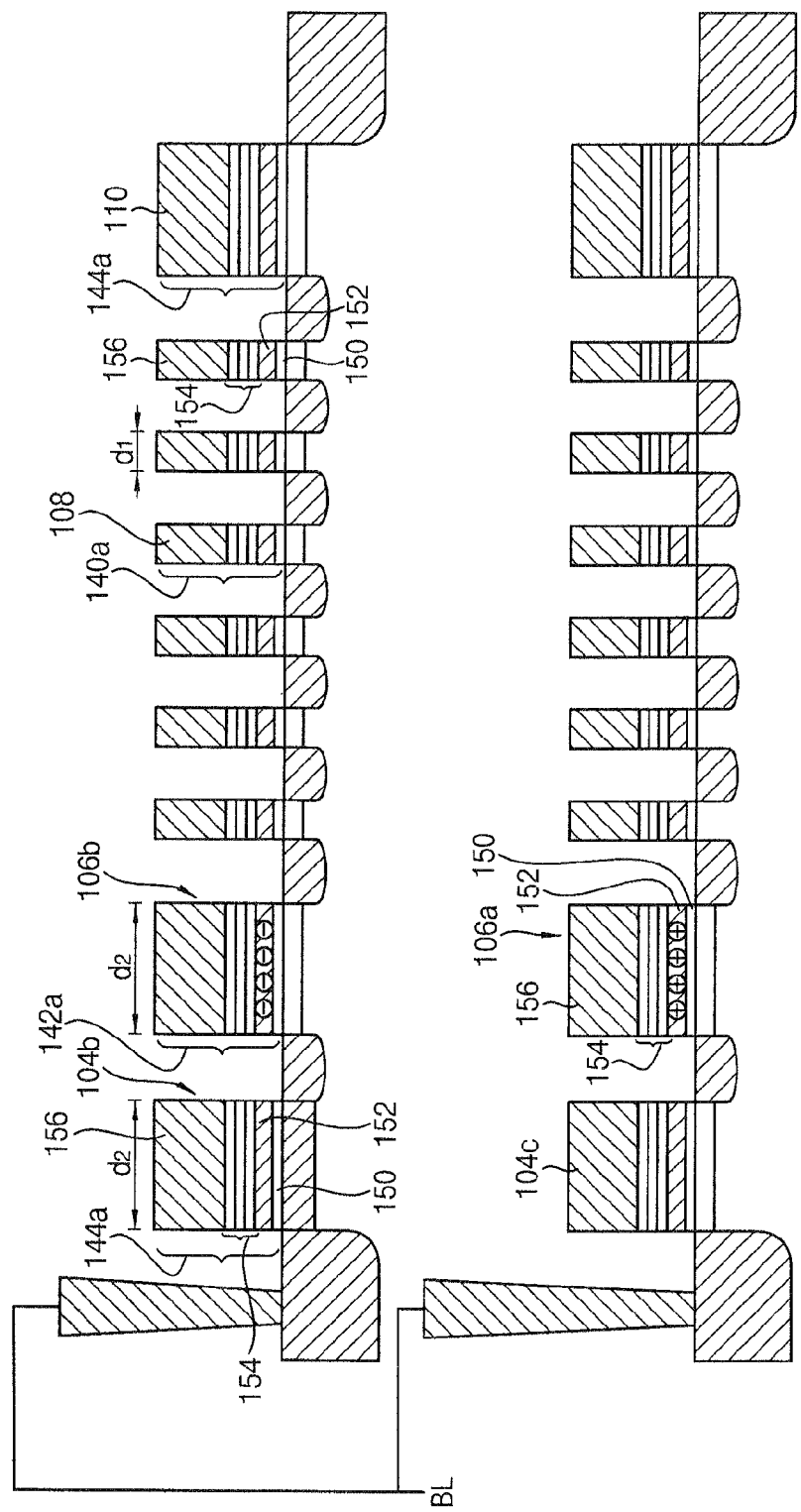
FIG. 11 is a cross-sectional view illustrating the cell array of the NAND flash memory device illustrated in FIG. 2B, according to an exemplary embodiment of the inventive concept.

FIG. 11 is a cross-sectional view illustrating the cell array of the NAND flash memory device illustrated in FIG. 2B, according to an exemplary embodiment of the inventive concept.

In accordance with an exemplary embodiment of the inventive concept, a charge storing layer of the cell transistors may be a charge trapping layer. Accordingly, the cell array of FIG. 11 may be substantially the same as the cell array illustrated in FIG. 4 except for the integrated structure of the selecting transistors. Therefore, the plan view of the cell array in the present exemplary embodiment may be the same as that illustrated in FIG. 4.

Referring to FIG. 11, a first gate structure 140a for the cell transistor 108, a second gate structure 142a for the second and fourth selecting transistors 106a and 106b and a third gate structure 144a for the first and third selecting transistors 104a and 104b and the ground selecting transistor 110 may be provided.

The first gate structure 140a may include a tunnel insulating layer 150, a charge trapping layer pattern 152, a blocking dielectric layer pattern 154 and a control gate electrode 156 integrated one by one. The control gate electrode 156 may be provided as a word line and may extend to a second direction. The first gate structure 140a may have a first line width d1. The charge trapping layer pattern 152 may include silicon nitride.

The second gate structure 142a may include the tunnel insulating layer 150, the charge trapping layer pattern 152, the blocking dielectric layer pattern 154 and the control gate electrode 156 integrated one by one. Since the second gate structure 142a may be used as the second and fourth selecting transistors 106a and 106b, the second gate structure 142a may have a second line width d2 greater than the first line width d1. The charge trapping layer pattern 152 included in the second selecting transistor 106a in the second gate structure 142a, may be injected with positive charges. In addition, the charge trapping layer pattern 152 included in the fourth selecting transistor 106b, may be injected with negative charges.

The third gate structure 144a may also include the tunnel insulating layer 150, the charge trapping layer pattern 152, the blocking dielectric layer pattern 154 and the control gate electrode 156 integrated one by one like the second gate structure 142a. The charge trapping layer pattern 152 of the third gate structure 144a may not function to store charges. In the third gate structure 144a, the tunnel insulating layer 150, the charge trapping layer pattern 152 and the blocking dielectric layer pattern 154 may function as a gate oxide layer. Since the third gate structure 144a may be used as the first and third selecting transistors 104a and 104b, the third gate structure 144a may have the second line width d2 greater than the first line width d1.

The cell array of the NAND flash memory device illustrated in FIG. 11 may be substantially the same as the cell array of the NAND flash memory device illustrated in FIG. 4 except for the integrated structure of the thin layers included in the gate structures. Accordingly, the manufacturing process of the device illustrated in FIG. 11 may be substantially the same as the process explained for the manufacture of the NAND flash memory device illustrated in FIG. 4 except for the thin layers used to form the gate structures. Since the first to third gate structures 140a, 142a and 144a may have the same integrated structure, a partial removing process of the blocking dielectric layer while patterning the first to third gate structures 140a, 142a and 144a may not be conducted.

Figure 12:
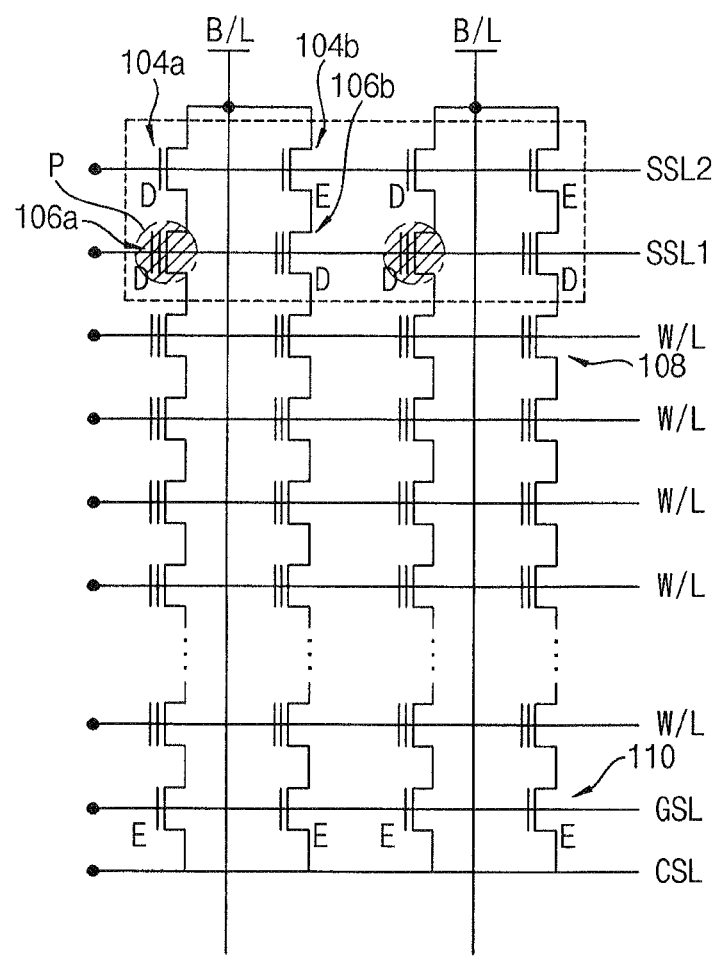
FIG. 12 is a circuit diagram of a cell array of a NAND flash memory device in accordance with an exemplary embodiment of the inventive concept.
Figure 13:
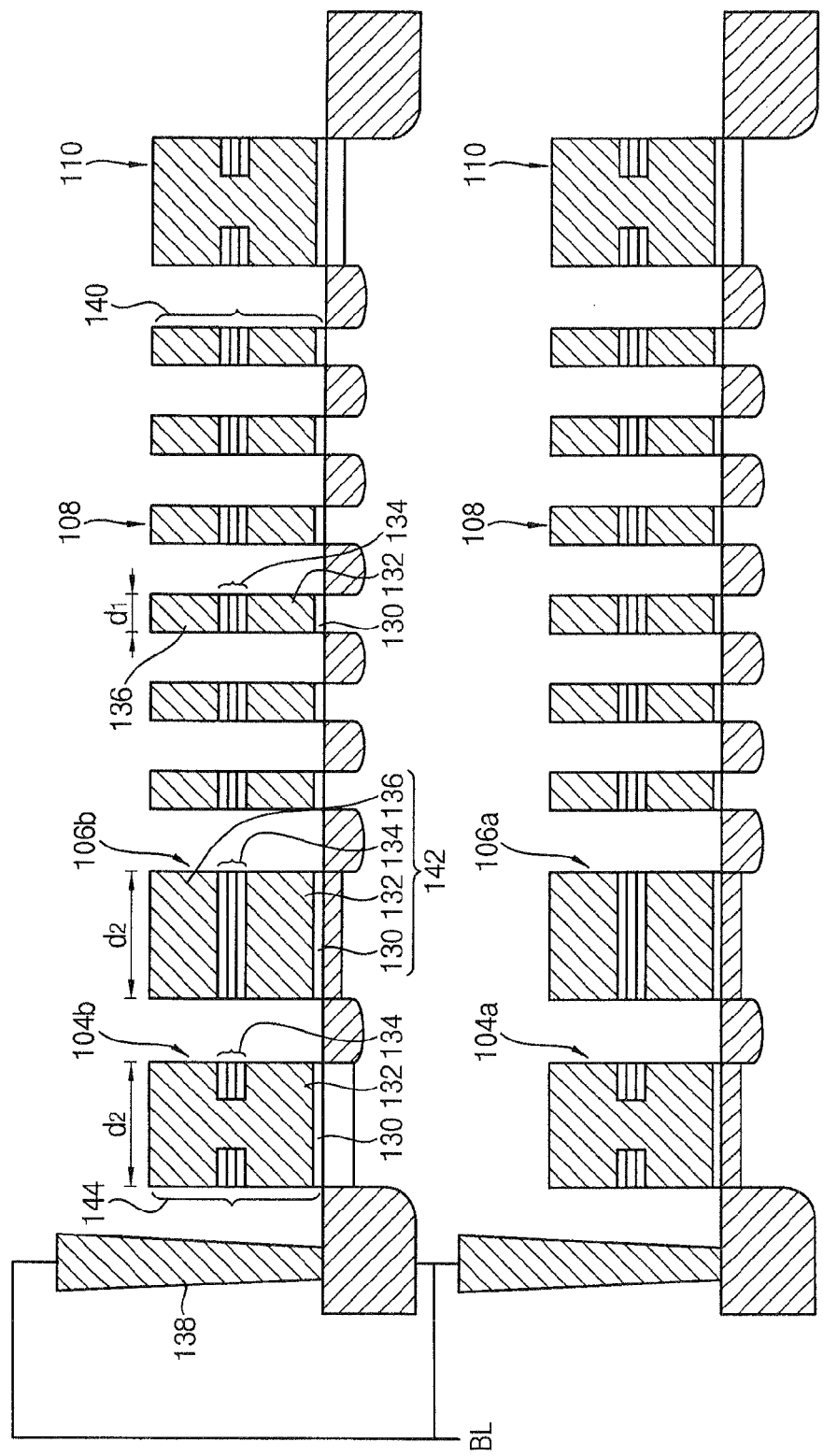
FIG. 13 is a cross-sectional view of the cell array of the NAND flash memory device illustrated in FIG. 12, according to an exemplary embodiment of the inventive concept.

FIG. 12 is a circuit diagram of a cell array of a NAND flash memory device in accordance with an exemplary embodiment of the inventive concept. FIG. 13 is a cross-sectional view of the cell array of the NAND flash memory device illustrated in FIG. 12, according to an exemplary embodiment of the inventive concept.

The NAND flash memory device in accordance with the present exemplary embodiment may be substantially the same as the NAND flash memory device illustrated in FIGS. 2A-11 except for the constitutions of the first to fourth selecting transistors 104a, 106a, 104b and 106b.

Referring to FIGS. 12 and 13, one of the second group selecting transistors connected to the common bit line B/L may be provided as a depletion mode MOS transistor D and the other one may be provided as an enhancement mode MOS transistor E. Particularly, the first selecting transistor 104a may be provided as the depletion mode MOS transistor D and the third selecting transistor 104b may be provided as the enhancement mode MOS transistor E.

The second and fourth selecting mode transistors 106a and 106b of the first group selecting transistors may be provided as the depletion mode cell type transistors D, in which all of the impurity regions provided as the channel regions and the source and drain may have the same conductive mode.

The second and fourth selecting transistors 106a and 106b may physically have the same integrated structure. Each of the charge storing layer patterns of the second and fourth selecting transistors 106a and 106b, may be injected with different charges may and so, the second and fourth selecting transistors 106a and 106b may have different threshold voltages from each other.

In other words, the second selecting transistor 106a connected in series with the first selecting transistor 104a may be provided as an electrically enhancement mode transistor. Accordingly, the second selecting transistor 106a may keep a programmed state P and may have a relatively high threshold voltage greater than 0V.

The fourth selecting transistor 106b connected in series with the third selecting transistor 104b may be provided as an electrically depletion mode transistor D. In this case, the fourth selecting transistor 106b may be the depletion mode transistor D at an initial state before conducting the programming or erasing operations. Accordingly, the fourth selecting transistor 106b may have a threshold voltage smaller than 0V without applying separate electrical operation. Therefore, the fourth selecting transistor 106b may be in an erased state or may be in the initial state.

Hereinafter, a method of controlling the threshold voltages of the second and fourth selecting transistors 106a and 106b in the NAND flash memory device illustrated in FIGS. 12 and 13 will be described in detail.

Figure 14A:
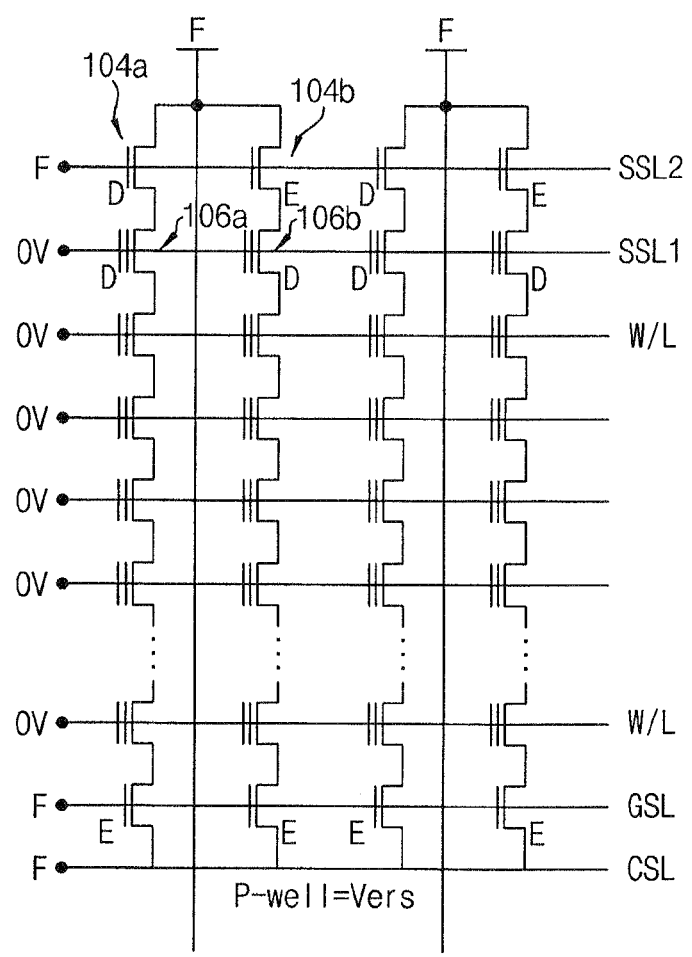
FIGS. 14A and 14B are circuit diagrams for explaining an operation of controlling threshold voltages of transistors included in the NAND flash memory device illustrated in FIG. 12, according to an exemplary embodiment of the inventive concept.
Figure 14B:
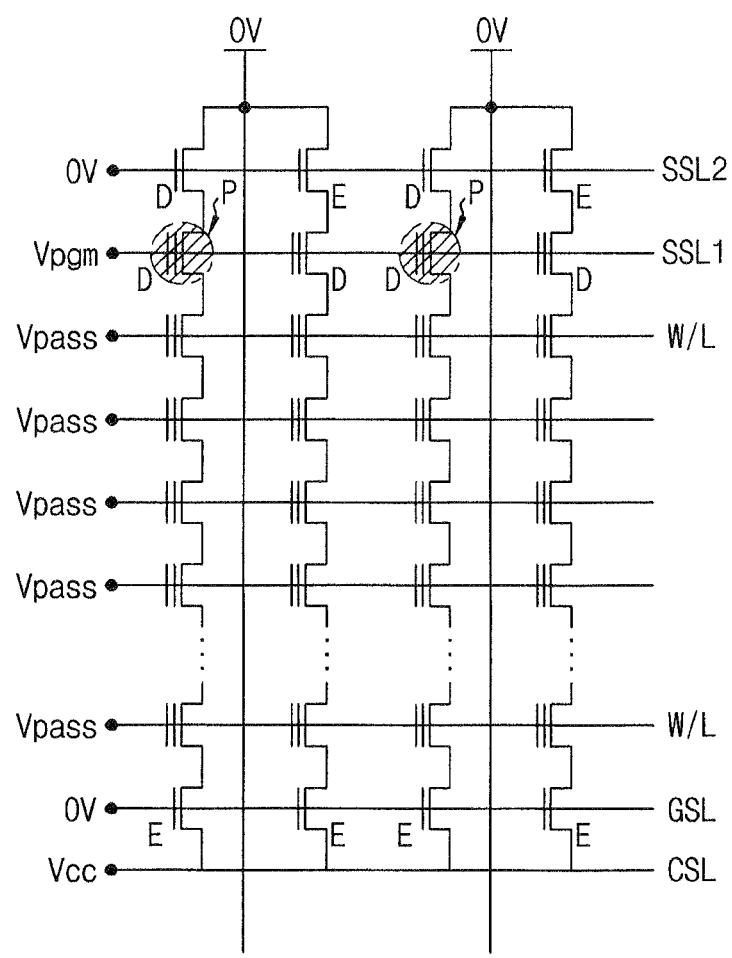

FIGS. 14A and 14B are circuit diagrams for explaining an operation of controlling the threshold voltages of the transistors included in the NAND flash memory device illustrated in FIG. 12.

In the NAND flash memory device illustrated in FIG. 12, the second selecting transistors 106a may have a relatively high threshold voltage and the fourth selecting transistors 106b may have a relatively low threshold voltage. To accomplish the above state, an erasing operation may be conducted with respect to the second and fourth selecting transistors 106a and 106b. Then, a programming operation may be selectively conducted with respect to only the second selecting transistors 106a.

FIG. 14A illustrates a process of performing an erasing operation with respect to the second and fourth transistors 106a and 106b. Electric signals in Table 4 may be applied to perform the erasing operation.

TABLE 4

| Bit line | First gate line | Second gate line | Cell tr word line | Ground selecting tr | p-well | Common source line |
|---|---|---|---|---|---|---|
| Floating | GND | Floating | GND | Floating | Vers | Floating |

Through application of the conditions in Table 4, the erasing operation may be conducted with respect to the second and fourth selecting transistors 106a and 106b and the cell transistor 108.

Since the fourth selecting transistor 106b is provided as the depletion mode transistor D, the fourth selecting transistor 106b may have a threshold voltage smaller than 0V. Accordingly, the erasing operation may not be conducted with respect to the fourth selecting transistor 106b.

FIG. 14B illustrates a process of performing a programming operation with respect to the second transistors 106a. Electric signals in Table 5 may be applied to perform the programming operation.

TABLE 5

| Bit line | First gate line | Second gate line | Cell tr word line | Ground selecting tr | p-well | Common source line |
|---|---|---|---|---|---|---|
| GND | Vpgm | GND | Vpass | GND | GND | Vcc |

Through application of the conditions in Table 5, the third selecting transistor 104b may be turned off and a programming operation may not be conducted with respect to the fourth selecting transistor 106b. However, the first selecting transistor 104b may be turned on and the programming operation may be conducted with respect to the second selecting transistor 106a. Accordingly, the threshold voltage of the second selecting transistor 106a may be higher than 0V.

While performing the programming operation, the verifying operation of the threshold voltage may be continuously conducted. When the threshold voltage of the second selecting transistor 106a is increased over a set reference voltage, the programming operation may not be conducted any further.

The charge storing layer pattern may be used as the floating gate electrode or as the charge trapping layer pattern in the cell array in the present exemplary embodiment.

The NAND flash memory device illustrated in FIGS. 12-14B may be substantially the same as the NAND flash memory device illustrated in FIGS. 2A-11 except for the conductive type of doped impurities in the channel region of the second and fourth selecting transistors 106a and 106b. Accordingly, the NAND flash memory device in the present exemplary embodiment may be manufactured by substantially the same manufacturing process described in the prior exemplary embodiments. In this case, n-type impurities may also be doped into the channel region of the second and fourth selecting transistors 106a and 106b to form the channel regions of the second and fourth selecting transistors 106a and 106b while performing the doping process of the n-type impurities for forming the channel region of the first selecting transistor 104a.

Figure 15:
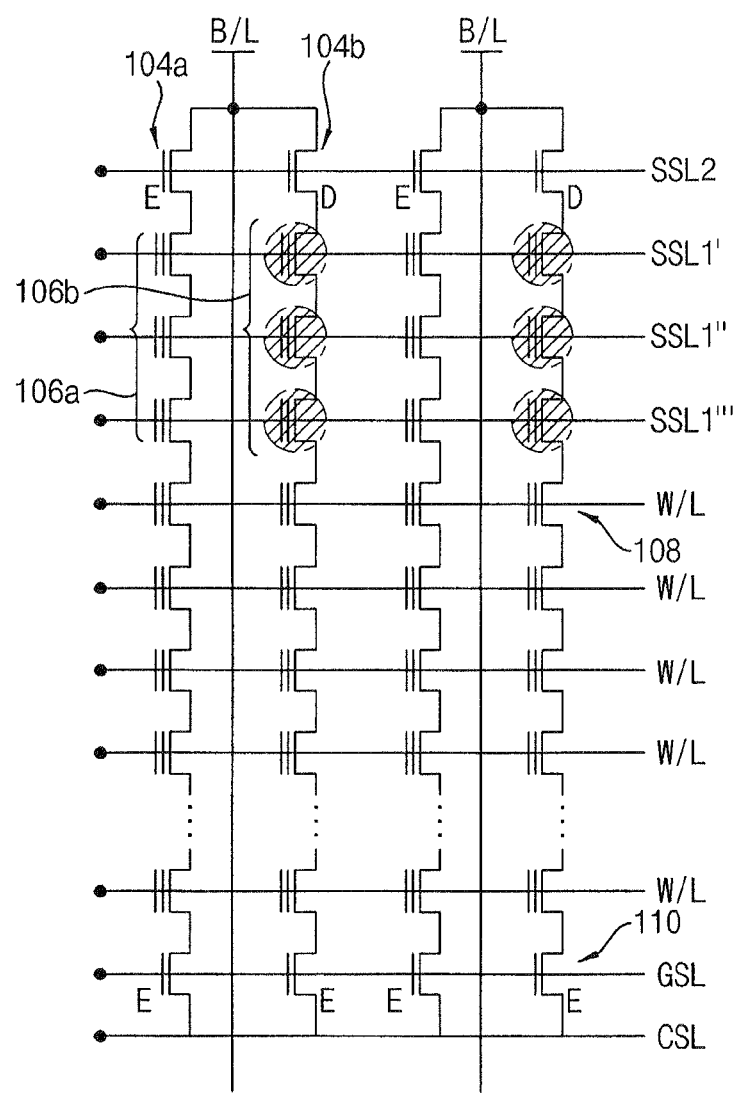
FIG. 15 is a circuit diagram of a cell array of a NAND flash memory device in accordance with an exemplary embodiment of the inventive concept.

FIG. 15 is a circuit diagram of a cell array of a NAND flash memory device in accordance with an exemplary embodiment of the inventive concept.

The NAND flash memory device in the present exemplary embodiment may be substantially the same as the NAND flash memory device in FIGS. 2A-11 except for the constitution of the selecting transistors.

Referring to FIG. 15, one of the second group selecting transistors may be provided as a depletion mode MOS transistor D and the other transistor may be provided as an enhancement mode MOS transistor E. Particularly, the first selecting transistor 104a may be provided as the enhancement mode MOS transistor E and the third selecting transistor 104b may be provided as the depletion mode MOS transistor D.

All of the first group selecting transistors including the second and fourth selecting transistors 106a and 106b may be provided as the enhancement mode cell type transistors and may include channel regions having different a conductive type from their source/drain regions.

In one cell string sharing the bit line B/L, a plurality of the second selecting transistors 106a may be connected in series. Each of the second selecting transistors 106a may have the same physical constitution as the cell transistors 108. In addition, each of the second selecting transistors 106a may have relatively short gate length when compared to the first group selecting transistors 104a and 104b. Particularly, each of the second selecting transistors 106a may have substantially the same gate length as the cell transistor 108. The channel region of the plurality of the second selecting transistors 106a connected in series may have a connected shape and the plurality of series connected second selecting transistors 106a may operate electrically as one transistor.

A plurality of the fourth selecting transistors 106b may be connected in series in the other cell string sharing the bit line B/L. Each of the fourth selecting transistors 106b may have the same physical constitution as the cell transistors 108. Each of the fourth selecting transistors 106b may have a short gate length when compared to the first group selecting transistors 104a and 104b. Particularly, each of the fourth selecting transistors 106b may have substantially the same gate length as the cell transistors 108. The channel regions of the plurality of the fourth selecting transistors 106b connected in series may have a connected shape and the plurality of series connected fourth selecting transistors 106b may operate electrically as one transistor.

The charge storing layer pattern of each of the second and fourth selecting transistors 106a and 106b, may be injected with different charges. Accordingly, the second and fourth selecting transistors 106a and 106b may have different threshold voltages from each other.

Particularly, since the first selecting transistor 104a is the enhancement mode MOS transistor E, the second selecting transistors 106a connected in series may be provided as electrically depletion mode transistors. Accordingly, the second selecting transistor 106a may be kept in an erased state and may have a threshold voltage smaller than 0V.

Since the third selecting transistor 104b is the depletion mode MOS transistor D, all of the fourth selecting transistors 106b connected in series may be provided as electrically enhancement mode transistors. Accordingly, the fourth selecting transistor 106b may be kept in a programmed state and may have a threshold voltage smaller than 0V.

Figure 16:
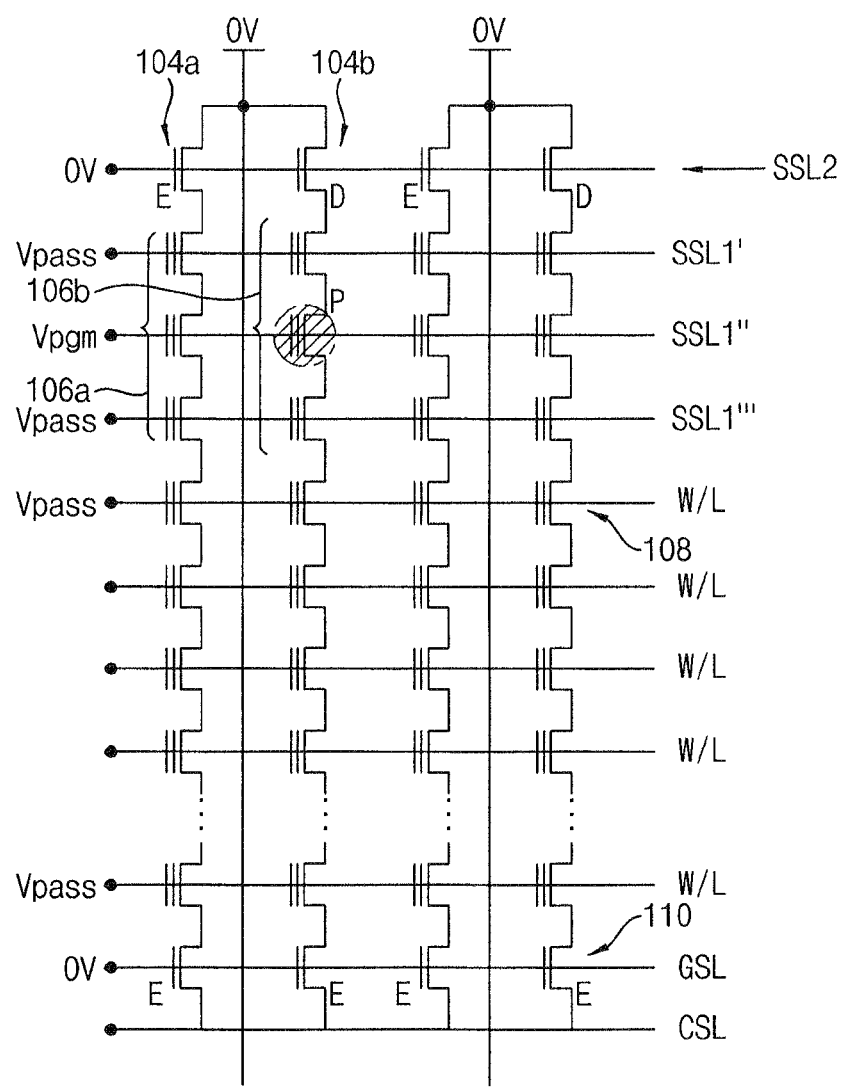
FIG. 16 is a circuit diagram for explaining an operation of controlling threshold voltages of transistors included in the NAND flash memory device illustrated in FIG. 15, according to an exemplary embodiment of the inventive concept.

FIG. 16 is a circuit diagram for explaining an operation of controlling the threshold voltage of the transistors included in the NAND flash memory device illustrated in FIG. 15, according to an exemplary embodiment of the inventive concept.

In the NAND flash memory device illustrated in FIG. 15, the second selecting transistors 106a may have a relatively high threshold voltage and the fourth selecting transistors 106b may have a relatively low threshold voltage.

To accomplish the above described condition, an erasing operation may be conducted with respect to all of the second and fourth selecting transistors 106a and 106b. Electric signals applied for the erasing operation are illustrated in Table 6.

TABLE 6

| Bit line | First gate line (adjacent to second gate line) | First gate line (remaining) | Second gate line | Word line | Ground selecting tr | p-well | Common source line |
|---|---|---|---|---|---|---|---|
| Floating | Vrelax | GND | Floating | GND | Floating | Vers | Floating |

While conducting the erasing operation with respect to the cell transistor 108, Vrelax voltage may be applied to the first gate line SSL1' adjacent to the second gate line SSL2 among the plurality of the first gate lines SSL1', SSL1" and SSL1'". The Vrelax voltage may be greater than 0V and smaller than the erasing voltage applied to the p-well. By applying the voltage greater than 0V to the first gate line SSL1' adjacent to the second gate line SSL2, a break down between the floated second gate line SSL2 and the first gate line may be restrained SSL1'.

Then, a programming operation may be conducted subsequently for each of the fourth selecting transistors 106b as illustrated in FIG. 16. To conduct the programming operation, electric signals illustrated in Table 7 may be applied.

TABLE 7

| Bit line | First gate line (selected) | First gate line (non-selected) | Second gate line | Word line | Ground selecting tr | p-well | Common source line |
|---|---|---|---|---|---|---|---|
| GND | Vpgm | Vpass | GND | Vpass | GND | GND | Vcc |

Through application of the conditions in Table 7, the first selecting transistor 104a may be turned off and the programming operation may not be conducted with respect to the second selecting transistors 106a. However, the third selecting transistor 104b may be turned on. The programming voltage Vpgm may be applied to the selected first gate line SSL1" to conduct the programming operation. The pass voltage Vpass may be applied to the non-selected first gate lines SSL1', SSL1'" to suppress the programming operation.

Each of the first gate lines SSL1', SSL1" and SSL1'" may be selected and the programming operation may be conducted subsequently to program all of the four selecting transistors 106b connected in series. The threshold voltage of the fourth selecting transistors 106b may be greater than 0V.

In addition, a verifying operation of the threshold voltage may be continuously performed while conducting the programming operation.

Various configurations of the cell array of the NAND flash memory device in FIG. 15 may be formed on a substrate in accordance with a process design. An exemplary embodiment of the inventive concept in which the cell arrays of the NAND flash memory device illustrated in FIG. 15 are formed on a substrate will now be described.

Figure 17:
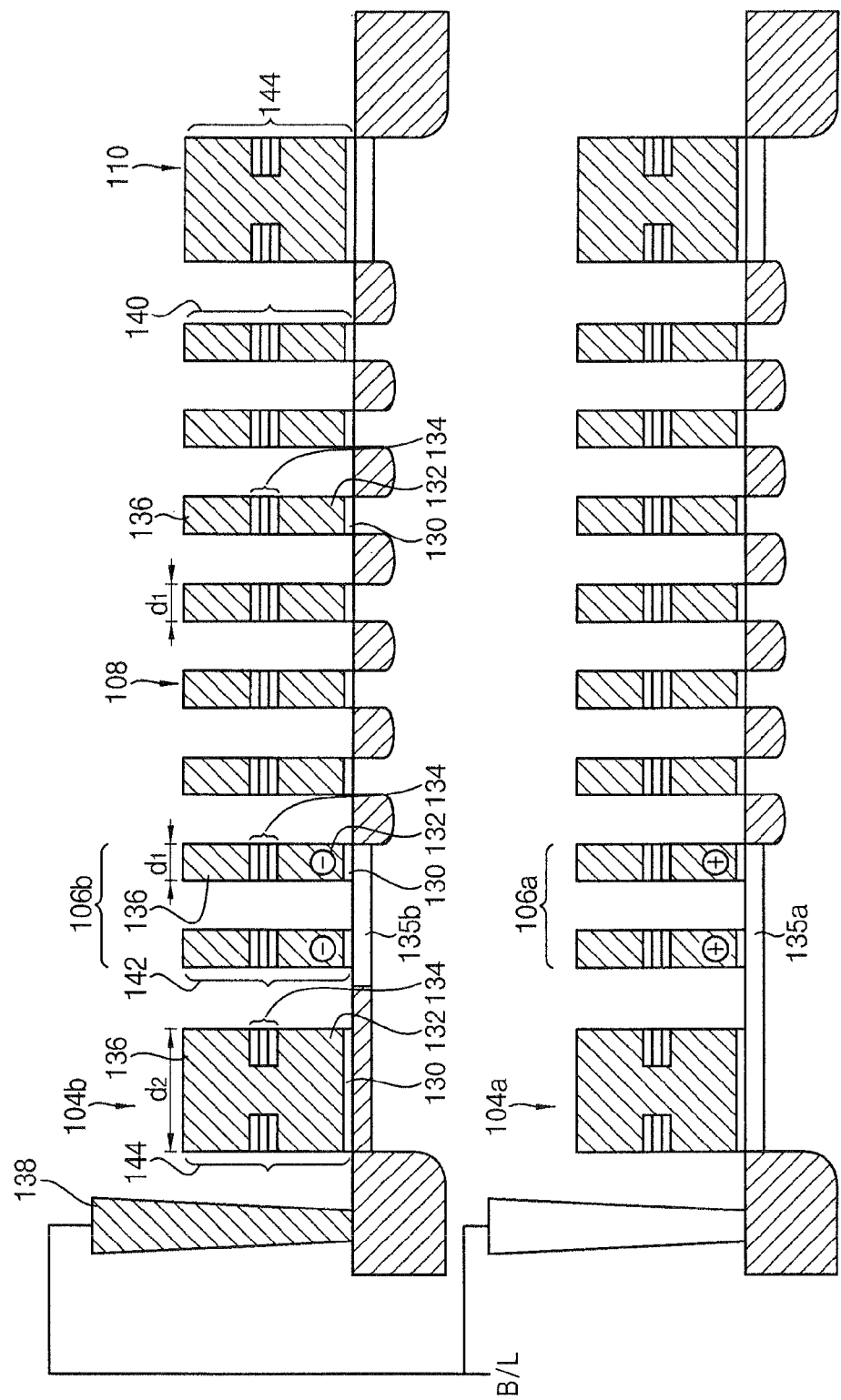
FIG. 17 is a cross-sectional view illustrating the cell array of the NAND flash memory device illustrated in FIG. 15, according to an exemplary embodiment of the inventive concept.

FIG. 17 is a cross-sectional view of the cell array of the NAND flash memory device illustrated in FIG. 15, according to an exemplary embodiment of the inventive concept.

Referring to FIG. 17, a first gate structure 140 for the cell transistor 108, a second gate structure 142 for the second and fourth selecting transistors 106a and 106b and a third gate structure 144 for the first and third selecting transistors 104a and 104b and the ground selecting transistor 110 may be formed on a substrate.

The first gate structures 140 may include a tunnel insulating layer 130, a floating gate electrode 132, a blocking dielectric layer pattern 134 and a control gate electrode 136 integrated one by one. The first gate structure 140 may have a first line width d1.

The second gate structure 142 may include the tunnel insulating layer 130, the floating gate electrode 132, the blocking dielectric layer pattern 134 and the control gate electrode 136 integrated one by one like the first gate structure 140. The floating gate electrode 132 of the second gate structure 142 may be injected with charges to control the threshold voltage. The second gate structures 142 may have a smaller line width than that of the third gate structure 144. In an exemplary embodiment of the inventive concept, the second gate structure 142 may have the same line width as that of the first gate structure 140, e.g., the first line width d1. The channel regions under the second gate structures 142 may be doped with p-type impurities. The channel regions 135a of the second selecting transistors 106a connected in series may have a connected state. In addition, the channel regions 135b of the fourth selecting transistors 160b connected in series may have a connected state.

The third gate structures 144 may include the tunnel insulating layer 130, the floating gate electrode 132, the blocking dielectric layer pattern 134 and the control gate electrode 136 integrated one by one. The floating gate electrode 132 and the control gate electrode 136 may be connected to each other. The third gate structure 144 may have a second line width d2 greater than the first line width d1. The floating gate electrode 132 of the third gate structure 144 may not function as the charge storing layer.

In an exemplary embodiment of the inventive concept, the second selecting transistors 106a may be in an erased state. Accordingly, positive charges may be injected into the floating gate electrode 132 included in the second selecting transistors 106a. The fourth selecting transistor 106b may be in a programmed state. Accordingly, negative charges may be injected into the floating gate electrode 132 included in the fourth selecting transistor 106b.

The cell array in the present exemplary embodiment may be formed by patterning thin layers to form the plurality of the second and fourth selecting transistors 106a and 106b. Accordingly, the method of forming the cell array of the present exemplary embodiment may be the same as the method of forming the cell array described with reference to FIGS. 2A-11 except for the patterning process.

Figure 18:
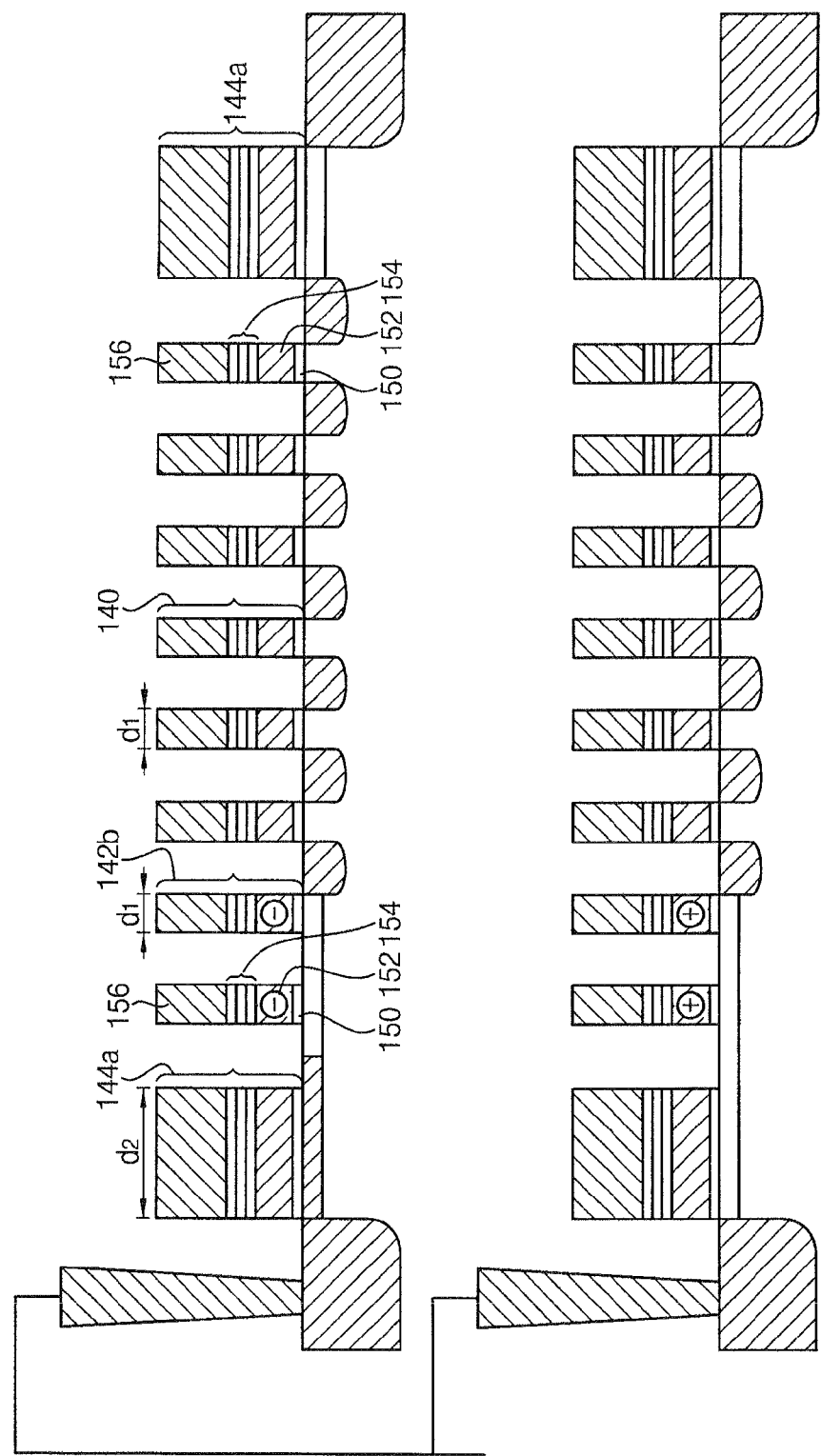
FIG. 18 is a cross-sectional view of the cell array in the NAND flash memory device illustrated in FIG. 15, according to an exemplary embodiment of the inventive concept.

FIG. 18 is a cross-sectional view of the cell array of the NAND flash memory device illustrated in FIG. 15, according to an exemplary embodiment of the inventive concept.

The structure illustrated in FIG. 18 may be substantially the same as the structure illustrated in FIG. 17 except that the charge storing layer may be used as the charge trapping layer pattern. Since the charge storing layer may be used as the charge trapping layer pattern, the first to third gate structures 140, 142b and 144a may include an integrated structure of a tunnel insulating layer 150, a charge trapping layer pattern 152, a blocking dielectric layer pattern 154 and a control gate electrode 156 integrated one by one.

Figure 19:
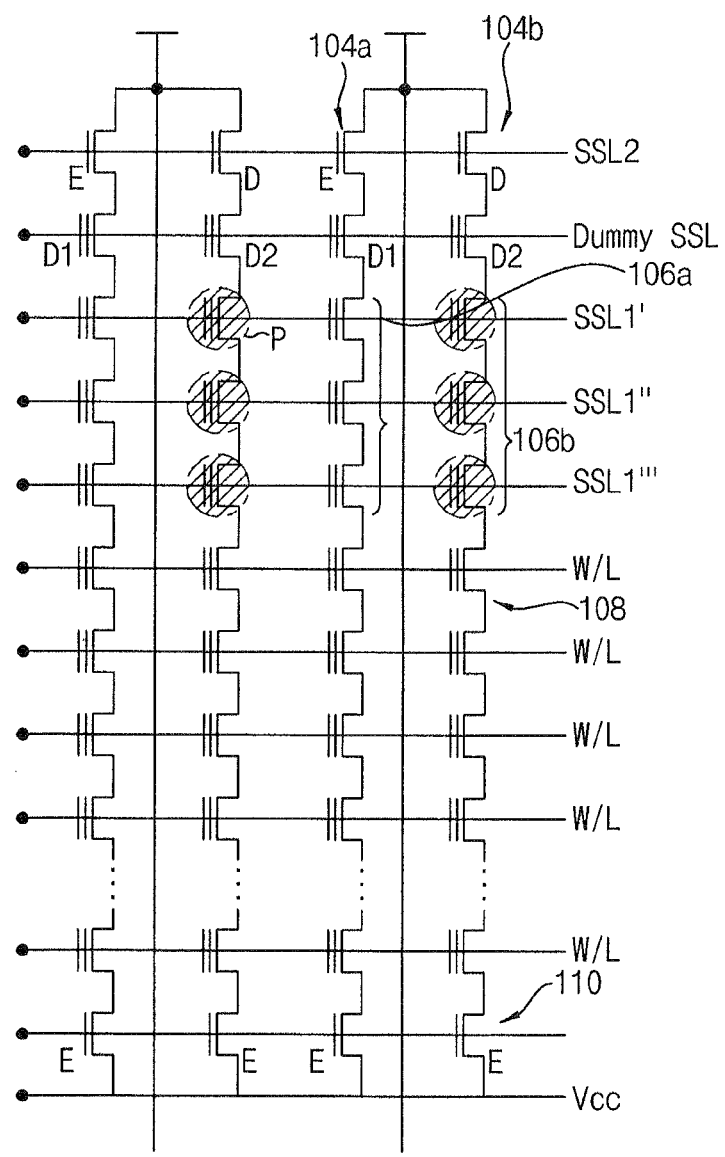
FIG. 19 is a circuit diagram illustrating a cell array of a NAND flash memory device in accordance with an exemplary embodiment of the inventive concept.
Figure 20:
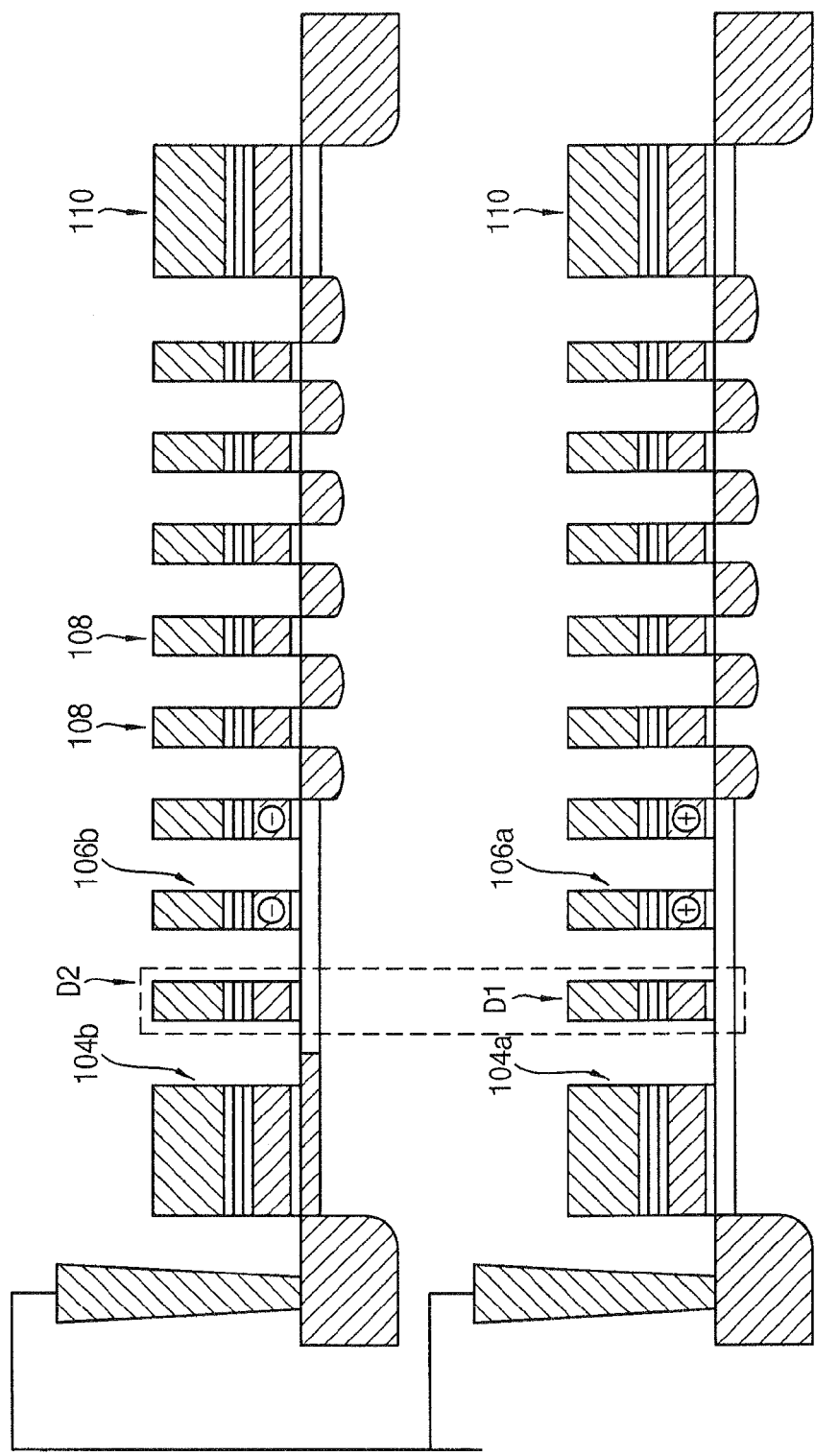
FIG. 20 is a cross-sectional view of the cell array of the NAND flash memory device in FIG. 19 in accordance with an exemplary embodiment of the inventive concept.

FIG. 19 is a circuit diagram of a cell array of a NAND flash memory device in accordance with an exemplary embodiment of the inventive concept. FIG. 20 is a cross-sectional view of the cell array of the NAND flash memory device in FIG. 19, according to an exemplary embodiment of the inventive concept.

The cell array in accordance with the present exemplary embodiment may be the same as that of the cell array of the NAND flash memory device illustrated in FIGS. 15-18 except for the addition of a dummy transistor.

Referring to FIGS. 19 and 20, dummy transistors D1 and D2 may be connected between the first group selecting transistors 106a and 106b and the second group selecting transistors 104a and 104b. The dummy transistors D1 and D2 may have the same channel type as the first group selecting transistors 106a and 106b.

Between the first and second selecting transistors 104a and 106a, a first dummy transistor D1 may be connected. Between the third and fourth selecting transistors 104b and 106b, a second dummy transistor D2 may be connected. The first and second dummy transistors D1 and D2 may be enhancement mode transistors. The first and second dummy transistors D1 and D2 may have the same gate length as the first group selecting transistors 106a and 106b.

The dummy transistors D1 and D2 may be pass transistors and may not have a switching function. The first and second dummy transistors D1 and D2 may function of increasing a distance between the first group selecting transistors 106a and 106b and the second group selecting transistors 104a and 104b. Accordingly, an operational defect generated by an inhibit operation of a selecting transistor adjacent to the second group selecting transistors 104a and 104b, wherein the defect is caused by the second group selecting transistors 104a and 104b, may be restrained.

The second selecting transistor 106a among the first group selecting transistors 106a and 106b may keep an erased state. Accordingly, the second selecting transistor 106a in the first group selecting transistors 106a and 106b may electrically function as a depletion mode transistor and may have a threshold voltage smaller than 0V. In addition, the fourth selecting transistors 106b may keep a programmed state and may electrically function as an enhancement mode transistor and may have a threshold voltage greater than 0V.

Since the programming or erasing operation may not be conducted with respect to the dummy transistors D1 and D2, the dummy transistors D1 and D2 may have a threshold voltage of an initial state. The threshold voltage of the initial state may be smaller than the threshold voltage of the programmed state and may be greater than the threshold voltage of the erased state.

Since the third and fourth selecting transistors 104b and 106b are the depletion mode transistor and the enhancement mode transistor, respectively, the impurities of the channel regions of these transistors may have different conductive types. When the separating distance of the third and fourth selecting transistors 104b and 106b is small, the impurities in the channel region of the depletion mode third selecting transistor 104b may thermally diffuse into the channel region of the fourth selecting transistor 106b. In this case, the threshold voltage of the fourth selecting transistor 106b may be changed. However, the distance between the third and fourth selecting transistors 104b and 106b may increase by disposing the second dummy transistor D2 between the third and fourth selecting transistors 104b and 106b in the present exemplary embodiment. Accordingly, the change of the threshold voltage due to the impurity diffusion may be prevented.

According to the above described embodiments, one dummy transistor may be formed in each of the cell strings. Alternatively, a plurality of dummy transistors may be connected in series between the first group selecting transistors 106a and 106b and the second group selecting transistors 104a and 104b in each of the cell strings. In this case, the separating distance between the first group selecting transistors 106a and 106b and the second group selecting transistors 104a and 104b may be increased even further.

In the cell array of the NAND flash memory device illustrated in FIGS. 19 and 20 an erasing operation may be conducted with respect to the second selecting transistor 106a and positive charges may be stored in its charge storing layer pattern. Since a programming operation may be conducted with respect to the fourth selecting transistor 106b, negative charges may be stored in its charge storing layer pattern. However, the erasing and programming operations may not be conducted with respect to the first and second dummy transistors D1 and D2.

Hereinafter, a method of controlling the threshold voltage of each of the selecting transistors in the NAND flash memory device in the present exemplary embodiment will be described in detail.

First, an erasing operation may be conducted with respect to the second and fourth selecting transistors 106a and 106b. The erasing operation may not be conducted or restrained with respect to the first and second dummy transistors D1 and D2 so that an inhibit operation with respect to selecting transistors adjacent to the first and second dummy transistors D1 and D2 may be restrained. To conduct the erasing operation, electric signals illustrated in Table 8 may be applied.

TABLE 8

| Bit line | First gate line | Second gate line | Dummy gate line | Word line | Ground selecting tr | p-well | Common source line |
|---|---|---|---|---|---|---|---|
| Floating | GND | Floating | Vrelax | GND | Floating | Vers | Floating |

Through application of an erasing restraining voltage (Vrelax) to a dummy gate line as shown in Table 8, the erasing operation with respect to the dummy transistors D1 and D2 may be restrained. The erasing restraining voltage (Vrelax) may be set to a value higher than the threshold voltage of the depletion mode transistor and lower than an erasing voltage (Vers) applied to the p-well to erase the selecting transistors.

Then, a programming operation may be conducted subsequently with respect to each of the fourth selecting transistors 106b.

To conduct the programming operation of the fourth selecting transistor 106b, electric signals illustrated in Table 9 may be applied.

TABLE 9

| Bit line | First gate line (selected) | First gate line (non-selected) | Second gate line | Dummy gate line | Word line | Ground selecting tr | Common source line |
|---|---|---|---|---|---|---|---|
| GND | Vpgm | Vpass | GND | Vcc | Vpass | GND | Vcc |

Through application of a power voltage to a dummy gate line Dummy SSL of the first and second dummy transistors D1 and D2, the first and second dummy transistors D1 and D2 may not be programmed but may keep an initial state. Further, the programming operation may be conducted subsequently with respect to the fourth selecting transistors 106b.

While conducting the programming operation, the verifying operation of the threshold voltage may be continuously performed.

The cross-sectional view and the manufacturing method of the cell array of the NAND flash memory device illustrated in FIGS. 19 and 20 may be substantially the same as those explained with reference to FIGS. 15-18 except for the addition of the dummy transistors D1 and D2.

In FIG. 20, a charge storing layer may be illustrated as a charge trapping layer pattern included in the cell array. However, the charge storing layer may be formed as a floating gate electrode.

Figure 21:
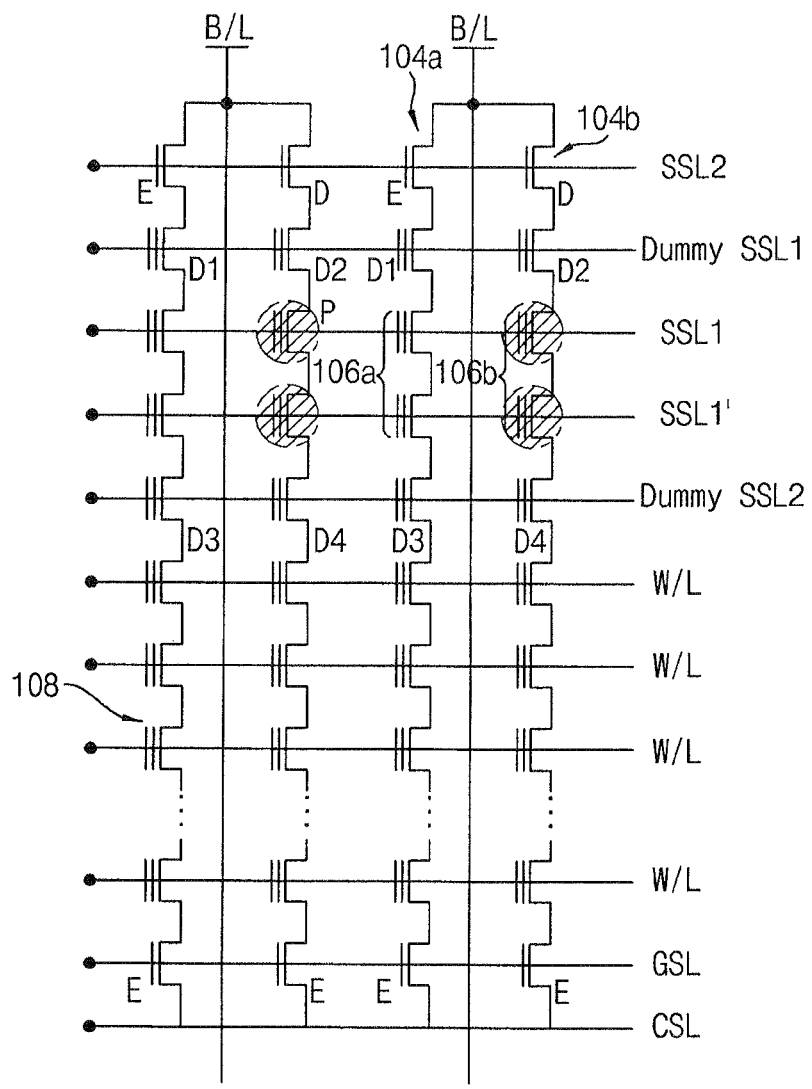
FIG. 21 is a circuit diagram of a cell array of a NAND flash memory device in accordance with an exemplary embodiment of the inventive concept.
Figure 22:
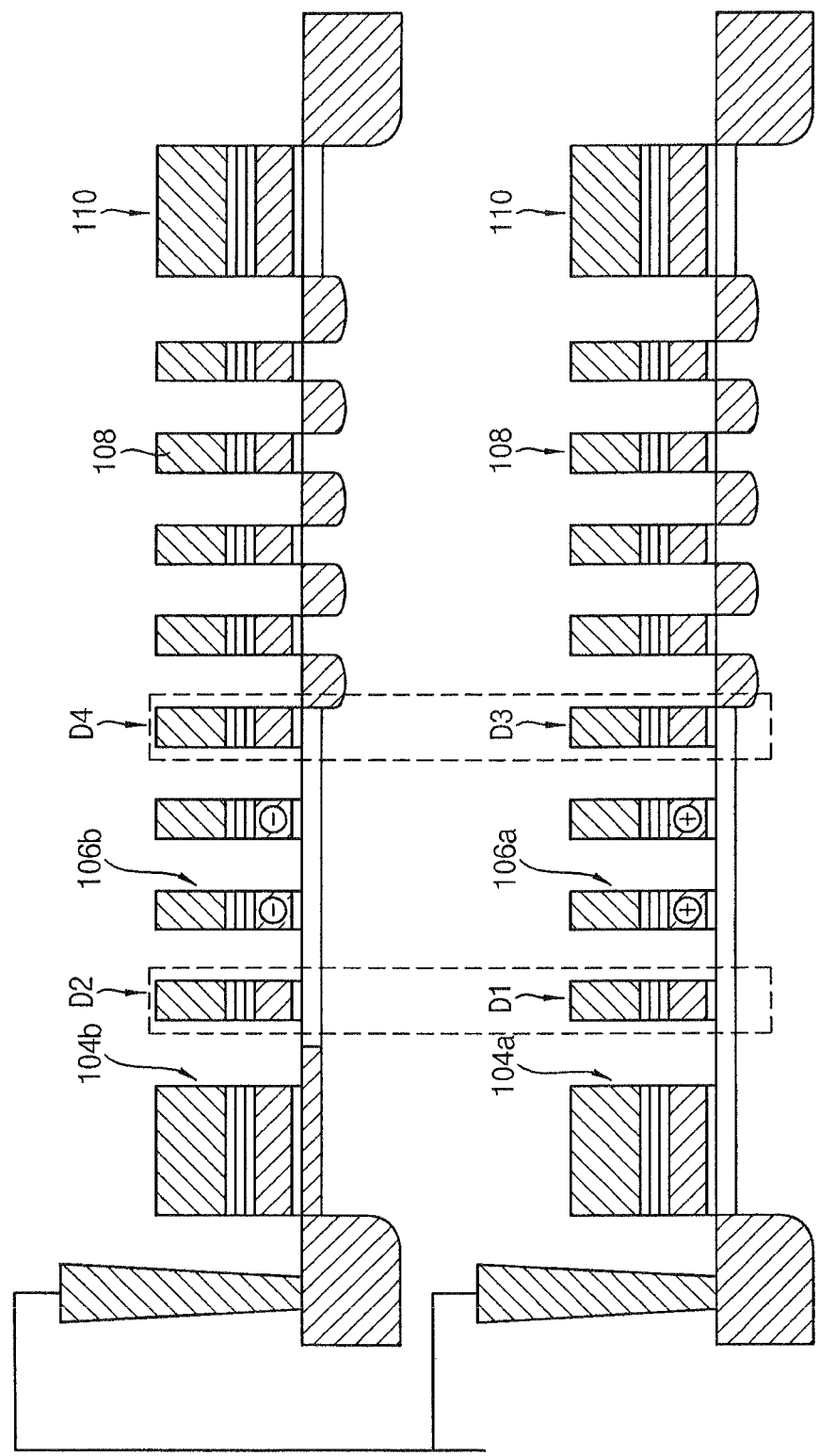
FIG. 22 is a cross-sectional view of the cell array of the NAND flash memory device in FIG. 21 in accordance with an exemplary embodiment of the inventive concept.

FIG. 21 is a circuit diagram of a cell array of a NAND flash memory device in accordance with an exemplary embodiment of the inventive concept. FIG. 22 is a cross-sectional view of the cell array of the NAND flash memory device in FIG. 21, in accordance with an exemplary embodiment of the inventive concept.

The NAND flash memory device in accordance with the present exemplary embodiment may be substantially the same as the NAND flash memory device in FIGS. 19 and 20 except that dummy transistors may be additionally included in each of the cell strings.

Referring to FIGS. 21 and 22, first group dummy transistors D1 and D2 may be disposed between the first group selecting transistors 106a and 106b and the second group selecting transistors 104a and 104b. In addition, second group dummy transistors D3 and D4 may be disposed between the first group selecting transistors 106a and 106b and the cell transistors 108.

The first group dummy transistors may include a first dummy transistor D1 between the first and second selecting transistors 104a and 106a and a second dummy transistor D2 between the third and fourth selecting transistors 104b and 106b. The first and second dummy transistors D1 and D2 may be enhancement mode transistors.

The second group dummy transistors may include a third dummy transistor D3 between the second selecting transistor 106a and the cell transistors 108 and a fourth dummy transistor D4 between the fourth selecting transistor 106b and the cell transistors 108. The third and fourth dummy transistors D3 and D4 may be enhancement mode transistors.

The second group dummy transistors D3 and D4 may be provided to restrain the change of the threshold voltage of a selecting transistor adjacent to the cell transistor 108 due to an inhibit operation while operating the cell transistor 108.

The second selecting transistors 106a may be in an erased state and may have a threshold voltage smaller than 0V. The fourth selecting transistors 106b may be in a programmed state and may have a threshold voltage higher than 0V.

The first to fourth dummy transistors D1~D4 in the first and second group dummy transistors may not exhibit a switching function but may be provided as pass transistors. The first and second dummy transistors D1 and D2 in the first group dummy transistors and the third and fourth dummy transistors D3 and D4 in the second group dummy transistors may respectively have a first and a second initial threshold voltage. The first and second initial threshold voltages may be smaller than the threshold voltage of the programmed selecting transistor and greater than the threshold voltage of the erased selecting transistor. The first and second initial threshold voltages may be the same as or different from each other.

According to an exemplary embodiment of the inventive concept, the first group dummy transistors and the second group dummy transistors may each include more than two dummy transistors even though not illustrated.

According to an exemplary embodiment of the inventive concept, the first group dummy transistors may not be provided but only the second group dummy transistors may be provided.

In the cell array illustrated in FIGS. 21 and 22, an erasing operation may be conducted with respect to the second selecting transistor 106a and positive charges may be stored in the charge storing layer pattern of the second selecting transistor 106a. A programming operation may be conducted with respect to the fourth selecting transistor 106b and negative charges may be stored in the charge storing layer pattern of the fourth selecting transistor 106b. In addition, the first to fourth dummy transistors D1~D4 in the first and second group dummy transistors may be expected to restrain the erasing and programming operations while restraining an inhibit operation with respect to the selecting transistor adjacent to the dummy transistor.

A method of controlling the threshold voltage of the selecting transistors may be substantially the same as the controlling method described with reference to FIGS. 19 and 20. In addition, the same voltage signals may be applied to the first and second group dummy transistors as the voltage signals applied to the dummy transistors in FIGS. 19 and 20.

As described above, the second group dummy transistors D3 and D4 may be provided to restrain the change of the threshold voltage of the selecting transistor adjacent to the cell transistor 108 by an inhibit operation while operating the cell transistor 108.

Particularly, the threshold voltage level of the selecting transistor adjacent to the cell transistor 108 may be decreased while conducting the erasing operation with respect to the cell transistor 108. In other words, the threshold voltage of the selecting transistor may decrease even when the threshold voltage is to be kept at the programmed state. When the programming operation is conducted with respect to the cell transistor 108, the threshold voltage level of the selecting transistor adjacent to the cell transistor 108 may be increased. In other words, the threshold voltage of the selecting transistor adjacent to the cell transistor 108 may increase even when the threshold voltage is to be kept in the erased state.

In this case, a Vrelax voltage may be applied to a gate line Dummy SSL2 of the second group dummy transistors D3 and D4 while conducting the erasing operation with respect to the cell transistor 108. The Vrelax voltage may be higher than 0V and lower than the erasing voltage applied to the p-well. The decrease of the threshold voltage of the first group selecting transistors 106a and 106b may be prevented by applying a certain voltage to the gate line Dummy SSL2 of the second group dummy transistors D3 and D4 while conducting the erasing operation of the cell transistor 108.

A power voltage (Vcc) smaller than the programming voltage may be applied to the gate line Dummy SSL2 of the second group dummy transistors D3 and D4 while conducting the programming operation with respect to the cell transistor 108. Accordingly, the increase of the threshold voltage of the first group selecting transistors 106a and 106b may be prevented.

The cross-sectional view and manufacturing method of the cell array of the NAND flash memory device illustrated in FIGS. 21 and 22 may be substantially the same as those of the cell array shown in FIGS. 15-18 except for the addition of the dummy transistors D1 to D4.

In FIG. 22, a charge storing layer may be illustrated by a charge trapping layer pattern included in the cell array. The charge storing layer may be formed as a floating gate electrode.

Figure 23:
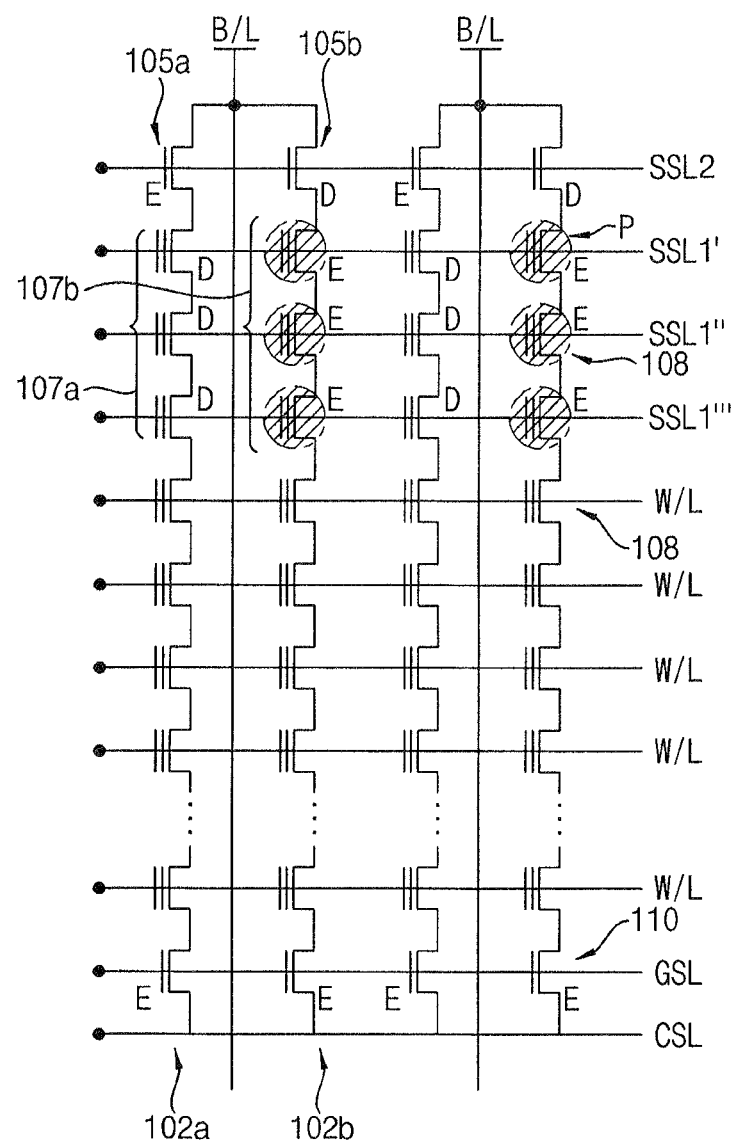
FIG. 23 is a circuit diagram of a cell array of a NAND flash memory device in accordance with an exemplary embodiment of the inventive concept.
Figure 24:
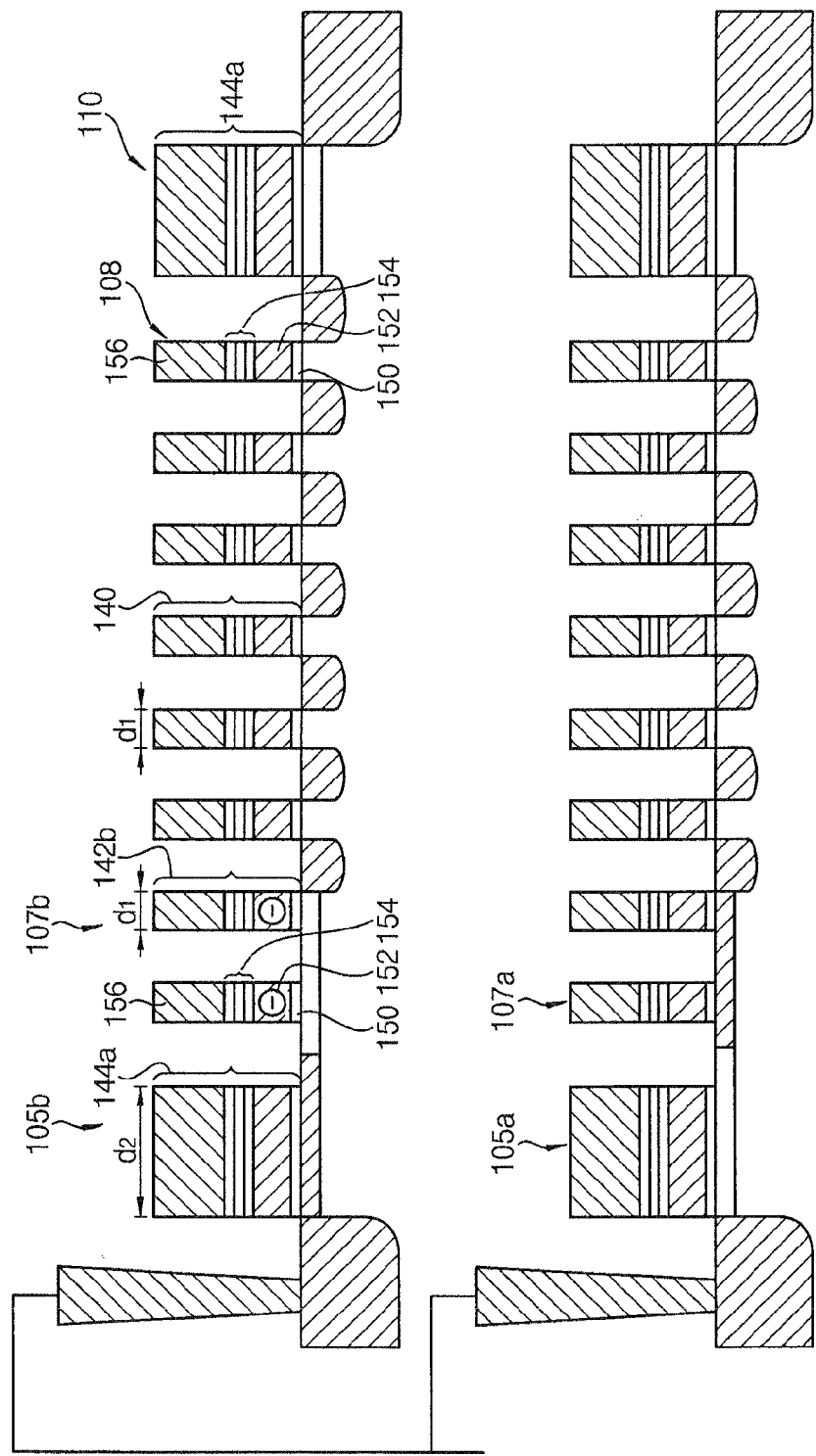
FIG. 24 is a cross-sectional view of the cell array of the NAND flash memory device in FIG. 23, in accordance with an exemplary embodiment of the inventive concept.

FIG. 23 is a circuit diagram of a cell array of a NAND flash memory device in accordance with an exemplary embodiment of the inventive concept. FIG. 24 is a cross-sectional view of the cell array of the NAND flash memory device in FIG. 23 in accordance with an exemplary embodiment of the inventive concept.

Referring to FIGS. 23 and 24, a first cell string 102a and a second cell string 102b connected to a common bit line B/L may be provided. First and second selecting transistors 105a and 107a may be connected in series in the first cell string 102a and third and fourth selecting transistors 105b and 107b may be connected in series in the second cell string 102b. The first to fourth selecting transistors 105a, 107a, 105b and 107b may be provided as a depletion mode transistor or an enhancement mode transistor according to the conductive type used for the doped channel. In each of the strings, transistors having different conductive type may be connected in series.

In the present exemplary embodiment, the first selecting transistor 105a may be the enhancement mode transistor E and the second selecting transistor 107a may be the depletion mode transistor D. The third selecting transistor 105b may be the depletion mode transistor D and the fourth selecting transistor 107b may be the enhancement mode transistor E. As described above, the first and third selecting transistors 105a and 105b adjacent to the common bit line B/L may be second group transistors and the second and fourth selecting transistors 107a and 107b adjacent to a cell transistor 108 may be first group selecting transistors.

The first group selecting transistors may include a plurality of transistors connected in series and having a smaller line width d1 than a line width d2 of the second group selecting transistors as illustrated in FIG. 24.

The channel region of the enhancement mode first and fourth selecting transistors 105a and 107b may be doped with impurities having a higher concentration than the channel region of the cell transistor 108.

The fourth selecting transistor 107b, which may be the enhancement mode transistor E among the first group selecting transistors may have a target threshold voltage by programming. In other words, the fourth selecting transistor 107b may be in a programmed state P. However, the threshold voltage of the first selecting transistor 105a, which may be the enhancement mode transistor E among the second group selecting transistors may be determined by the concentration of impurities doped into its channel region.

Alternatively, the fourth transistor 107b, which may be the enhancement mode transistor E among the first group selecting transistors may have a target threshold voltage by programming. In other words, the fourth selecting transistor 107b may be in the programmed state P. The first selecting transistor 105a, which may be the enhancement mode transistor E of the second group selecting transistors may also have the target threshold voltage by programming.

As described above, the threshold voltage of the fourth selecting transistor 107b may be controlled by programming.

Figure 25:
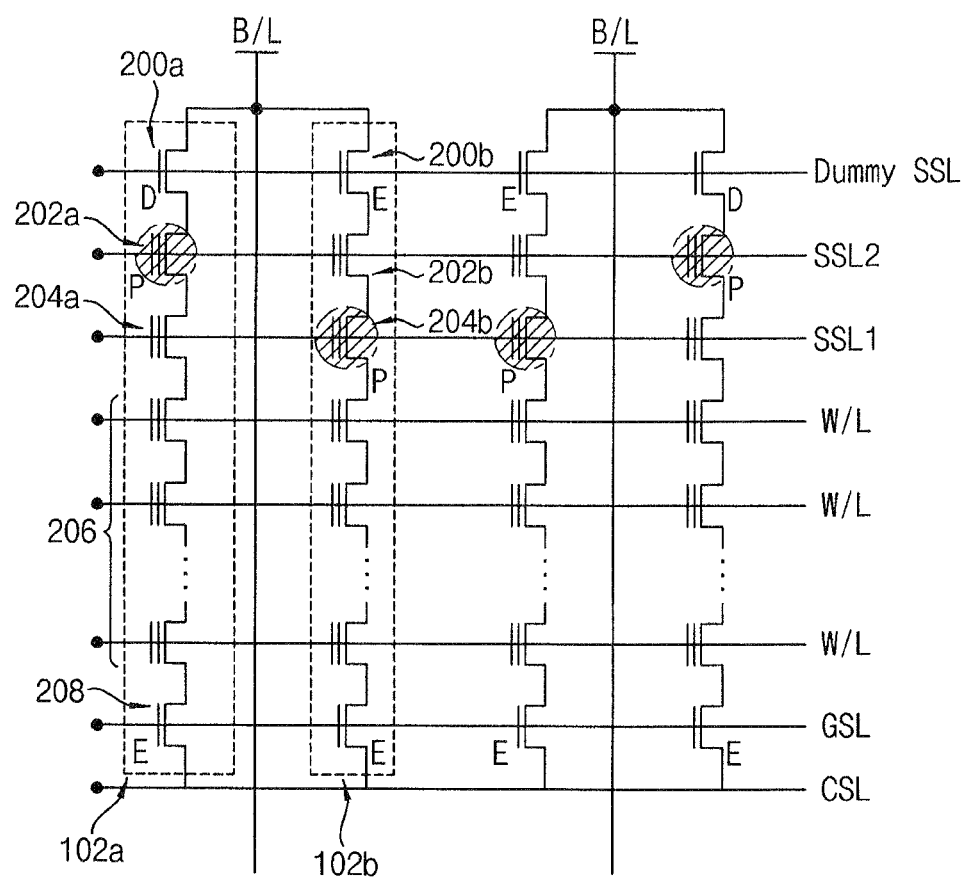
FIG. 25 is a circuit diagram of a cell array of a NAND flash memory device in accordance with an exemplary embodiment of the inventive concept.

FIG. 25 is a circuit diagram of a cell array of a NAND flash memory device in accordance with an exemplary embodiment of the inventive concept.

Referring to FIG. 25, the memory cell array may include a first cell string 102a, a second cell string 102b adjacent to the first cell string 102a, a common bit line B/L commonly connected to end portions of the first and second cell strings 102a and 102b and a common source line CSL connected to the other end portions of the first and second cell strings 102a and 102b. The memory cell array may include repeatedly disposed units of one common bit line B/L and two cell strings 102a and 102b connected to the common bit line B/L. The first and second cell strings 102a and 102b are arranged in a first direction.

Particularly, the first cell string 102a may include a first dummy selecting transistor 200a, a first selecting transistor 202a, a second selecting transistor 204a, cell transistors 206 and a ground selecting transistor 208.

The second cell string 102b may include a second dummy selecting transistor 200b, a third selecting transistor 202b, a fourth selecting transistor 204b, cell transistors 206 and a ground selecting transistor 208.

One side of the impurity regions of each of the ground selecting transistors 208 included in the first and second cell strings 102a and 102b may be connected to the common source line CSL.

As illustrated in FIG. 25, two of the first cell strings 102a and two of the second cell strings 102b may be alternately disposed.

The common bit line B/L may be connected to the first and second dummy selecting transistors 200a and 200b included in the first and second cell strings 102a and 102b adjacent to each other in a direction of word lines W/L.

The gates of the first and second dummy selecting transistors 200a and 200b may be connected to a dummy gate line Dummy SSL extending in a second direction perpendicular to the first direction. The gates of the first and third selecting transistors 202a and 202b may be connected to a second gate line SSL2 extending in the second direction. The gates of the second and fourth selecting transistors 204a and 204b may be connected to a first gate line SSL1 extending in the second direction.

Since the first and second dummy selecting transistors 200a and 200b may have different threshold voltages, the first to fourth selecting transistors 202a, 204a, 202b and 204b connected in series may be individually selected and a programming operation and an erasing operation may be conducted. The first and second dummy selecting transistors 200a and 200b may have different threshold voltages in accordance with the conductive type of the impurities doped into their channel regions. One of the first and second dummy selecting transistors 200a and 200b may be provided as an enhancement mode MOS transistor E and the other may be provided as a depletion mode MOS transistor D.

In the present exemplary embodiment, the first dummy selecting transistor 200a may be provided as the depletion mode MOS transistor D and the second dummy selecting transistor 200b may be provided as the enhancement mode MOS transistor E.

The enhancement mode MOS transistor E may refer to a transistor having the enhancement mode and including a channel region having a different conductive type from its source/drain regions. The depletion mode MOS transistor D may refer to a transistor having the depletion mode and including a channel region having the same conductive type as its source/drain regions. Particularly, the channel region of the enhancement mode MOS transistor E may be doped with p-type impurities and the channel region of the depletion mode MOS transistor D may be doped with n-type impurities.

The enhancement mode MOS transistor E may be a transistor having a threshold voltage greater than a reference voltage. The depletion mode MOS transistor D may be a transistor having a threshold voltage smaller than the reference voltage. Particularly, the enhancement mode MOS transistor E may have the threshold voltage greater than 0V and the depletion mode MOS transistor D may have the threshold voltage smaller than 0V.

As described above, since the first and second dummy selecting transistors 200a and 200b may be respectively provided as the depletion mode MOS transistor D and the enhancement mode MOS transistor E, at least one of the dummy selecting transistors among the first and second selecting transistors 200a and 200b may be selectively turned on depending on a voltage applied to the dummy gate line Dummy SSL. By using the first and second dummy selecting transistors 200a and 200b, a programming operation or an erasing operation may be selectively conducted with respect to the first to fourth selecting transistors 202a, 204a, 202b and 204b.

The first to fourth selecting transistors 202a, 204a, 202b and 204b may be constituted to individually select a cell string connected to one common bit line B/L and then electrically operate the cell transistors 206 of that string.

Accordingly, the first and second selecting transistors 202a and 204a may have different threshold voltages from each other and the third and fourth selecting transistors 202b and 204b may have different threshold voltages from each other. In addition, the first and third selecting transistors 202a and 202b connected to the gate line SSL2 and the second and fourth selecting transistors 204a and 204b connected to the gate line SSL1 may have different threshold voltages from each other.

The threshold voltages of the first to fourth selecting transistors 202a, 204a, 202b and 204b may be controlled by an electric operation and the controlled threshold voltage may be kept continuously. The threshold voltages of the first to fourth selecting transistors 202a, 204a, 202b and 204b may not be controlled by the conductive type of the impurities in their channel regions. Accordingly, the channel regions of the first to fourth selecting transistors 202a, 204a, 202b and 204b may be doped by impurities having the same conductivity.

Particularly, all of the first to fourth selecting transistors 202a, 204a, 202b and 204b may be enhancement mode transistors. Alternatively, all of the first to fourth selecting transistors 202a, 204a, 202b and 204b may be depletion mode transistors. Hereinafter, an explanation will be given when all of the first to fourth selecting transistors 202a, 204a, 202b and 204b are enhancement mode transistors.

The first to fourth selecting transistors 202a, 204a, 202b and 204b may have the same integrated structure as that of the cell transistors 206. The first to fourth selecting transistors 202a, 204a, 202b and 204b may be a transistor including a gate structure obtained by integrating a gate insulation layer, a charge storing layer pattern and a gate electrode one by one.

The first to fourth selecting transistors 202a, 204a, 202b and 204b may have the same integrated structure. However, since different charges may be injected into the charge storing layer pattern in the gate structure, the first to fourth selecting transistors 202a, 204a, 202b and 204b may have different electric characteristics from each other.

Since the first selecting transistor 202a directly connected to the first dummy selecting transistor 200a, which may be the depletion mode MOS transistor D, may have a relatively high threshold voltage, the first selecting transistor 202a may keep a programmed state P. The second selecting transistor 204a connected to the first selecting transistor 202a in series may have a relatively low threshold voltage, and so the second selecting transistor 204a may keep an erased state.

Since the third selecting transistor 202b directly connected to the second dummy selecting transistor 200b, which may be the enhancement mode MOS transistor E, may have a relatively low threshold voltage, the third selecting transistor 202b may keep an erased state. The fourth selecting transistor 204b connected to the third selecting transistor 202b in series may have a relatively high threshold voltage, and so the third selecting transistor 202b may keep a programmed state P.

Particularly, the first and fourth selecting transistors 202a and 204b having the programmed state may have a threshold voltage greater than 0V. The second and third selecting transistors 204a and 202b having the erased state may have a threshold voltage smaller than 0V.

As described above, the first to fourth selecting transistors 202a, 204a, 202b and 204b having different threshold voltages by an electric operation may be provided so that only one cell string among the first and second cell strings 102a and 102b connected to one common bit line B/L may be turned on.

The ground selecting transistors 208 may include physical enhancement mode MOS transistors. In addition, the ground selecting transistors 208 may have the same integrated structure as the dummy selecting transistors 200a and 200b.

As described above, the first to fourth selecting transistors 202a, 204a, 202b and 204b connected to one common bit line B/L may have the same conductive type impurity doped into their channel regions. Accordingly, a process for forming the channel regions of the first to fourth selecting transistors 202a, 204a, 202b and 204b may be simplified. In addition, a mixed injection of ions that occurs while conducting an ion implanting process may be prevented and an operation defect of the NAND flash memory device may be decreased.

The circuits of the cell array in FIG. 25 may be formed in diverse shapes according to a process design on a substrate. Hereinafter, an exemplary embodiment of the cell array of the NAND flash memory device illustrated in FIG. 25 is explained.

Figure 26:
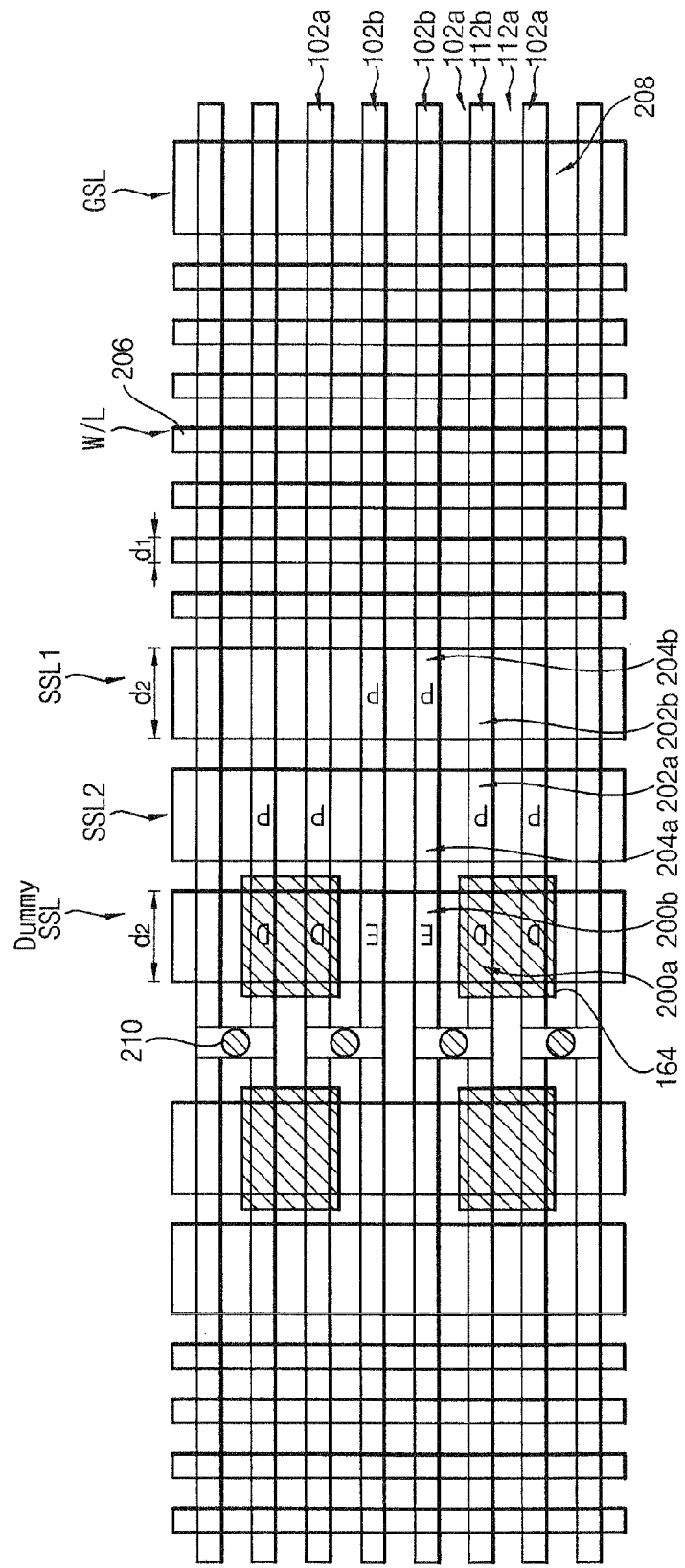
FIG. 26 is a plan view of the cell array of the NAND flash memory device illustrated in FIG. 25, according to an exemplary embodiment of the inventive concept.

FIG. 26 is a plan view of the cell array of the NAND flash memory device illustrated in FIG. 25, according to an exemplary embodiment of the inventive concept.

Referring to FIG. 26, a device isolating layer pattern 112a may be disposed on a substrate. The device isolating layer pattern 112a may have a line shape extending in a first direction. The regions between the device isolating layer patterns 112a may be an active region 112b.

The channel region of the first dummy selecting transistor 200a in the active region 112b may be lightly doped with n-type impurities. The channel regions of the first to fourth selecting transistors 202a, 204a, 202b and 204b and the ground selecting transistor 208 may be doped with p-type impurities.

On the substrate, a first gate structure W/L for the cell transistor 206, second gate structures SSL1 and SSL2 for the first to fourth selecting transistors 202a, 204a, 202b and 204b and third gate structures Dummy SSL and GSL for the dummy selecting transistors 200a and 200b and the ground selecting transistor 208 may be provided.

The first gate structure W/L may have a first line width d1. The second gate structures SSL1 and SSL2 and the third gate structures Dummy SSL and GSL may have a second line width d2 greater than the first line width d1.

The first to third gate structures SSL1, SSL2, Dummy SSL and GSL may have an integrated structure of a tunnel insulating layer, a charge storing layer pattern, a blocking dielectric layer pattern and a control gate electrode one by one.

A bit line contact 210 for electrically connecting impurity regions of two dummy selecting transistors 200a and 200b may be provided. A bit line (not illustrated) connected to the bit line contact 210 and extending in an extending direction of the active region 112b may be provided.

A common source line (not illustrated) connected to one side portion of the impurity regions of the ground selecting transistor 208 may be provided.

Hereinafter, a method of controlling threshold voltages of the first to fourth selecting transistors 202a, 204a, 202b and 204b in the NAND flash memory device illustrated in FIG. 25 will be explained.

Figure 27A:
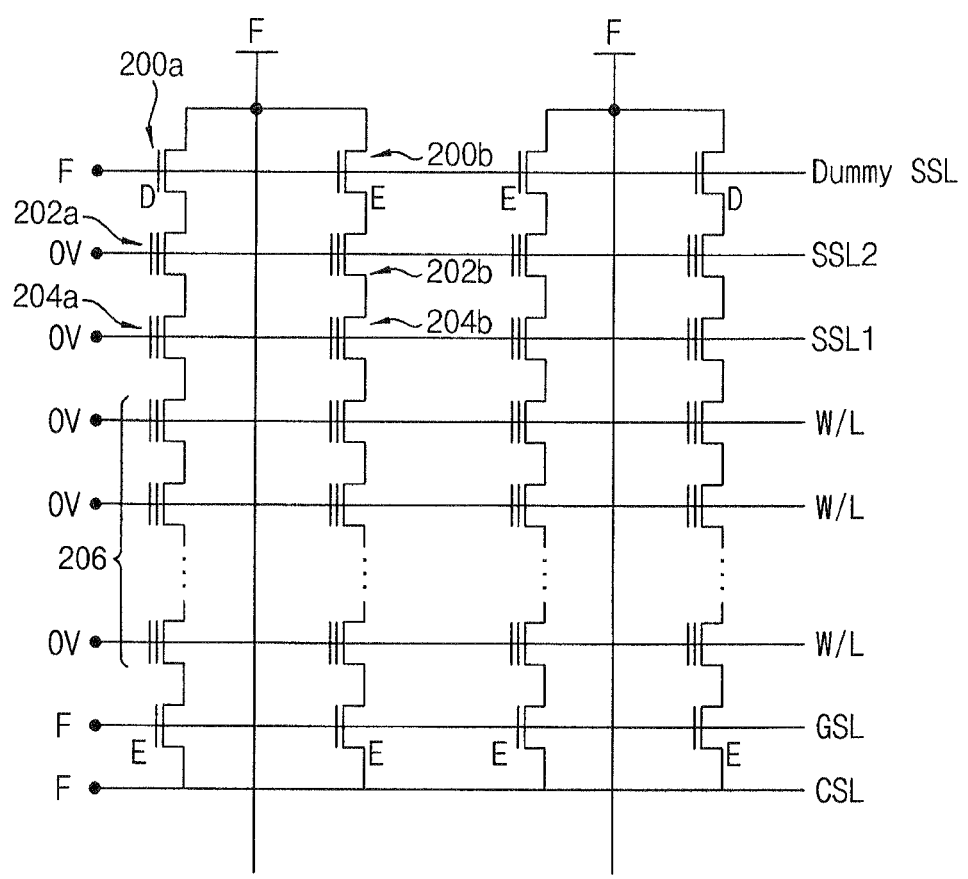
FIGS. 27A to 27C are circuit diagrams for explaining an operation of controlling threshold voltages of transistors included in the NAND flash memory device illustrated in FIG. 25, according to an exemplary embodiment of the inventive concept.
Figure 27B:
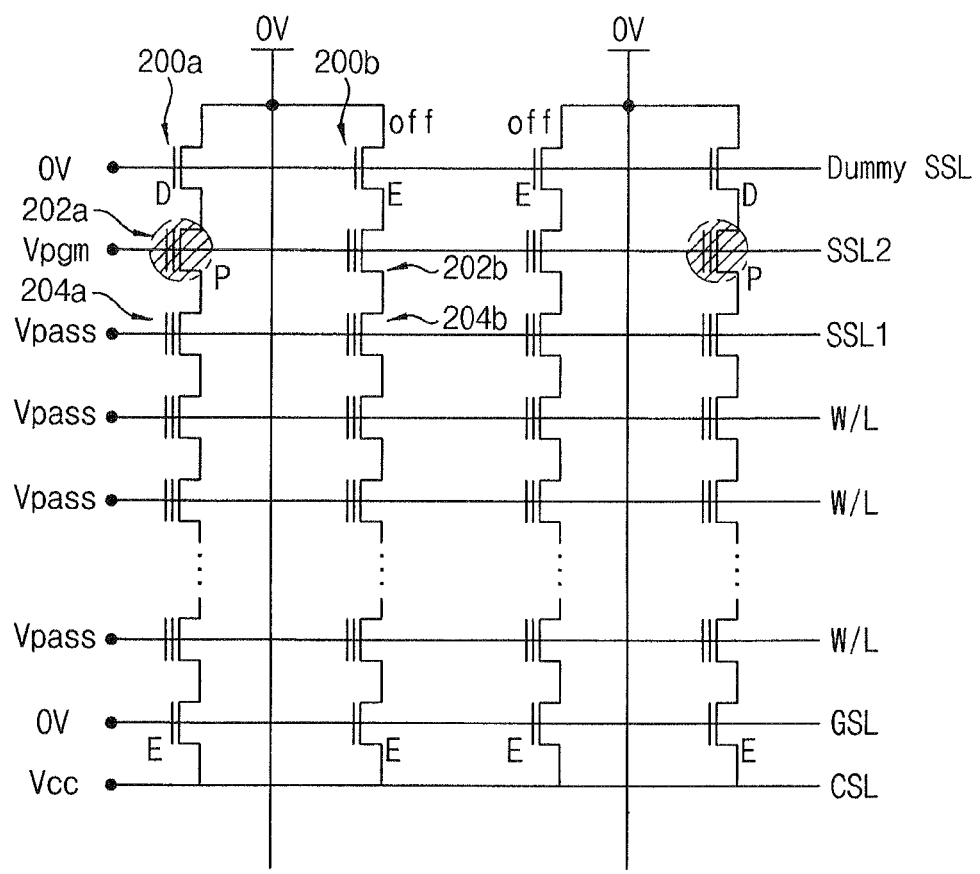
Figure 27C:
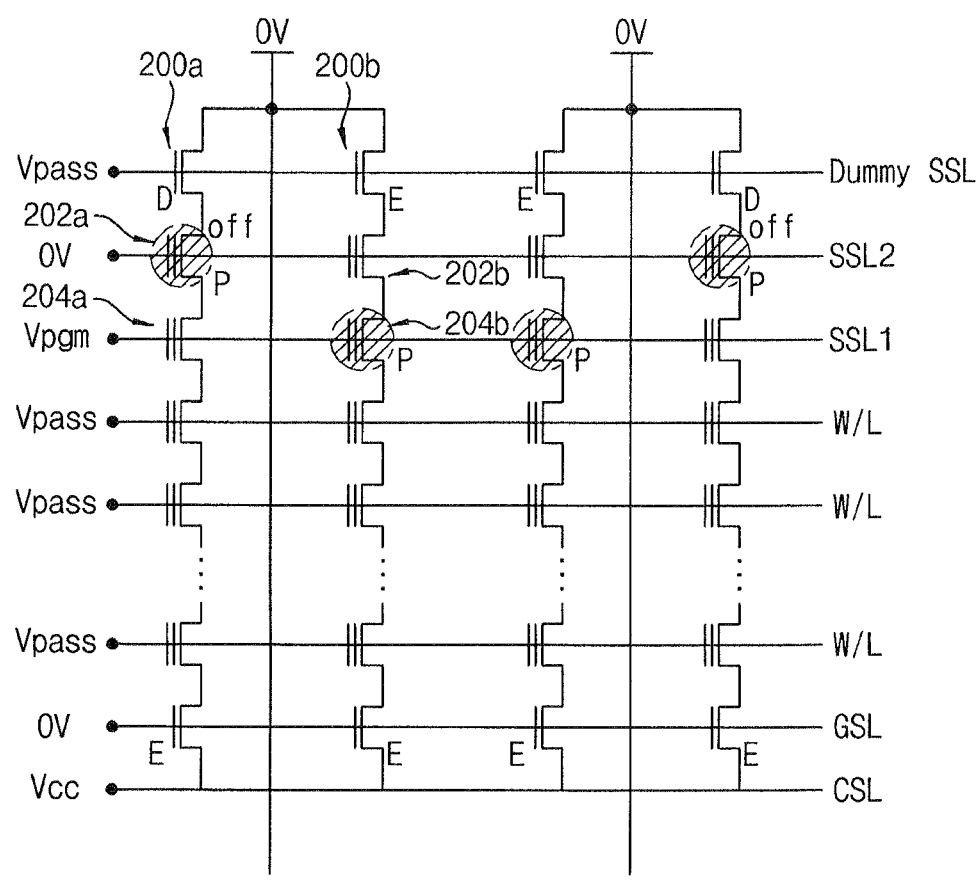

FIGS. 27A to 27C are circuit diagrams for explaining an operation of controlling the threshold voltages of the transistors included in the NAND flash memory device illustrated in FIG. 25, according to an exemplary embodiment of the inventive concept.

To control the threshold voltage of the NAND flash memory device illustrated in FIG. 25, an erasing operation may be conducted with respect to the first to fourth selecting transistors 202a, 204a, 202b and 204b. Then, selective programming operations may be conducted with respect to the first and fourth selecting transistors 202a and 204b.

FIG. 27A illustrates an erasing operation with respect to the first to fourth selecting transistors 202a, 204a, 202b and 204b. To conduct the erasing operation, electric signals illustrated in Table 10 may be applied.

TABLE 10

| Bit line | Dummy gate line | First gate line | Second gate line | Word line | P-well | GSL |
|---|---|---|---|---|---|---|
| Floating | Floating | GND | GND | GND | Vers | Floating |

Through application of the conditions illustrated in Table 10, the erasing operation with respect to the first to fourth selecting transistors 202a, 204a, 202b and 204b and the cell transistor 206 may be conducted.

Then, a programming operation may be conducted with respect to the first selecting transistor 202a by applying electric signals as illustrated in Table 11.

FIG. 27B illustrates a programming operation with respect to the first selecting transistors 202a.

TABLE 11

| Bit line | Dummy gate line | First gate line | Second gate line | Word line | GSL | Common source line |
|---|---|---|---|---|---|---|
| GND | GND | Vpass | Vpgm | Vpass | GND | Vcc |

Through application of the conditions illustrated in Table 11, the second dummy selecting transistor 200b may be turned off and a programming operation may not be conducted with respect to the third and fourth selecting transistors 202b and 204b. In this case, the first dummy selecting transistor 200a may be turned on and the programming operation may be conducted with respect to the first selecting transistor 202a. Accordingly, the threshold voltage of the first selecting transistor 202a may be greater than 0V.

While conducting the programming operation, a verifying operation of the threshold voltage may be continuously conducted.

Then, a programming operation with respect to the fourth selecting transistor 204b may be conducted by applying electric signals illustrated in Table 12.

FIG. 27C illustrates a programming operation with respect to the fourth selecting transistors 204b.

TABLE 12

| Bit line | Dummy gate line | First gate line | Second gate line | Word line | GSL | Common source line |
|---|---|---|---|---|---|---|
| GND | Vpass | Vpgm | GND | Vpass | GND | Vcc |

Through application of the conditions illustrated in Table 12, the first and second dummy selecting transistors 200a and 200b may be turned on. In addition, the first selecting transistor 202a may be turned off and the third selecting transistor 202b may be turned on.

Since the first selecting transistor 202a may be turned off, the programming operation may not be conducted with respect to the second selecting transistor 204a. Since the third selecting transistor 202b may be turned on, the programming operation with respect to the fourth selecting transistor 204b may be conducted. Accordingly, the threshold voltage of the fourth selecting transistor 204b may be greater than 0V.

While conducting the programming operation, the verifying operation of the threshold voltage may be continuously conducted.

As described above, the threshold voltages of the first to fourth selecting transistors 202a, 204a, 202b and 204b may be selectively controlled by an electric operation by selecting one of the cell strings using the dummy selecting transistor 200a or 200b. Accordingly, the threshold voltage of the first to fourth selecting transistors 202a, 204a, 202b and 204b may be controlled to have a target threshold voltage and threshold voltage dispersion may be improved. In addition, since the doping of a concentration in the channel regions to control the threshold voltage may not be required, a manufacturing process may be simplified and the generation of a leakage current may be decreased.

Figure 28:
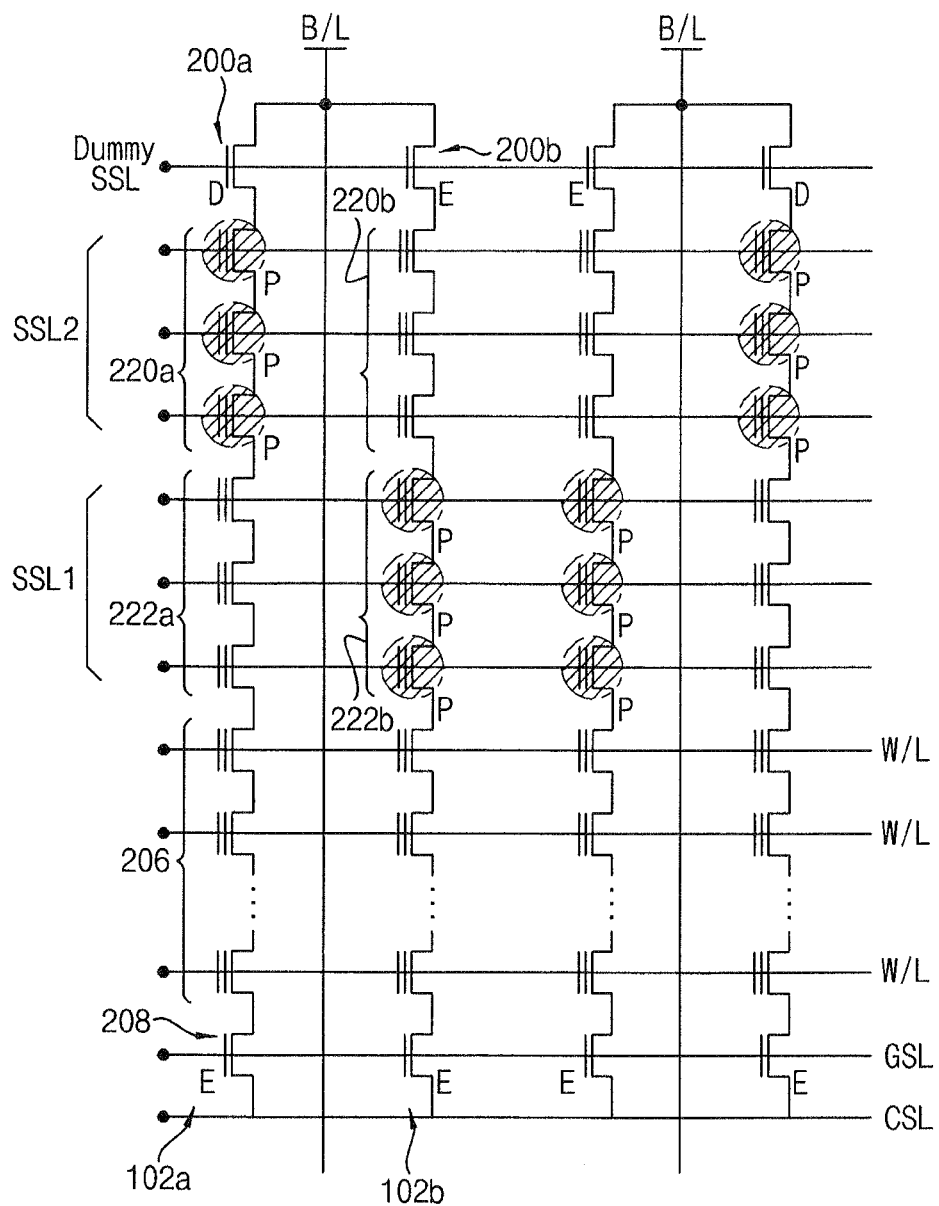
FIG. 28 is a circuit diagram of a cell array of a NAND flash memory device in accordance with an exemplary embodiment of the inventive concept.

FIG. 28 is a circuit diagram of a cell array of a NAND flash memory device in accordance with an exemplary embodiment of the inventive concept.

The NAND flash memory device in accordance with the present exemplary embodiment may be substantially the same as the NAND flash memory device described with reference to FIGS. 25-27C except for the constitution of the first to fourth selecting transistors.

Referring to FIG. 28, first to fourth selecting transistor groups having a plurality of transistors connected in series may be disposed in first and second cell strings 102a and 102b connected to a common bit line B/L.

The first cell string 102a may include a first dummy selecting transistor 200a, a first selecting transistor group 220a, a second selecting transistor group 222a, cell transistors 206 and a ground selecting transistor 208.

The second cell string 102b may include a second dummy selecting transistor 200b, a third selecting transistor group 220b, a fourth selecting transistor group 222b, cell transistors 206 and a ground selecting transistor 208.

The first and second dummy selecting transistors 200a and 200b may be respectively provided as a depletion mode MOS transistor D and an enhancement mode MOS transistor E as in FIGS. 25-27C.

Each of the selecting transistors included in the first to fourth selecting transistor groups 220a, 222a, 220b and 222b may have the same integrated structure as that of the cell transistor 206. Each of the selecting transistors included in the first to fourth selecting transistor groups 220a, 222a, 220b and 222b may have channel regions doped with impurities having the same conductive type. Particularly, these transistors may be enhancement mode transistors.

Each of the selecting transistors included in the first and fourth selecting transistor groups 220a and 222b may have a high threshold voltage because charges in the charge storing layer pattern may keep a programming state P. Particularly, each of the selecting transistors included in the first and fourth selecting transistor groups 220a and 222b may have a threshold voltage greater than 0V.

Each of the selecting transistors included in the second and third selecting transistor groups 222a and 220b may have a low threshold voltage because charges in the charge storing layer pattern may keep an erased state. Particularly, each of the selecting transistors included in the second and third selecting transistor groups 222a and 220b may have a threshold voltage smaller than 0V.

The ground selecting transistor 208 may be a physical enhancement mode MOS transistor. The ground selecting transistor 208 may have the same integrated structure as the first and second dummy selecting transistors 200a and 200b.

Figure 29:
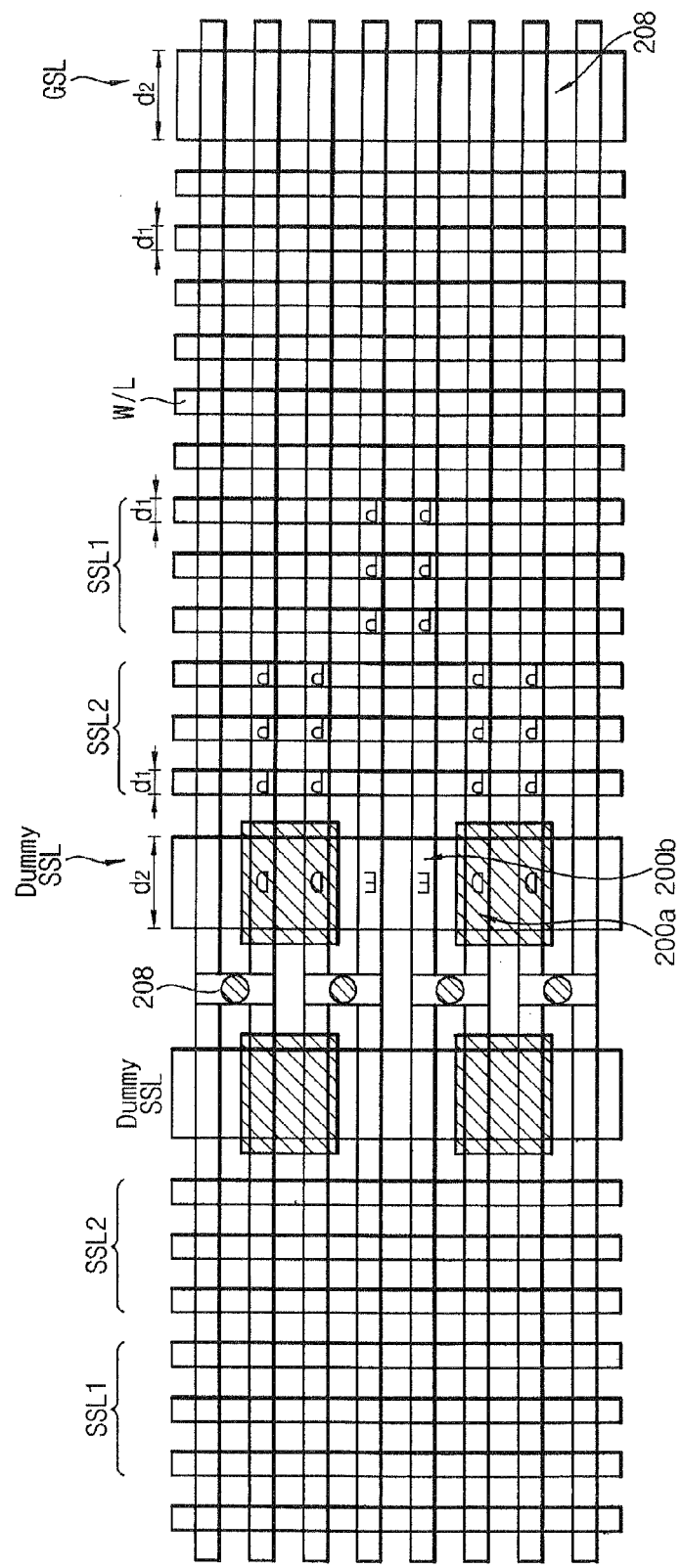
FIG. 29 is a plan view of the cell array of the NAND flash memory device illustrated in FIG. 28, according to an exemplary embodiment of the inventive concept.

FIG. 29 is a plan view of the cell array of the NAND flash memory device illustrated in FIG. 28, according to an exemplary embodiment of the inventive concept.

Referring to FIG. 29, a first gate structure W/L for the cell transistors 206, second gate structures SSL1 and SSL2 for the first to fourth selecting transistor groups 220a, 222a, 220b and 222b and third gate structures Dummy SSL and GSL for the dummy selecting transistors 200a and 200b and the ground selecting transistor 206 may be provided on a substrate.

The first gate structure W/L may have a first line width d1. The third gate structures Dummy SSL and GSL may have a second line width d2 greater than the first line width d1. The second gate structures SSL1 and SSL2 may have a narrower line width than the second line width d2. The second gate structures SSL1 and SSL2 may have the first line width d1 as illustrated in FIG. 29.

For the NAND flash memory device illustrated in FIG. 28, methods of controlling a threshold voltage of each of the selected transistors included in the first to fourth selecting transistor groups 220a, 222a, 220b and 222b may be the same as that explained prior when referring to FIGS. 27A to 27C.

An erasing operation may be conducted with respect to the transistors included in the first to fourth selecting transistor groups 220a, 222a, 220b and 222b.

Then, a programming operation P may be conducted with respect to the transistors included in the first selecting transistor groups 220a. In addition, a programming operation P may be conducted with respect to the transistors included in the fourth selecting transistor groups 222b.

As described above, the threshold voltage of each of the transistors included in the first to fourth selecting transistor groups 220a, 222a, 220b and 222b may be controlled through an electric operation. Accordingly, the threshold voltage of each of the transistors included in the first to fourth selecting transistor groups 220a, 222a, 220b and 222b may be a target threshold voltage and threshold voltage dispersion may be improved. In addition, the line width of the gate structure of each of the transistors included in the first to fourth selecting transistor groups 220a, 222a, 220b and 222b may be substantially the same as the line width of the gate structure of the cell transistor 206, and so a manufacturing process may be simplified.

Figure 30:
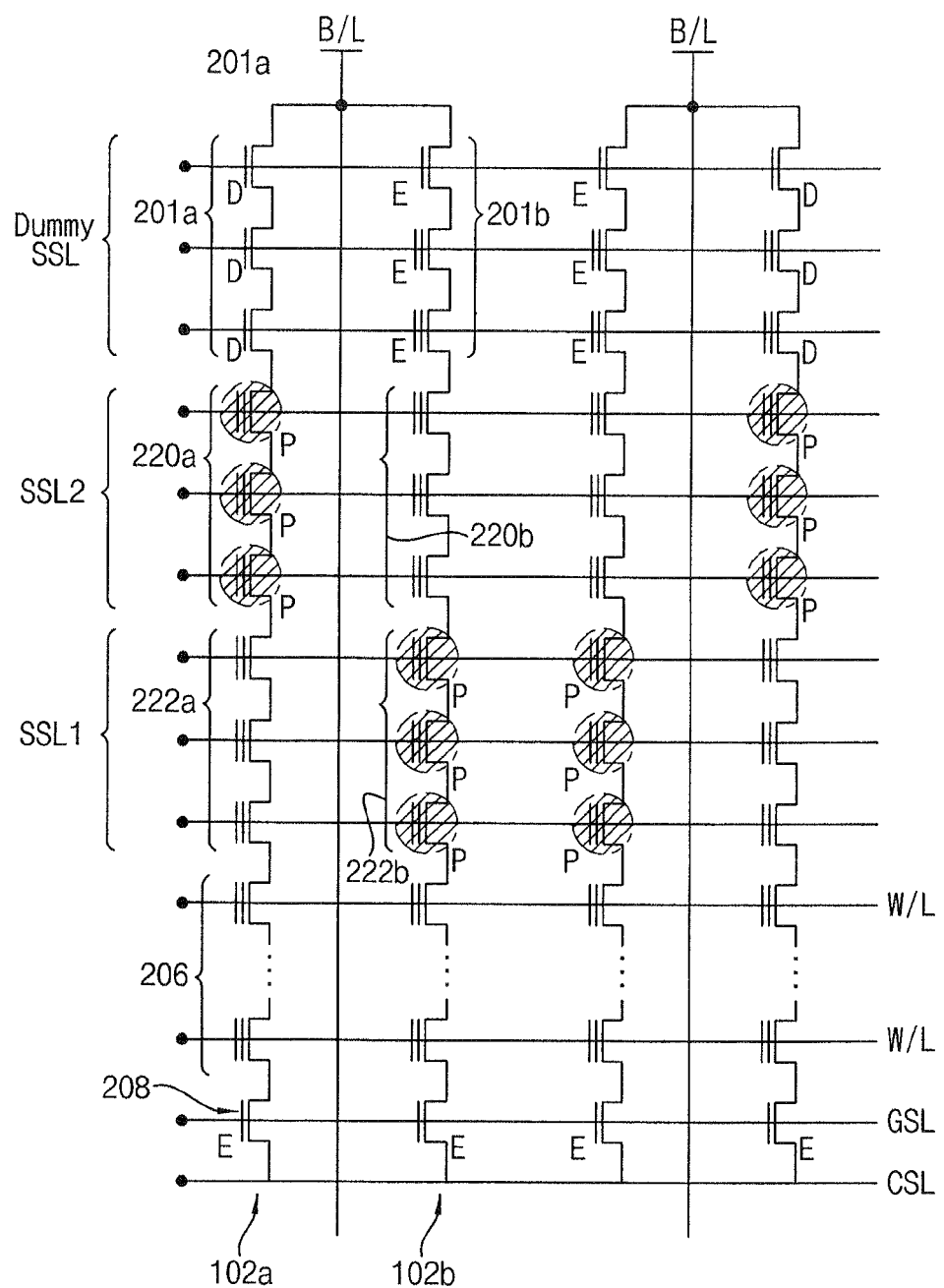
FIG. 30 is a circuit diagram of a cell array of a NAND flash memory device in accordance with an exemplary embodiment of the inventive concept.

FIG. 30 is a circuit diagram of a NAND flash memory device in accordance with an exemplary embodiment of the inventive concept.

The NAND flash memory device in accordance with the present exemplary embodiment may be substantially the same as the NAND flash memory device described with reference to FIGS. 28 and 29 except for the constitution of the dummy selecting transistors.

Referring to FIG. 30, first and second cell strings 102a and 102b connected to a common bit line B/L may be provided. The first cell string 102a may include a first dummy selecting transistor group 201a, to which a plurality of transistors may be connected in series, first and second selecting transistor groups 220a and 222a including a plurality of transistors connected in series, cell transistors 206 and a ground selecting transistor 208. The second cell string 102b may include a second dummy selecting transistor group 201b, to which a plurality of transistors may be connected in series, third and fourth selecting transistor groups 220b and 222b including a plurality of transistors connected in series, cell transistors 206 and a ground selecting transistor 208.

The transistors included in the first dummy selecting transistor group 201a may be depletion mode MOS transistors D. The transistors included in the second dummy selecting transistor group 201b may be enhancement mode MOS transistors E.

Each of the selecting transistors included in the first to fourth selecting transistor groups 220a, 222a, 220b and 222b may have the same integrated structure as the cell transistor 206.

Each of the selecting transistors included in the first and fourth selecting transistor groups 220a and 222b may have a high threshold voltage because charges in the charge storing layer pattern may keep a programming state. Particularly, each of the selecting transistors included in the first and fourth selecting transistor groups 220a and 222b may have a threshold voltage greater than 0V.

Each of the selecting transistors included in the second and third selecting transistor groups 222a and 220b may have a low threshold voltage because charges in the charge storing layer pattern may keep an erased state. Particularly, each of the selecting transistors included in the second and third selecting transistor groups 222a and 220b may have a threshold voltage smaller than 0V.

The ground selecting transistor 208 may be constituted by a physical enhancement mode MOS transistor.

Figure 31:
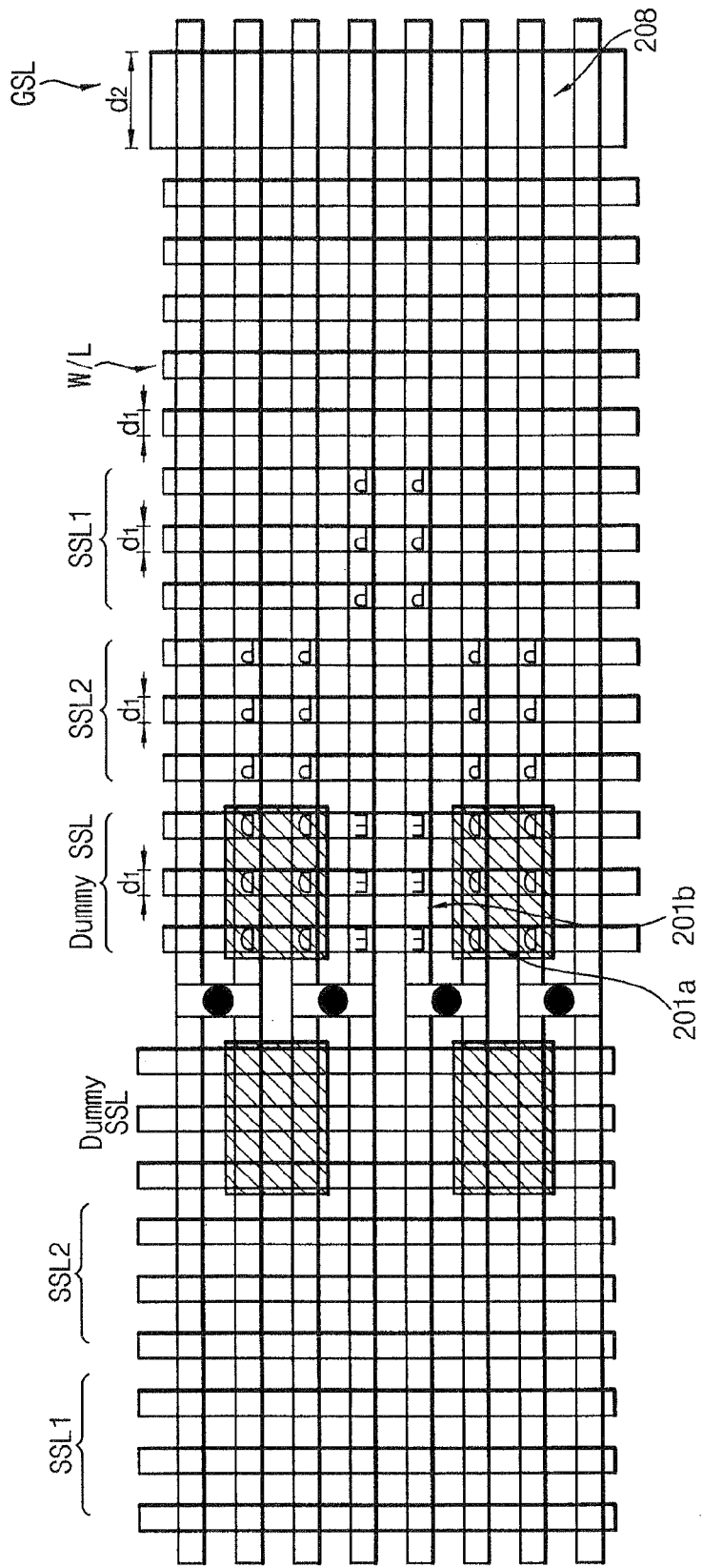
FIG. 31 is a plan view of the cell array of the NAND flash memory device illustrated in FIG. 31, according to an exemplary embodiment of the inventive concept.

FIG. 31 is a plan view of the cell array of the NAND flash memory device illustrated in FIG. 30, according to an exemplary embodiment of the inventive concept.

Referring to FIG. 31, a first gate structure W/L for the cell transistors 206, second gate structures SSL1 and SSL2 for the first to fourth selecting transistor groups 220a, 222a, 220b and 222b and a third gate structure Dummy SSL for the dummy selecting transistors 201a and 201b and a fourth gate structure GSL for the ground selecting transistor 208 may be provided on a substrate.

The first gate structure W/L may have a first line width d1. The fourth gate structure GSL may have a second line width d2 greater than the first line width d1.

The second and third gate structures SSL1, SSL2 and Dummy SSL may have a narrower line width than the second line width d2. Particularly, the gate structures of each of the transistors included in the first to fourth selecting transistor groups 220a, 222a, 220b and 222b may have the first line width d1 of the first gate structure W/L. In addition, the gate structures of each of the transistors included in the dummy selecting transistor groups 201a and 201b may have the first line width d1 of the first gate structure W/L.

Alternatively, the fourth gate structure GSL may have the same line width as the gate structure of the cell transistor 206, e.g., the first line width d1 and may include a plurality of transistors connected in series even though not illustrated.

For the NAND flash memory device illustrated in FIG. 30, methods of controlling a threshold voltage of each of the selecting transistors included in the first to fourth selecting transistor groups 220a, 222a, 220b and 222b may be the same as that explained prior when referring to FIGS. 27A to 27C.

An erasing operation may be conducted with respect to the transistors included in the first to fourth selecting transistor groups 220a, 222a, 220b and 222b.

Then, a programming operation may be conducted with respect to the transistors included in the first selecting transistor groups 220a. In addition, a programming operation may be conducted with respect to the transistors included in the fourth selecting transistor groups 222b.

While performing the programming operation, each of the transistors included in the dummy selecting transistor groups 201a and 201b may be operated in the same manner as when only one dummy selecting transistor is included in a cell string.

As described above, the threshold voltage of each of the transistors included in the first to fourth selecting transistor groups 220a, 222a, 220b and 222b may be controlled through an electric operation.

Figure 32:
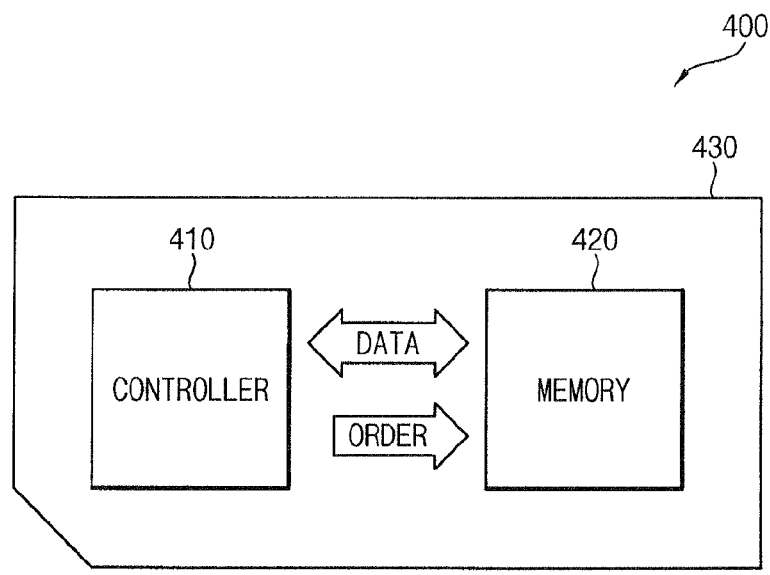
FIG. 32 is a block diagram of a memory card including a memory device in accordance with an exemplary embodiment of the inventive concept.

FIG. 32 is a block diagram of a memory card including a memory device in accordance with an exemplary embodiment of the inventive concept.

Referring to FIG. 32, a memory card 400 may include a controller 410 and a memory 420 in a housing 430. The controller 410 and the memory 420 may exchange electrical signals. Particularly, the memory 420 and the controller 410 may exchange data according to an order (e.g., command) of the controller 410. Accordingly, the memory card 400 may store data in the memory 420 or may output data to the exterior from the memory 420.

Particularly, the memory 420 may include the NAND flash memory device in accordance with the exemplary embodiments described above. The memory card 400 may be used as a data storing medium for various portable devices. Particularly, the memory card 400 may include a multi media card (MMC) or a secure digital (SD) card.

Figure 33:
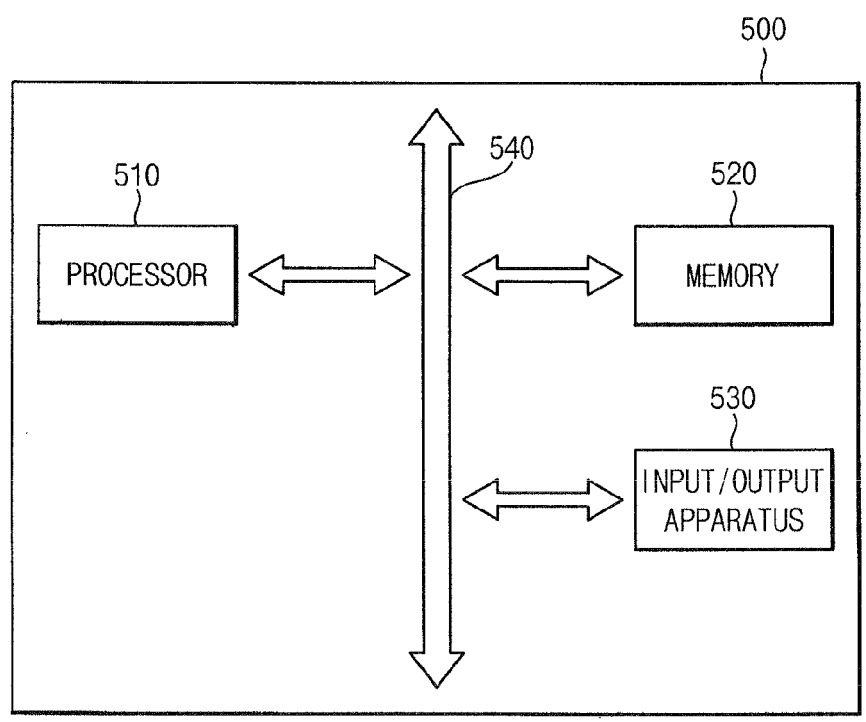
FIG. 33 is a block diagram of an electronic system including a memory device in accordance with an exemplary embodiment of the inventive concept.

FIG. 33 is a block diagram of an electronic system including a memory device in accordance with an exemplary embodiment of the inventive concept.

Referring to FIG. 33, an electronic system 500 may include a processor 510, an input/output apparatus 530 and a memory chip 520. The processor 510, the input/output apparatus 530 and the memory chip 520 may execute data communication using a bus 540. The processor 510 may execute a program and may control the system 500. The input/output apparatus 530 may be used to input or output data of the system 500. The system 500 may be connected to an exterior apparatus including a personal computer and a network using the input/output apparatus 530 to exchange data with the exterior apparatus. The memory 520 may store codes and data for operating the processor 510. Particularly, the memory 520 may include the NAND flash memory device in accordance with the exemplary embodiments described above.

In accordance with the exemplary embodiments described above, a highly integrated NAND flash memory device including a common bit line may be provided. The NAND flash memory device may be applied to various electronic controlling devices including a mobile phone, an MP3 player, a navigation device, a solid state disk (SSD) and household appliances.

As described above, a threshold voltage of one of the selecting transistors in a cell string of a semiconductor memory cell may be controlled by an electric operation in accordance with the exemplary embodiments. Accordingly, a threshold voltage dispersion defect generated by diffusion of impurities from a channel region and a mixing of different types of impurities in an adjacent channel region may be restrained. A program disturbance defect also may be decreased in the semiconductor memory device in accordance with the exemplary embodiments.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device, comprising:
   a common bit line;
   a first cell string being connected to the common bit line, the first cell string including a first selecting transistor, a second selecting transistor and first cell transistors; and
   a second cell string being connected to the common bit line, the second cell string including a third selecting transistor, a fourth selecting transistor and second cell transistors,
   wherein the first and third selecting transistors are electrically connected to a first selecting line,
   wherein the second and fourth selecting transistors are electrically connected to a second selecting line,
   wherein one of the first to fourth selecting transistors has a depletion mode, and the others of the first to fourth selecting transistors have an enhancement mode,
   wherein the first cell transistors are connected to the second selecting transistor in series and the second cell transistors are connected to the fourth selecting transistor in series, wherein each of the first and second cell transistors includes a charge storage layer, and
   wherein the second and fourth selecting transistors have the same integrated structure as the first and second cell transistors.

2. The semiconductor memory device of claim 1, wherein the second selecting transistor is in an erased state and the fourth selecting transistor is in a programmed state.

3. The semiconductor memory device of claim 1, wherein each of the second and fourth selecting transistors further includes a plurality of transistors connected in series.

4. The semiconductor device of claim 1, further comprising a dummy selecting transistor in at least a region between the common bit line and the first and third selecting transistors.

5. The semiconductor device of claim 1, wherein a threshold voltage of the second selecting transistor is controlled to be smaller than a reference voltage by an electric operation and a threshold voltage of the fourth selecting transistor is controlled to be greater than the reference voltage by the electric operation.

6. The semiconductor memory device of claim 1, wherein the first selecting transistor has an enhancement mode and the third selecting transistor has a depletion mode.

7. A semiconductor memory device, comprising:
   a common bit line;
   a first cell string being connected to the common bit line, the first cell string including a first dummy transistor having a depletion mode, a first selecting transistor, and a second selecting transistor; and
   a second cell string being connected to the common bit line, the second cell string including a second dummy transistor having an enhanced mode, a third selecting transistor, and a fourth selecting transistor,
   wherein the first and second dummy transistors are electrically connected to a dummy selecting word line, wherein the first and third selecting transistors are electrically connected to a first selecting line, and wherein the second and fourth selecting transistors are electrically connected to a second selecting line.

8. The semiconductor memory device of claim 7, wherein channel regions of the first to fourth selecting transistors have a same conductive type, and have the enhancement mode or the depletion mode.

9. The semiconductor memory device of claim 7, wherein the first and fourth selecting transistors are in a programmed state and the second and third selecting transistors are in an erased state.

10. The semiconductor memory device of claim 7, wherein each of the first and second dummy transistors includes a plurality of transistors connected in series.

11. The semiconductor memory device of claim 7, further comprising first cell transistors being connected to the second selecting transistor in series and second cell transistors being connected to the fourth selecting transistor in series, wherein the first and second cell transistors include a charge storage layer.

12. The semiconductor memory device of claim 11, wherein the first to fourth selecting transistors have a same integrated structure as the first and second cell transistors.

13. The semiconductor memory device of claim 11, wherein a line width of each gate structure of the first to fourth selecting transistors is substantially the same as a line width of a gate structure of at least one of the first and second cell transistors.

14. The semiconductor memory device of claim 7, wherein a threshold voltage of the first selecting transistor is controlled to be greater than a first reference voltage by an electric operation, a threshold voltage of the second selecting transistor is controlled to be smaller than a second reference voltage by the electric operation, the threshold voltage of the third selecting transistor is controlled to be smaller than the first reference voltage by the electric operation and the threshold voltage of the fourth selecting transistor is controlled to be greater than the second reference voltage by the electric operation.

15. A method of manufacturing a semiconductor device, comprising:
   forming a common bit line;
   forming a first cell string being connected to the common bit line that includes a first selecting transistor, a second selecting transistor, and first cell transistors; and
   forming a second cell string being connected to the common bit line that includes a third selecting transistor, a fourth selecting transistor, and second cell transistors;
   wherein the first and third selecting transistors are electrically connected to a first selecting line, wherein the second and fourth selecting transistors are electrically connected to a second selecting line, and wherein one selecting transistor of the first to fourth selecting transistors has a depletion mode and others of the first to fourth selecting transistors have an enhancement mode,
   wherein the first cell transistors are connected to the second selecting transistor in series and the second cell transistors are connected to the fourth selecting transistor in series, wherein each of the first and second cell transistors includes a charge storage layer, and
   wherein the second and fourth selecting transistors have the same integrated structure as the first and second cell transistors.

16. The method of claim 15, wherein a threshold voltage of the second selecting transistor is controllable by an electric operation to be smaller than a reference voltage, and a threshold voltage of the fourth selecting transistor is controllable by the electric operation to be greater than the reference voltage.

17. The method of claim 16, wherein the threshold voltages of the second and fourth selecting transistors are controlled by performing an erasing process on the second and fourth selecting transistors and a programming process on the fourth selecting transistor.

18. The method of claim 17, wherein when the threshold voltage of the fourth selecting transistor reaches a target threshold voltage during the programming process, a program inhibit voltage is applied to the common bit line so that the threshold voltage of the fourth selecting transistor does not increase any further.

* * * * *